(12) United States Patent
Nishinaga et al.

(10) Patent No.: US 8,749,759 B2
(45) Date of Patent: Jun. 10, 2014

(54) EXPOSURE APPARATUS, EXPOSURE METHOD, AND METHOD FOR PRODUCING DEVICE

(71) Applicant: Nikon Corporation, Tokyo (JP)

(72) Inventors: Hisashi Nishinaga, Saitama (JP); Ikuo Hikima, Kawasaki (JP); Mitsunori Toyoda, Taihaku-ku (JP); Masahiro Nakagawa, Ageo (JP); Tsuneyuki Hagiwara, Tokyo (JP); Yasushi Mizuno, Saitama (JP); Naonori Kita, Ageo (JP); Osamu Tanitsu, Kumagaya (JP); Nozomu Emura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/633,599

(22) Filed: Oct. 2, 2012

(65) Prior Publication Data

US 2013/0027682 A1    Jan. 31, 2013

Related U.S. Application Data

(60) Division of application No. 11/390,178, filed on Mar. 28, 2006, now Pat. No. 8,305,552, which is a continuation of application No. PCT/JP2004/014693, filed on Sep. 29, 2004.

(30) Foreign Application Priority Data

Sep. 29, 2003  (JP) ................................ 2003-338420
Oct. 2, 2003    (JP) ................................ 2003-344938
Feb. 19, 2004  (JP) ................................ 2004-042931

(51) Int. Cl.
*G03B 27/42*    (2006.01)
*G03B 27/52*    (2006.01)
*G03B 27/58*    (2006.01)

(52) U.S. Cl.
USPC .................................. 355/53; 355/30; 355/72

(58) Field of Classification Search
USPC .................... 355/53, 30, 72, 75, 55; 428/446; 359/380, 886; 210/188, 321.6, 650
See application file for complete search history.

(56) References Cited

U.S. PATENT DOCUMENTS 4,346,164 A    8/1982  Tabarelli et al.
4,418,984 A   12/1983  Wysocki et al.
(Continued)

FOREIGN PATENT DOCUMENTS

DE    221 563 A1    4/1985
DE    224 448 A1    7/1985
(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner* — Peter B Kim
(74) *Attorney, Agent, or Firm* — Oliff PLC

(57) ABSTRACT

A part of exposure beam through a liquid via a projection optical system enters a light-transmitting section, enters an optical member without passing through gas, and is focused. The exposure apparatus receives the exposure light from the projection optical system to perform various measurements even if the numerical aperture of the projection optical system increases.

30 Claims, 39 Drawing Sheets

(56) References Cited

U.S. PATENT DOCUMENTS

| | | |
|---|---|---|
| 4,465,368 A | 8/1984 | Matsuura et al. |
| 4,480,910 A | 11/1984 | Takanashi et al. |
| 5,331,369 A | 7/1994 | Terasawa et al. |
| 5,448,332 A | 9/1995 | Sakakibara et al. |
| 5,493,403 A | 2/1996 | Nishi |
| 5,528,118 A | 6/1996 | Lee |
| 5,610,683 A | 3/1997 | Takahashi |
| 5,623,853 A | 4/1997 | Novak et al. |
| 5,646,413 A | 7/1997 | Nishi |
| 5,715,039 A | 2/1998 | Fukuda et al. |
| 5,798,838 A | 8/1998 | Taniguchi et al. |
| 5,825,043 A | 10/1998 | Suwa |
| 5,867,319 A | 2/1999 | Sugiyama et al. |
| 5,874,820 A | 2/1999 | Lee |
| 5,883,704 A | 3/1999 | Nishi et al. |
| 5,925,887 A | 7/1999 | Sakai et al. |
| 5,969,441 A | 10/1999 | Loopstra et al. |
| 6,002,467 A | 12/1999 | Nishi et al. |
| 6,013,401 A | 1/2000 | McCullough et al. |
| 6,208,407 B1 | 3/2001 | Loopstra |
| 6,281,967 B1 | 8/2001 | Kudo |
| 6,292,255 B1 | 9/2001 | McCullough |
| 6,292,608 B1 | 9/2001 | Toh |
| 6,337,162 B1 | 1/2002 | Irie |
| 6,341,007 B1 | 1/2002 | Nishi et al. |
| 6,400,441 B1 | 6/2002 | Nishi et al. |
| 6,448,568 B1 | 9/2002 | Allen et al. |
| 6,549,269 B1 | 4/2003 | Nishi et al. |
| 6,563,565 B2 | 5/2003 | Nishi |
| 6,563,567 B1 | 5/2003 | Komatsuda et al. |
| 6,590,634 B1 | 7/2003 | Nishi et al. |
| 6,627,365 B1 | 9/2003 | Shiraishi |
| 6,650,399 B2 | 11/2003 | Baselmans et al. |
| 6,730,925 B1 | 5/2004 | Ozawa |
| 6,771,350 B2 | 8/2004 | Nishinaga |
| 6,940,582 B1 | 9/2005 | Tanaka |
| 6,962,825 B2 | 11/2005 | Murakami |
| 7,130,037 B1 | 10/2006 | Lange |
| 7,213,963 B2 | 5/2007 | Lof et al. |
| 7,221,431 B2 | 5/2007 | Ohsaki |
| 2001/0041297 A1 | 11/2001 | Nishi |
| 2001/0043320 A1 | 11/2001 | Kato et al. |
| 2002/0041377 A1 | 4/2002 | Hagiwara et al. |
| 2002/0061469 A1 | 5/2002 | Tanaka |
| 2002/0101574 A1 | 8/2002 | Tsuji |
| 2002/0163629 A1 | 11/2002 | Switkes et al. |
| 2002/0187406 A1 | 12/2002 | Magome et al. |
| 2003/0025890 A1 | 2/2003 | Nishinaga |
| 2003/0030916 A1 | 2/2003 | Suenaga |
| 2003/0174408 A1* | 9/2003 | Rostalski et al. ............. 359/642 |
| 2003/0224295 A1 | 12/2003 | Heerens et al. |
| 2004/0000627 A1 | 1/2004 | Schuster |
| 2004/0075895 A1 | 4/2004 | Lin |
| 2004/0090606 A1 | 5/2004 | Ishikawa |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesynchenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225737 A1 | 10/2005 | Weissenrieder et al. |
| 2005/0231694 A1 | 10/2005 | Kolesynchenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0264778 A1 | 12/2005 | Lof et al. |
| 2005/0270505 A1 | 12/2005 | Smith |
| 2006/0103832 A1 | 5/2006 | Hazelton et al. |

(56) References Cited

U.S. PATENT DOCUMENTS

| | | |
|---|---|---|
| 2006/0192093 A1 | 8/2006 | Kok et al. |
| 2006/0274297 A1 | 12/2006 | Ogusu |
| 2007/0132971 A1 | 6/2007 | Sengers et al. |
| 2007/0132979 A1 | 6/2007 | Lof et al. |
| 2009/0109418 A1 | 4/2009 | Hazelton et al. |

FOREIGN PATENT DOCUMENTS

| | | |
|---|---|---|
| EP | 1 500 982 A1 | 1/2005 |
| EP | 1 510 870 A1 | 3/2005 |
| EP | 1 662 554 A1 | 5/2006 |
| EP | 1 670 039 A1 | 6/2006 |
| JP | A-57-117238 | 7/1982 |
| JP | A-57-153433 | 9/1982 |
| JP | A-58-202448 | 11/1983 |
| JP | A-59-19912 | 2/1984 |
| JP | A-59-226317 | 12/1984 |
| JP | A-62-65326 | 3/1987 |
| JP | A-63-157419 | 6/1988 |
| JP | A-4-65603 | 3/1992 |
| JP | A-4-305915 | 10/1992 |
| JP | A-4-305917 | 10/1992 |
| JP | A-5-62877 | 3/1993 |
| JP | A-6-53120 | 2/1994 |
| JP | A-6-124873 | 5/1994 |
| JP | A-6-188169 | 7/1994 |
| JP | A-6-283403 | 10/1994 |
| JP | A-7-176468 | 7/1995 |
| JP | A-7-220990 | 8/1995 |
| JP | A-8-166475 | 6/1996 |
| JP | A-8-316125 | 11/1996 |
| JP | A-8-316133 | 11/1996 |
| JP | A-8-330224 | 12/1996 |
| JP | A-10-163099 | 6/1998 |
| JP | A-10-189427 | 7/1998 |
| JP | A-10-214783 | 8/1998 |
| JP | A-10-303114 | 11/1998 |
| JP | A-10-340846 | 12/1998 |
| JP | A-11-16816 | 1/1999 |
| JP | A-11-135400 | 5/1999 |
| JP | A-11-176727 | 7/1999 |
| JP | A-11-194479 | 7/1999 |
| JP | A-11-238680 | 8/1999 |
| JP | A-2000-12453 | 1/2000 |
| JP | A-2000-29202 | 1/2000 |
| JP | A-2000-58436 | 2/2000 |
| JP | A-2000-97616 | 4/2000 |
| JP | A-2000-505958 | 5/2000 |
| JP | A-2000-315648 | 11/2000 |
| JP | A-2001-144004 | 5/2001 |
| JP | A-2002-14005 | 1/2002 |
| JP | A-2002-100561 | 4/2002 |
| JP | A-2004-301825 | 10/2004 |
| JP | A-2005-79587 | 3/2005 |
| JP | A-2005-93948 | 4/2005 |
| JP | A-2007-527611 | 9/2007 |
| KR | 1998-032589 | 7/1998 |
| KR | 2001-0034274 | 4/2001 |
| WO | WO 98/24115 A1 | 6/1998 |
| WO | WO 98/28665 A1 | 7/1998 |
| WO | WO 99/00689 A2 | 1/1999 |
| WO | WO 99/34255 A1 | 7/1999 |
| WO | WO 99/49366 A1 | 9/1999 |
| WO | WO 99/49504 | 9/1999 |
| WO | WO 99/50712 A1 | 10/1999 |
| WO | WO 99/66370 A1 | 12/1999 |
| WO | WO 01/08205 A1 | 1/2001 |
| WO | WO 01/08205 A1 | 2/2001 |
| WO | WO 02/063664 A1 | 8/2002 |
| WO | WO 02/091078 A1 | 11/2002 |
| WO | WO 03/077036 A1 | 9/2003 |
| WO | WO 03/077037 A1 | 9/2003 |
| WO | WO 2004/019128 A2 | 3/2004 |
| WO | WO 2004/055803 A1 | 7/2004 |
| WO | WO 2004/057295 A2 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 A2 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

(56) References Cited

OTHER PUBLICATIONS

Jun. 10, 2009 Office Action issued in U.S. Appl. No. 11/403,922.
Dec. 2, 2009 Office Action issued in U.S. Appl. No. 11/403,922.
Nov. 24, 2008 Office Action issued in U.S. Appl. No. 11/896,447.
Aug. 5, 2009 Office Action issued in U.S. Appl. No. 11/896,447.
Dec. 11, 2008 Office Action issued in European Patent Application No. 04788458.0.
Sep. 16, 2009 Office Action for Israeli Patent Application No. 174296 (with translation).
Translation of Nov. 4, 2009 Office Action for Japanese Patent Application No. 2004-284218.
Translation of Nov. 4, 2009 Office Action for Japanese Patent Application No. 2004-281566.
Mar. 28, 2008 Office Action for Chinese Patent Application No. 2004800299732 (with translation).
Nov. 4, 2009 Office Action issued in Japanese Patent Application No. 2004-281566.
Feb. 2, 2010 Office Action issued in Japanese Patent Application No. 2004-281566 with English translation.
May 6, 2010 Notice of Allowance issued in Japanese Patent Application No. 2004-281566 with English translation.
Nov. 4, 2009 Office Action issued in Japanese Patent Application No. 2004-284218.
Feb. 2, 2010 Notice of Allowance issued in Japanese Patent Application No. 2004-284218 with English translation.
Jan. 9, 2009 Notice of Allowance issued in Chinese Patent Application No. 200480029973.2 with English translation.
Apr. 26, 2005 International Search Report issued in International Application No. PCT/JP2004/014693 with English translation.
Apr. 26, 2005 Written Opinion issued in International Application No. PCT/JP2004/014693 with English translation.
May 1, 2008 Office Action issued in U.S. Appl. No. 11/390,178.
Feb. 3, 2009 Office Action issued in U.S. Appl. No. 11/390,178.
Sep. 14, 2009 Notice of Allowance issued in U.S. Appl. No. 11/390,178.
Jan. 12, 2010 Office Action issued in U.S. Appl. No. 11/390,178.
Sep. 29, 2010 Office Action issued in U.S. Appl. No. 11/390,178.
Apr. 21, 2011 Office Action issued in U.S. Appl. No. 11/390,178.
Nov. 4, 2011 Office Action issued in U.S. Appl. No. 11/390,178.
Jun. 29, 2012 Notice of Allowance issued in U.S. Appl. No. 11/390,178.
Jun. 7, 2011 Office Action issued in U.S. Appl. No. 11/403,922.
Apr. 15, 2011 Office Action issued in Korean Patent Application No. 2006-7006005 (with translation).
Mar. 16, 2011 European Search Report for European Patent Application No. 10196145.6.
Jan. 30, 2011 Office Action issued in Chinese Patent Application No. 200910129712.2 (with translation).
Mar. 22, 2011 European Search Report issued in European Patent Application No. 10196147.2.
Jun. 26, 2008 European Search Report issued in European Patent Application No. 04788458.0.
Apr. 30, 2008 Office Action issued in U.S. Appl. No. 11/403,922.
Feb. 2, 2009 Office Action issued in U.S. Appl. No. 11/403,922.
Dec. 26, 2011 Office Action issued in Taiwanese Application No. 093129399 (w/ English language translation).
Apr. 12, 2010 Office Action issued in U.S. Appl. No. 11/896,447.
Oct. 25, 2010 Office Action issued in U.S. Appl. No. 11/403,922.
Jan. 12, 2011 Notice of Allowance issued in U.S. Appl. No. 11/896,447.
Oct. 30, 2012 Office Action issued in Korean Patent Application No. 2012-7021591 (with translation).
Apr. 23, 2013 Office Action issued in Japanese Patent Application No. 2011-007813 (with translation).

\* cited by examiner

EXPOSURE APPARATUS, EXPOSURE METHOD, AND METHOD FOR PRODUCING DEVICE

CROSS-REFERENCE

This is a Divisional of U.S. patent application Ser. No. 11/390,178 filed Mar. 28, 2006 (now U.S. Pat. No. 8,305, 552), which in turn is a Continuation of International Application No. PCT/JP2004/014693 which was filed on Sep. 29, 2004 claiming the conventional priority of Japanese patent Application No. 2003-338420 filed on Sep. 29, 2003, No. 2003-344938 filed on Oct. 2, 2003, and No. 2004-042931 filed on Feb. 19, 2004. The disclosures of these prior applications are incorporated herein by reference in their entireties.

BACKGROUND OF THE INVENTION

1. Field of the Invention

The present invention relates to an exposure apparatus and an exposure method in which a pattern formed on a mask is transferred onto a substrate to expose the substrate therewith, and a method for producing a device based on the use of the exposure apparatus.

2. Description of the Related Art

The photolithography step is provided usually as one of the steps of producing the microdevice including, for example, semiconductor elements, liquid crystal display elements, image pickup devices (for example, CCD (Charge Coupled Device)), and thin film magnetic heads. In the photolithography step, the exposure apparatus is used, in which a reduced image of a pattern formed on a mask or a reticle (hereinafter generally referred to as "mask", if necessary) is subjected to the projection exposure on a substrate as an exposure objective (semiconductor wafer or glass plate coated with photoresist). In recent years, the reduction projection exposure apparatus (so-called stepper) which is based on the step-and-repeat system or the exposure apparatus which is based on the step-and-scan system is used in many cases.

The stepper is such an exposure apparatus that the substrate is placed on a substrate stage which is movable two-dimensionally, and the substrate is moved in a stepwise manner (subjected to the stepping) by the substrate stage to successively repeat the operation in which each of shot areas on the substrate is subjected to the full field exposure with the reduced image of the pattern of the mask. The exposure apparatus based on the step-and-scan system is such an exposure apparatus that a mask stage on which the mask is placed and a substrate stage on which the substrate is placed are moved mutually synchronously with respect to a projection optical system in a state in which the mask is radiated with a slit-shaped pulse exposure beam, while a part of a pattern formed on the mask is successively transferred onto a shot area of the substrate, and the substrate is subjected to the stepping upon the completion of the transfer of the pattern to one shot area to perform the transfer of the pattern to another shot area.

The exposure apparatus as described above has a plurality of optical sensors (light receivers) for receiving the exposure beam through the projection optical system. Various types of mechanical adjustments and optical adjustments are performed and various types of operation conditions are determined on the basis of the outputs of the optical sensors to optimize the exposure operation to be performed when the substrate is actually exposed. Those provided on the substrate stage include, for example, an uneven illuminance sensor (irradiation irregularity sensor) for measuring the uneven illuminance (light amount distribution) of the exposure beam which has passed through the projection optical system and/or measuring the totalized uneven light amount, and a radiation amount sensor (dose sensor) for measuring the radiation amount (light amount) of the exposure beam which has passed through the projection optical system. The irradiation irregularity sensor as described above is disclosed, for example, in Japanese Patent Application Laid-open No. 08-316133. The dose sensor as described above is disclosed, for example, in International Publication No. 01/008205.

In recent years, it is demanded to realize the higher resolution of the projection optical system in order to respond to the further advance of the higher integration of the device pattern. The shorter the exposure wavelength to be used is, the higher the resolution of the projection optical system is. The larger the numerical aperture of the projection optical system is, the higher the resolution of the projection optical system is. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure beam in the liquid is 1/n as compared with that in the air (n represents the refractive index of the liquid, which is about 1.2 to 1.6 in ordinary cases).

The optical sensor (light receiver) described above has the light-transmitting section which is arranged on the image plane side of the projection optical system, wherein the light is received through the light-transmitting section. Therefore, when the numerical aperture of the projection optical system is increased as a result of the adoption of the liquid immersion method or the like, and the incident angle of the exposure beam (angle formed by the outermost ray and the optical axis)

is increased, then the expansion of the light outgone from the light-transmitting section is increased as well, and it is feared that the light cannot be received satisfactorily.

SUMMARY OF THE INVENTION

The present invention has been made taking the foregoing circumstances into consideration, an object of which is to provide an exposure apparatus and an exposure method in which various measuring operations can be performed accurately and various measuring operations can be performed satisfactorily especially when the exposure method based on the liquid immersion system is adopted, and a method for producing a device based on the use of the exposure apparatus.

Another object of the present invention is to provide an exposure apparatus and an exposure method in which a light receiver capable of satisfactorily receiving a light beam which has passed through a projection optical system is provided, and a method for producing a device.

In order to achieve the objects as described above, the present invention adopts the following constructions.

According to a first aspect of the present invention, there is provided an exposure apparatus which exposes a substrate by irradiating an exposure beam through a liquid onto the substrate; the exposure apparatus comprising a projection optical system; and a measuring unit which has a light-transmitting section provided on an image plane side of the projection optical system and a light receiver for receiving, through the light-transmitting section, the exposure beam which has passed through the projection optical system; wherein the light receiver of the measuring unit receives the exposure beam which has passed through the light-transmitting section and the projection optical system in a state in which no liquid exists between the projection optical system and the light-transmitting section. The measuring unit may be an irradiation irregularity sensor (uneven illuminance sensor), a dose sensor (radiation amount sensor), or a spatial image-measuring unit.

According to this invention, the exposure beam, which has passed through the projection optical system, is received by the light receiver (optical receiver or light-receiving module or unit) of the measuring unit via the light-transmitting section arranged on the image plane side of the projection optical system in the state in which the liquid is not supplied to the image plane side of the projection optical system.

According to a second aspect of the present invention, there is provided an exposure apparatus which exposes a substrate by irradiating an exposure beam onto the substrate; the exposure apparatus comprising a projection optical system; and a measuring unit which is arranged on an image plane side of the projection optical system and which has a light-transmitting section for allowing the exposure beam from the projection optical system to come thereinto, a light receiver, and a light-collecting member for allowing the light beam from the light-transmitting section to come into the light receiver; wherein the light-collecting member is arranged between the light-transmitting section and the light receiver so that the exposure beam from the projection optical system comes into the light-collecting member without passing through any gas.

According to this invention, the light beam, which is included in the exposure beam come from the projection optical system and which has been transmitted through the light-transmitting section, is allowed to come into the light-collecting member and collected without passing through the gas. Various methods are available in order to introduce the light beam from the light-transmitting section into the light-collecting member without passing through the gas. However, the light-transmitting section and the light-collecting member may be joined to one another. Alternatively, a light-transmissive medium other than the gas, which includes, for example, liquid, supercritical fluid, paste, and solid, may be intervened, for example, in a form of thin film between the light-transmitting section and the light-collecting member.

According to a third aspect of the present invention, there is provided an exposure apparatus which exposes a substrate by irradiating an exposure beam through a liquid onto the substrate; the exposure apparatus comprising a projection optical system; and a measuring unit which has a plate-shaped member provided with one surface arranged to be opposed to the projection optical system and provided with a light-transmitting section formed at a part of another surface and which has a light receiver for receiving the light beam from the light-transmitting section; wherein the light receiver of the measuring unit receives the exposure beam through the liquid provided between the projection optical system and the plate-shaped member.

According to this invention, the exposure beam from the projection optical system comes into the plate-shaped member through the liquid, and the light beam, which is included in the light beam come into the plate-shaped member and which is transmitted through the light-transmitting section, is received by the light receiver provided for the measuring unit. Therefore, the exposure beam can be measured in the state of the liquid immersion exposure.

According to a fourth aspect of the present invention, there is provided an exposure apparatus which exposes a substrate by irradiating an exposure beam through a liquid onto the substrate; the exposure apparatus comprising a projection optical system; and a measuring unit which has a light-transmitting section provided on an image plane side of the projection optical system for allowing the exposure beam from the projection optical system to come thereinto via the liquid, a light receiver, and an optical system for allowing the light beam from the light-transmitting section to come into the light receiver; wherein the optical system is arranged between the light-transmitting section and the light receiver so that the light beam from the light-transmitting section comes into the optical system without passing through any gas.

According to this invention, the light beam, which is included in the exposure beam come from the projection optical system and which has passed through the light-transmitting section, is introduced into the optical system provided for the measuring unit so that the light beam does not pass through the gas, and the light beam comes into the light receiver. Therefore, the light receiver can efficiently receive the light beam transmitted through the light-transmitting section. In order to introduce the light beam from the light-transmitting section into the optical system so that the light beam does not pass through the gas, a medium other than the gas may be intervened as described above. The optical system may be one optical member. Alternatively, the optical system may be composed of a plurality of optical members.

According to a fifth aspect of the present invention, there is provided an exposure apparatus which exposes a substrate by irradiating an exposure beam through a liquid onto the substrate; the exposure apparatus comprising a projection optical system; an optical member which has a light-transmitting section arranged on an image plane side of the projection optical system; and a light receiver which receives the light beam which has passed through the projection optical system via the optical member; wherein a space between the light receiver and the optical member is filled with the liquid.

The following operation is assumed in the liquid immersion exposure. That is, when the light beam, which has passed through the projection optical system via the optical member arranged on the image plane side of the projection optical system, is received by the light receiver, the light beam is radiated onto the light receiver to perform the light-receiving operation in the state in which the space between the projection optical system and the optical member is filled with the liquid. According to the present invention, the space between the optical member and the light receiver is also filled with the liquid. Accordingly, the light beam, which has passed through the projection optical system, can be satisfactorily received by the light receiver. In other words, when the space between the projection optical system and the optical member is filled with the liquid, it is possible to increase the numerical aperture NA of the projection optical system. However, it is necessary that the numerical aperture NA of the optical system of the light receiver is also changed depending on the numerical aperture NA of the projection optical system. That is, if the numerical aperture NA of the light receiver is not improved depending on the numerical aperture NA of the projection optical system, then a situation arises such that the light beam, which has passed through the projection optical system, cannot be incorporated satisfactorily by the light receiver, and the light beam cannot be received in a well-suited manner. Therefore, when the numerical aperture NA of the projection optical system is improved by filling the space between the projection optical system and the optical member with the liquid, then the space between the optical member and the light receiver is also filled with the liquid to improve the numerical aperture NA of the optical system of the light receiver, and thus the light beam, which has passed through the projection optical system, can be satisfactorily received by the light receiver. The optical member referred to herein includes all members having the light-transmitting section.

According to a sixth aspect of the present invention, there is provided an exposure apparatus which exposes a substrate by irradiating an exposure beam onto the substrate; the exposure apparatus comprising a projection optical system; an optical member which has a light-transmitting section arranged on an image plane side of the projection optical system; and a light receiver which receives the light beam which has passed through the projection optical system via the optical member; wherein a space between the light receiver and the optical member is filled with a liquid.

According to the present invention, the numerical aperture NA of the optical system of the light receiver can be improved by filling the space between the optical member and the light receiver with the liquid. Thus, it is possible to perform the light-receiving operation satisfactorily. The arrangement of the present invention, in which the space between the optical member and the light receiver is filled with the liquid, is also applicable to a dry exposure apparatus which performs the exposure without passing through the liquid, in addition to the application to the liquid immersion exposure apparatus.

According to a seventh aspect of the present invention, there is provided an exposure apparatus which exposes a substrate by irradiating an exposure beam onto the substrate through a liquid; the exposure apparatus comprising a projection optical system; an optical member which has a light-transmitting section arranged on an image plane side of the projection optical system; and a light receiver having a light-receiving element which receives the light beam which has passed through the projection optical system via the optical member and which is provided in contact with the optical member.

According to the present invention, the light-receiving element of the light receiver is arranged to make contact with the optical member. Accordingly, even when the space between the projection optical system and the optical member is filled with the liquid to substantially improve the numerical aperture NA of the projection optical system, the light receiver can satisfactorily receive the light beam which has passed through the projection optical system.

According to an eighth aspect of the present invention, there is provided an exposure apparatus which exposes a substrate by irradiating an exposure beam onto the substrate through a liquid; the exposure apparatus comprising a projection optical system; an optical member which has a light-transmitting section arranged on an image plane side of the projection optical system and which has a through-hole formed at a predetermined position; and a light receiver which receives the light beam which has passed through the projection optical system via the optical member.

According to the present invention, the through-hole is provided for the optical member, and thus the liquid, which is disposed between the projection optical system and the optical member, can move (escape) through the through-hole. Therefore, no difference appears between the pressure of the liquid disposed between the projection optical system and the optical member and the pressure of the liquid disposed between the optical member and the light receiver. No inconvenience arises, which would be otherwise caused, for example, such that the optical member is warped. Any great pressure fluctuation arises for the liquid between the projection optical system and the optical member as well, because the liquid is movable through the through-hole. Therefore, it is possible to avoid the occurrence of the inconvenience which would be otherwise caused such that the projection optical system is fluctuated (vibrated) due to the pressure fluctuation of the liquid.

According to the present invention, there is provided a method for producing a device, comprising using the exposure apparatus as defined in any one of the first to eighth aspects. According to the present invention, the light receiver can satisfactorily receive the light beam which has passed through the projection optical system. Therefore, the exposure process can be performed accurately in a state in which the optimum exposure condition is established on the basis of the light-receiving result. It is possible to produce the device having desired performance.

According to a ninth aspect of the present invention, there is provided an exposure method for exposing a substrate by irradiating an exposure beam via a projection optical system and a liquid onto the substrate; the exposure method comprising a step of installing a measuring unit for measuring the exposure beam on a side of a light-outgoing end of the projection optical system; a step of measuring the exposure beam by using the measuring unit without allowing the liquid to intervene in an optical path space on the side of the light-outgoing end of the projection optical system; and a step of exposing the substrate while allowing the liquid to intervene in the optical path space on the basis of a measurement result; wherein an incident angle of the exposure beam come from the projection optical system into an interface between the optical path space and the light-outgoing end of the projection optical system differs between the measuring step and the exposure step. According to this method, the incident angle of the exposure beam come into the interface between the optical path space and the light-outgoing end of the projection optical system in the measuring step is adjusted to be smaller than the incident angle in the exposure step. Accordingly, even when the liquid is absent in the optical path space between the projection optical system and the measuring unit, the measuring unit can satisfactorily receive the exposure beam. The received light beam can be used to execute the adjustment of the imaging state and the exposure beam.

According to a tenth aspect of the present invention, there is provided an exposure method for exposing a substrate by irradiating an exposure beam via a projection optical system onto the substrate; the exposure method comprising receiving the exposure beam outgone from the projection optical system by a light receiver; and exposing the substrate by irradiating the exposure beam via the projection optical system and a liquid. According to this method, the exposure beam can be fed to the light-receiving element without passing through any gas. Therefore, even when the numerical aperture of the projection optical system is increased, it is possible to satisfactorily receive the exposure beam which has passed through the projection optical system.

According to an eleventh aspect of the present invention, there is provided an exposure method for exposing a substrate by irradiating an exposure beam through a projection optical system onto the substrate; the exposure method comprising receiving the light beam which has passed through the projection optical system by a light receiver via an optical member having a light-transmitting section arranged on an image plane side of the projection optical system; and exposing the substrate by irradiating the exposure beam onto the substrate via the projection optical system; wherein a space between the light receiver and the optical member is filled with a liquid. According to this method, the space between the light receiver and the optical member is filled with the liquid. Therefore, even when the numerical aperture of the projection optical system is increased, it is possible to satisfactorily receive the exposure beam come from the light-transmitting section.

DESCRIPTION OF THE PREFERRED EMBODIMENTS OF THE INVENTION

An explanation will be made in detail below about the exposure apparatus and the method for producing the device according to embodiments of the present invention with reference to the drawings. However, the present invention is not limited thereto.

First Embodiment

Figure 1:
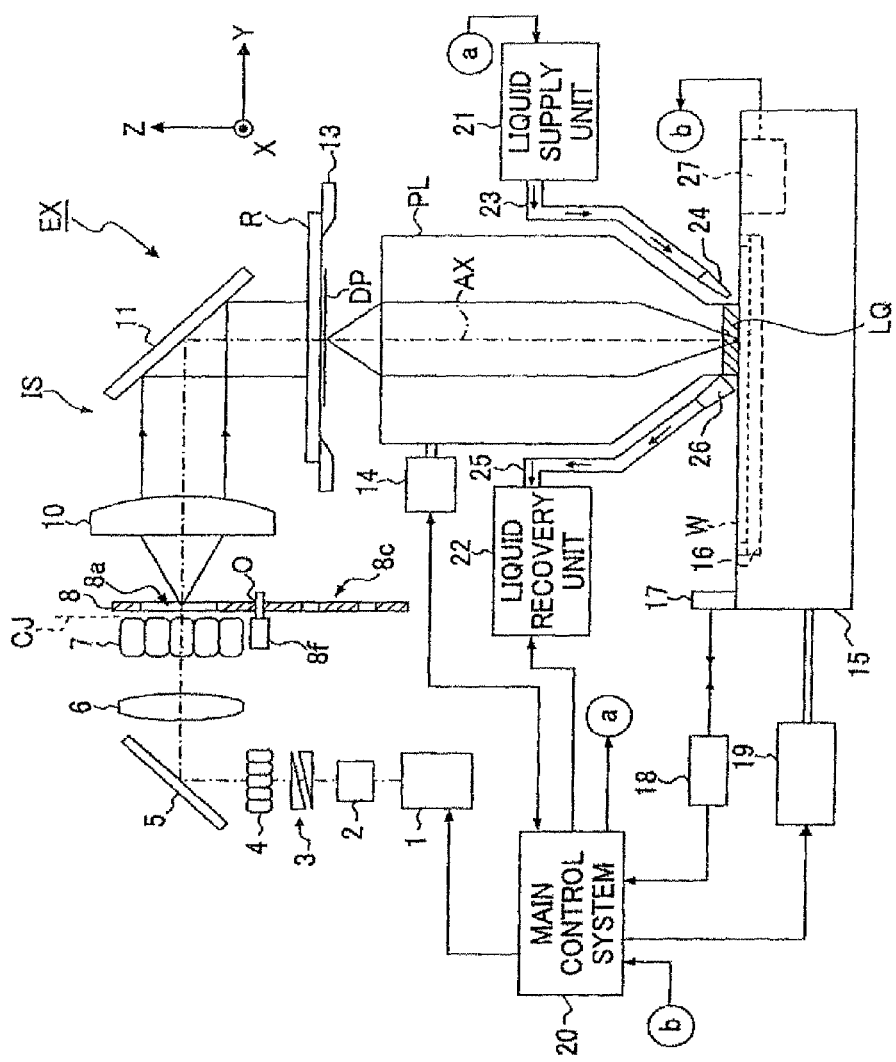
FIG. 1 shows a schematic arrangement of an exposure apparatus according to a first embodiment of the present invention.

FIG. 1 shows a schematic arrangement of an exposure apparatus according to a first embodiment of the present invention. The exposure apparatus EX shown in FIG. 1 is an exposure apparatus based on the liquid immersion system in which the exposure is performed through a liquid (pure water) LQ disposed between a projection optical system PL and a wafer W. The exposure apparatus uses a reticle R formed with a circuit pattern DP of a semiconductor element to transfer an image of the circuit pattern DP to the wafer W in the step-and-repeat manner.

In the following description, the XYZ rectangular coordinate system shown in the drawing is established. An explanation will be made about the positional relationship in relation to the respective members with reference to the XYZ rectangular coordinate system. The XYZ rectangular coordinate system is established so that the X axis and the Y axis are parallel to the wafer W, and the Z axis is established in the direction perpendicular to the wafer W. The XYZ rectangular coordinate system in the drawing is actually established such that the XY plane resides in the plane parallel to the horizontal plane, and the Z axis is established in the vertically upward direction.

The exposure apparatus EX shown in FIG. 1 is provided with an ArF excimer laser light source for supplying the light beam having a wavelength of 193 nm (ArF), as the light source 1 for supplying the exposure beam. The substantially parallel light flux, which is radiated from the light source 1, is shaped into a light flux having a predetermined cross section by the aid of a beam-shaping optical system 2, and then the light flux comes into an interference-reducing section 3. The interference-reducing section 3 functions to reduce the occurrence of the interference pattern on the reticle R as a radiation objective surface (as well as on the wafer W).

Details of the interference-reducing section 3 are disclosed, for example, in Japanese Patent Application Laid-open No. 59-226317. The light flux from the interference-reducing section 3 passes through a first fly's eye lens (first optical integrator) 4 to form a large number of light sources on the back focal plane thereof. The light beams, which come from the large number of light sources, are deflected by a vibration mirror 5. After that, the light beams illuminate, in a superimposed manner, a second fly's eye lens (second optical integrator) 7 via a relay optical system 6. Accordingly, a secondary light source, which is composed of a large number of light sources, is formed at the back focal plane of the second fly's eye lens 7.

Figure 2:
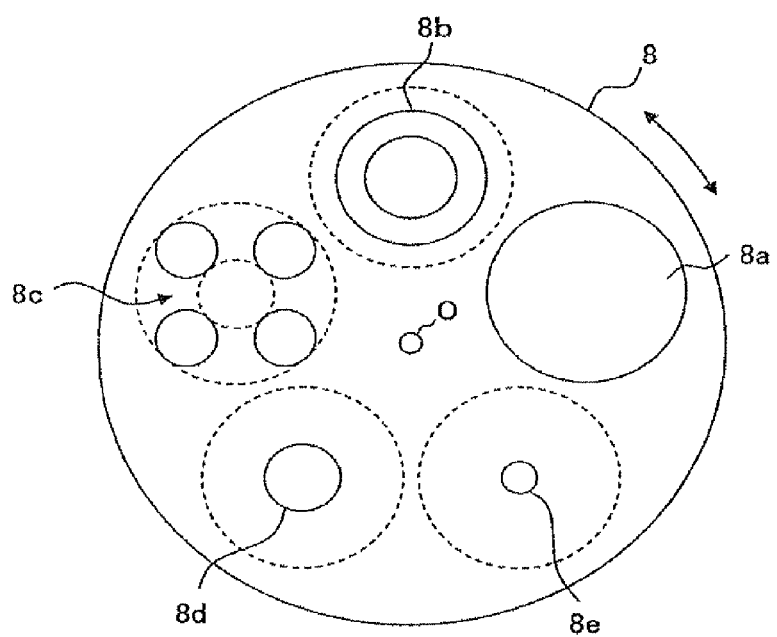
FIG. 2 shows a front view illustrating an example of an aperture diaphragm plate 8.

An aperture diaphragm plate 8, which is rotatable by a driving motor 8f, is arranged at an outgoing plane CJ of the second fly's eye lens 7, i.e., at the pupil plane of the illumination optical system (illumination system) IS (plane optically conjugate with the pupil plane of the projection optical system PL). FIG. 2 shows a front view illustrating an example of the aperture diaphragm plate 8. As shown in FIG. 2, the aperture diaphragm plate 8 is composed of a disk which is constructed rotatably about a rotary shaft O. Those formed along the circumferential direction are a circular aperture diaphragm 8a for the ordinary illumination, an aperture diaphragm 8b for the zonal illumination, an aperture diaphragm 8c for the four-spot modified illumination (four-spot illumination), a small circular aperture diaphragm 8d for the small coherence factor (small σ), and a variable aperture diaphragm 8e to be used for measuring, for example, the uneven illuminance or the radiation amount of the exposure beam. Large circles depicted by broken lines in FIG. 2 represent the size of the circular aperture diaphragm 8a for the ordinary illumination, which are illustrated in the drawing in order to compare the size with those of the aperture diaphragms 8b to 8e.

The coherence factor (σ of the illumination system) is the ratio between the numerical aperture NAr of the projection optical system PL on the side of the reticle R and the numerical aperture NAi of the illumination optical system IS, which is defined as follows.

$$\sigma = NAi/NAr$$

The numerical aperture NA of the projection optical system PL usually exhibits the numerical aperture NAw on the side of the wafer W. The numerical aperture NAr on the side of the reticle is determined as NAr=NAw/M in accordance with the magnification M of the projection optical system PL.

The aperture diaphragm 8e is formed such that the size of the aperture is variable. The σ value can be varied, for example, within a range of 0.05 to 0.50. The aperture diaphragm 8e is provided in order that the angular aperture or the open angle (angle formed by the outermost ray or beam and the optical axis) of the exposure beam directed toward the image plane side of the projection optical system PL is adjusted (decreased) when the uneven illuminance and/or the light amount is measured without providing the liquid LQ on the image plane side of the projection optical system PL. In other words, if the liquid LQ is absent on the image plane side of the projection optical system PL, for example, the exposure beam having a large angular aperture, which is to be used for the ordinary illumination, involves a part of the light beam which undergoes the total reflection at the end portion on the image plane side of the projection optical system PL and which cannot pass through the projection optical system PL, because the exposure apparatus of the embodiment of the present invention is the exposure apparatus based on the liquid immersion system in which the exposure process is performed through the liquid LQ disposed between the projection optical system PL and the wafer W. The aperture diaphragm 8e is provided in order that the angular aperture of the exposure beam directed toward the image plane side of the projection optical system PL is adjusted to avoid the total reflection by the projection optical system PL. FIG. 2 shows the arrangement in which the aperture diaphragm 8e is provided for the aperture diaphragm plate 8 separately from the aperture diaphragm 8d in order to clarify the feature of the present invention. However, the coherence factor of the aperture diaphragm 8d is also set to about 0.25 to 0.35. Therefore, another arrangement is also available, in which the aperture diaphragm 8d is used for the measurement, and the aperture diaphragm 8e is omitted. In this arrangement, the aperture of the aperture diaphragm 8d may be variable.

With reference to FIG. 1 again, the rotary shaft O of the aperture diaphragm plate 8 is connected to a rotary shaft of the driving motor 8f. When the driving motor 8f is driven to rotate the aperture diaphragm plate 8 about the rotary shaft O, it is possible to switch the aperture diaphragm to be arranged at the outgoing plane CJ of the second fly's eye lens 7. The intensity distribution (light flux distribution) of the exposure beam is changed at the outgoing plane CJ of the second fly's eye lens 7 depending on the aperture diaphragm arranged at the outgoing plane CJ of the second fly's eye lens 7. The driving of the driving motor 8f is controlled by a main control system 20 which integrally controls the operation of the entire exposure apparatus EX.

The exposure beam, which is included in the light flux supplied from the secondary light source formed by the second fly's eye lens 7 and which has passed through any one of the aperture diaphragms 8a to 8d formed for the aperture diaphragm plate 8, passes along a condenser optical system 10 and a bending mirror 11, and the exposure beam uniformly illuminates, in a superimposed manner, the reticle R having the predetermined circuit pattern DP formed on the lower surface. Accordingly, the image of the pattern of the reticle R in the illumination area is projected at a predetermined projection magnification β (β is, for example, ¼ or ⅕) onto the exposure area (projection area) of the wafer W as the substrate arranged on the image plane of the projection optical system PL via the projection optical system PL which is telecentric on the both sides. The wafer W is a disk-shaped substrate composed of, for example, a semiconductor (silicon or the like) or SOI (silicon on insulator). The components, which range from the beam-shaping optical system 2 to the bending mirror 11 as explained above, constitute the illumination optical system (illumination system) IS.

The projection optical system PL comprises a plurality of optical elements such as lenses. In this embodiment, the light beam of the ArF excimer laser light source in the vacuum ultraviolet region is used as the exposure beam. Therefore, for example, synthetic quartz or fluorite (calcium fluoride: $CaF_2$) is used as the material for the optical element for constructing the projection optical system PL. Parts of the optical elements provided for the projection optical system PL are constructed to be movable in the direction of the optical axis AX of the projection optical system PL (in the Z direction) and tiltable about the axis parallel to the X axis or about the axis parallel to the Y axis. The optical elements are controlled by a lens controller section 14 as described later on. The projection optical system PL is a projection optical system which is based on the liquid immersion system for allowing the incoming light flux to form the image on the image plane side in the state in which the liquid LQ is supplied to the image plane side. The numerical aperture (N.A.) is set to be not less than 1 (for example, 1.00 to 1.40). The projection optical system PL of this embodiment is based on the dioptric system. However, it goes without saying that the cata-dioptric system and the catoptric system are also usable.

The reticle R is placed on a reticle stage 13 by the aid of a reticle holder (not shown). The reticle stage 13 is driven by a reticle stage control unit (not shown) on the basis of an instruction from the main control system 20. In this arrangement, the movement of the reticle stage 13 is measured by a reticle interferometer (not shown) and a movement mirror (not shown) provided for the reticle stage 13. The result of the measurement is outputted to the main control system 20.

The projection optical system PL is provided with the lens controller section 14 which measures the temperature and the atmospheric pressure and which controls the optical characteristics such as the imaging characteristics of the projection optical system PL to be constant depending on the change of the environment including, for example, the temperature and the atmospheric pressure. The lens controller section 14 outputs the measured temperature and the atmospheric pressure to the main control system 20. The main control system 20 controls the optical characteristics of, for example, the image-forming optical system of the projection optical system PL by the aid of the lens controller section 14 on the basis of the temperature and the atmospheric pressure outputted from the lens controller section 14 and the measurement result obtained by an exposure beam sensor 27 as described later on.

The wafer W is vacuum-chucked by a wafer holder 16 which is contained in a wafer stage 15. The height position of the wafer holder 16 is established so that the upper surface of the wafer W is coincident with the upper surface of the wafer stage 15 when the wafer W is retained on the wafer holder 16. The wafer stage 15 is constructed such that a pair of X stage and Y stage, which are movable in the X axis direction and the Y axis direction respectively in the drawing, are overlapped. The position in the XY plane is adjustable.

Although not shown in the drawing, the wafer stage 15 includes, for example, a Z stage which moves the wafer W in the Z axis direction, a stage which finely rotates the wafer W in the XY plane, and a stage which adjusts the inclination of the wafer W with respect to the XY plane by changing the angle with respect to the Z axis. As described above, the wafer stage 15 has the function to effect the movement in the X axis direction, the function to effect the movement in the Y axis direction, the function to effect the movement in the Z axis direction, the function to effect the rotation about the Z axis, the function to effect the tilting about the X axis, and the function to effect the tilting about the Y axis.

A movement mirror 17 is attached to one end of the upper surface of the wafer stage 15. A laser interferometer 18 is arranged at a position opposed to the mirror surface of the movement mirror 17. Although the illustration is simplified in FIG. 1, the movement mirror 17 includes a movement mirror which has a reflecting surface perpendicular to the X axis and a movement mirror which has a reflecting surface perpendicular to the Y axis. The laser interferometer 18 includes two laser interferometers for the X axis for irradiating the laser beam onto the movement mirror 17 along the X axis and a laser interferometer for the Y axis for irradiating the laser beam onto the movement mirror 17 along the Y axis. The X coordinate and the Y coordinate of the wafer stage 15 are measured by the one laser interferometer for the X axis and the one laser interferometer for the Y axis.

The angle of rotation of the wafer stage 15 in the XY plane is measured in accordance with the difference between the measured values obtained by the two laser interferometers for the X axis. The information about the X coordinate, the Y coordinate, and the angle of rotation measured by the laser interferometer 18 is supplied as the stage position information to the main control system 20. The main control system 20 outputs a control signal to a stage-driving system 19 while monitoring the supplied stage position information to control the positioning operation of the wafer stage 15 in an order of nanometer. A reflecting surface may be provided on the side surface of the wafer stage 15 in place of the movement mirror 17. In this arrangement, the substantially entire upper surface of the wafer stage 15 can be substantially flush.

The exposure apparatus EX shown in FIG. 1 comprises a liquid supply unit 21 and a liquid recovery unit 22 for supplying the liquid LQ to the image plane side of the projection optical system PL and recovering the supplied liquid LQ. The liquid supply unit 21 includes, for example, a tank for accommodating the liquid LQ and a pressurizing pump. One end of a supply tube 23 is connected to the liquid supply unit 21. Supply nozzles 24 are connected to the other end of the supply tube 23. The liquid LQ is supplied via the supply tube 23 and the supply nozzles 24. In this embodiment, the ArF laser beam is used as the exposure beam. Therefore, pure water is used as the liquid LQ. It is not necessarily indispensable that the exposure apparatus EX is provided, for example, with the tank and the pressurizing pump of the liquid supply unit 21. At least a part of the component can be replaced with the equipment of the factory or the like in which the exposure apparatus EX is installed.

The liquid recovery unit 22 includes, for example, a suction pump and a tank for accommodating the recovered liquid LQ. One end of a recovery tube 25 is connected to the liquid recovery unit 22. Recovery nozzles 26 are connected to the other end of the recovery tube 25. The liquid LQ, which is supplied to the image plane side of the projection optical system PL, is recovered by the liquid recovery unit 22 via the recovery nozzles 26 and the recovery tube 25. The liquid supply unit 21 and the liquid recovery unit 22 are controlled by the main control system 20. It is not necessarily indispensable that the exposure apparatus EX is provided, for example, with the suction pump and the tank of the liquid recovery unit 22. At least a part of the component can be replaced with the equipment of the factory or the like in which the exposure apparatus EX is installed.

That is, when the liquid LQ is supplied to the space on the image plane side of the projection optical system PL, the main control system 20 outputs the control signals to the liquid supply unit 21 and the liquid recovery unit 22 respectively to control the supply amount and the recovery amount of the liquid LQ per unit time. According to the control as described above, the liquid LQ is supplied in a necessary and sufficient amount to the image plane side of the projection optical system PL. In the example shown in FIG. 1, the liquid LQ is recovered by using, for example, the suction pump, the recovery tube 25, and the recovery nozzles 26 provided over the wafer stage 15. However, there is no limitation thereto. For example, a recovery section (discharge port) for the liquid LQ may be provided around the upper surface of the wafer stage 15, and the liquid recovery unit 22 may be used in combination therewith.

Figure 3A:
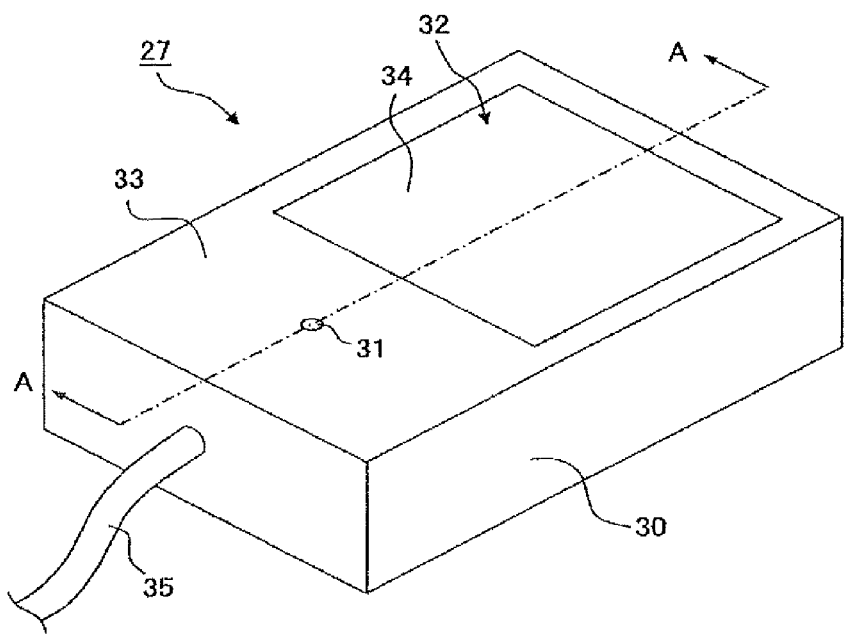
FIGS. 3A and 3B show an exemplary arrangement of an exposure beam sensor 27.
Figure 3B:
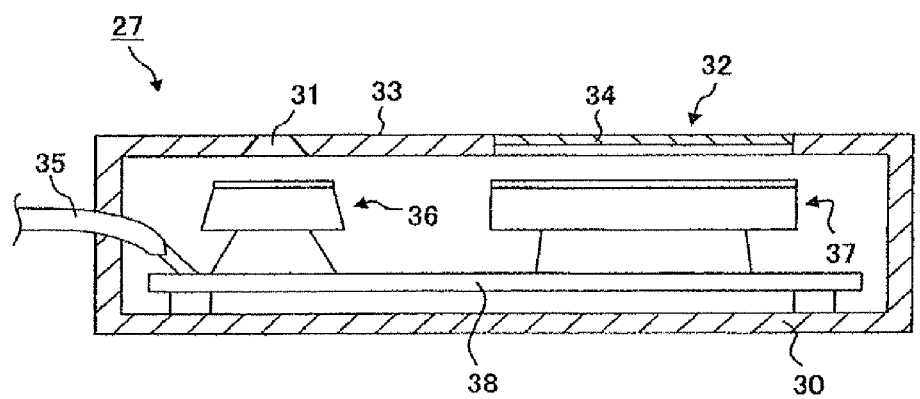

The exposure beam sensor 27, which measures the uneven illuminance (uneven light amount) or the totalized uneven light amount and the light amount (radiation amount) of the exposure beam to be radiated onto the wafer stage 15 via the projection optical system PL, is provided on the wafer stage 15 described above. FIG. 3 shows an exemplary structure of the exposure beam sensor 27, wherein FIG. 3A shows a perspective view, and FIG. 3B shows a sectional view taken along arrows indicated by a line A-A shown in FIG. 3A. As shown in FIG. 3A, the exposure beam sensor 27 includes a chassis 30 having a substantially rectangular parallelepiped shape. The chassis 30 is a casing which is formed of a metal such as aluminum having a high coefficient of thermal conductivity. The chassis 30 has the upper surface 33 which is formed with an opening 32 and a pinhole 31 as the light-transmitting section.

The pinhole 31, which is formed through the upper surface 33 of the chassis 30, is provided to measure the uneven illuminance or the totalized uneven light amount of the exposure beam IL radiated via the projection optical system PL, which has a diameter of about ten to twenty or several tens μm. The opening 32, which is formed through the upper surface 33 of the chassis 30, is designed to have a size approximately equivalent to that of the exposure area (projection area of the projection optical system PL). An ND filter 34, which has one surface vapor-deposited, for example, with Cr (chromium) and which reduces the incoming light beam, is provided in the opening 32. As shown in FIG. 3B, an irradiation irregularity sensor 36 and a dose sensor 37 are provided in the chassis 30. Any one of the irradiation irregularity sensor 36 and the dose sensor 37 is provided with a light-receiving element such as a PIN photodiode. The light amount of the exposure beam come into the light-receiving surface thereof is detected. In FIG. 3A, reference numeral 35 indicates a wiring for leading, to the outside of the exposure beam sensor 27, the detection signals of the light-receiving elements provided for the irradiation irregularity sensor 36 and the dose sensor 37 (see FIG. 3B).

The irradiation irregularity sensor 36 has the areal size of the light-receiving surface which is set to such an extent that the exposure beam, which has passed through the pinhole 31, can be received. The dose sensor 37 has the areal size of the light-receiving surface which is set to such an extent that the exposure beam, which is transmitted through the ND filter 34 provided in the opening 32, can be received. The light-receiving element, which is provided for each of the irradiation irregularity sensor 36 and the dose sensor 37, has the light-receiving surface which is coated with an AR coat for the ArF laser beam. The respective light-receiving elements are attached to an electric circuit board 38 by the aid of support members.

The wiring 35 is connected to the electric circuit board 38. In this arrangement, the detection signals of the light-receiving elements provided for the irradiation irregularity sensor 36 and the dose sensor 37 are led to the outside via the wiring 35. The light-receiving elements provided for the irradiation irregularity sensor 36 and the dose sensor 37 respectively may be, for example, any one of phototransformation elements based on the use of, for example, the photoelectromotive force effect, the Schottky effect, the photoelectromagnetic effect, the photoconduction effect, the photoelectron emission effect, and the pyroelectric effect. The exposure beam sensor 27 is not limited to the arrangement in which the light-receiving elements are provided therein. Alternatively, the exposure beam sensor 27 may be constructed such that only a light-receiving system for receiving the exposure beam is provided inside, and the light beam, which is received by the light-receiving system, is led to the outside of the chassis 30 by using, for example, an optical fiber or a mirror to effect the photoelectric conversion by using a photoelectric detector such as a photomultiplier.

When the pinhole 31 provided for the exposure beam sensor 27 is arranged in the exposure area, and the exposure beam is radiated onto the exposure area, then only the exposure beam, which is included in the radiated exposure beam and which has passed through the pinhole 31, is detected by the light-receiving element provided for the irradiation irregularity sensor 36. When the exposure beam is detected while moving the pinhole 31 in the state in which the exposure beam is radiated onto the exposure area, it is possible to measure the uneven illuminance and the totalized uneven light amount of the exposure beam in the exposure area. When the exposure beam is radiated onto the exposure area in a state in which the opening 32 provided for the exposure beam sensor 27 is arranged in the exposure area, the exposure beam, which is reduced or dimmed by the ND filter 34, is detected by the light-receiving element provided for the dose sensor 37. The light-reducing ratio or the extinction ratio of the ND filter 34 is known. Therefore, it is possible to measure the light amount of the exposure beam radiated onto the exposure area on the basis of the light-reducing ratio and the result of the detection performed by the light-receiving element provided for the dose sensor 37.

The detection signal of the exposure beam sensor 27 as explained above is supplied to the main control system 20. The measuring operations for the uneven illuminance and the light amount are executed, for example, periodically (every time when the wafers W in a lot unit are processed and every time when the reticle R is exchanged). The main control system 20 changes the intensity of the exposure beam radiated from the light source 1 so that the unevenness is decreased, and the main control system 20 controls the illuminance distribution of the exposure beam radiated onto the image plane side of the projection optical system PL, on the basis of the uneven illuminance and the uneven totalized light amount measured by using the irradiation irregularity sensor 36 of the exposure beam sensor 27. Further, the main control system 20 determines the control parameter to compensate the variation or fluctuation of the optical characteristic of the projection optical system PL caused by the incidence of the exposure beam on the basis of the light amount of the exposure beam measured by using the light amount sensor 37 of the exposure beam sensor 27. When the wafer W is exposed, the control parameter is used to control the optical characteristic of the projection optical system PL by the aid of the lens controller section 14. As for the adjustment for the illuminance distribution of the exposure beam radiated onto the image plane side of the projection optical system PL, it is possible to apply techniques as disclosed, for example, in Japanese Patent Application Laid-open No. 10-189427 (corresponding to U.S. Pat. No. 5,867,319), Japanese Patent Application Laid-open No. 2002-100561 (corresponding to U.S. Pat. No. 6,771,350), and Japanese Patent Application Laid-open No. 2000-315648 (corresponding to U.S. Pat. Nos. 6,013,401 and 6,292,255). The disclosures of the patent documents are incorporated herein by reference within a range of permission of the domestic laws and ordinances of the state designated or selected in this international application.

Figure 4:
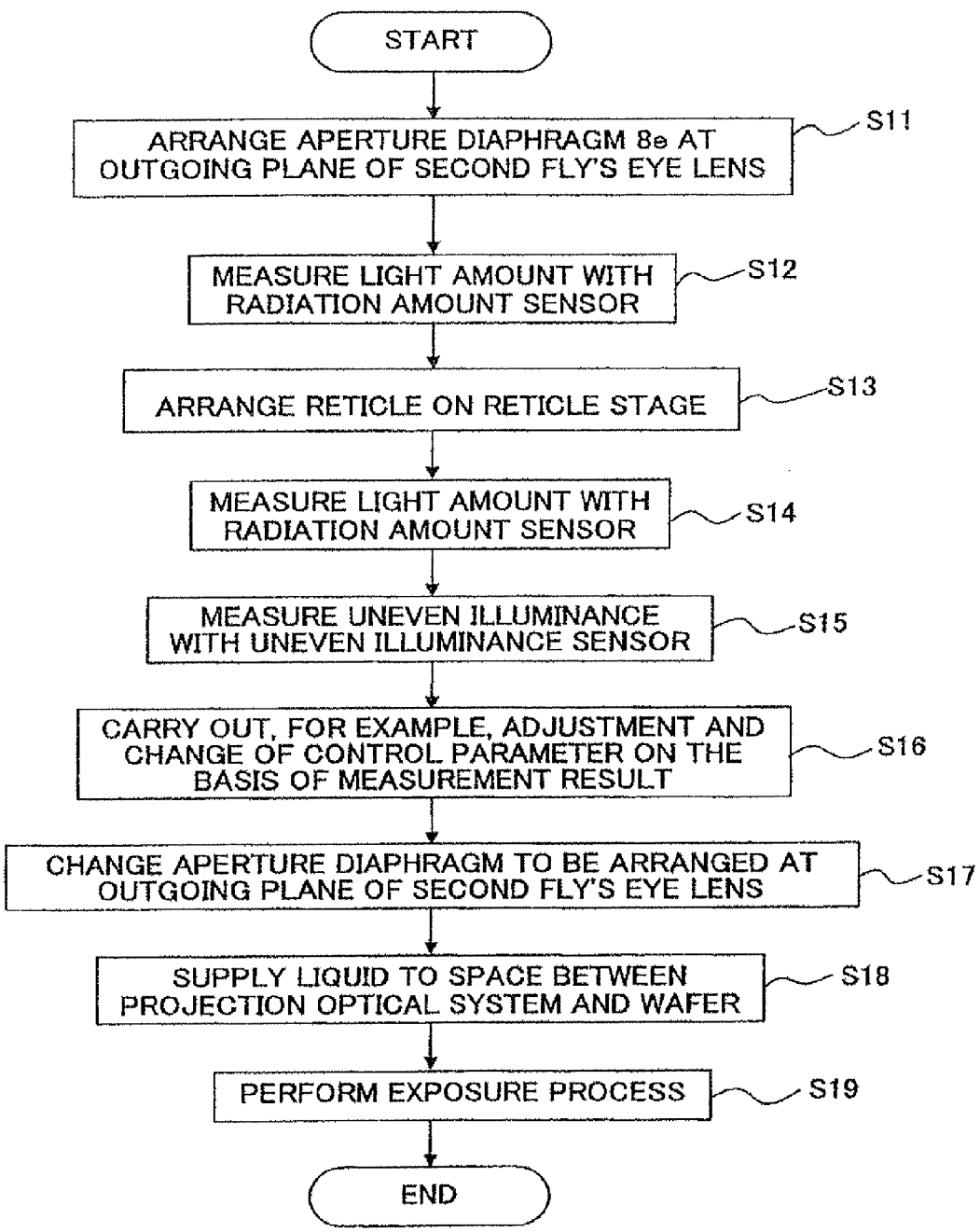
FIG. 4 shows a flow chart illustrating an exemplary operation to be performed upon the start of the exposure process effected by the exposure apparatus according to the first embodiment of the present invention.

The arrangement of the exposure apparatus EX according to the first embodiment of the present invention has been explained above. Next, an explanation will be made about the operation of the exposure apparatus EX constructed as described above. FIG. 4 shows a flow chart illustrating an example of the operation to be performed upon the start of the exposure process by the exposure apparatus according to the first embodiment of the present invention. The flow chart shown in FIG. 4 is executed, for example, when the wafers W in an amount of one lot are subjected to the exposure process. At the point of the time of the start, the reticle R is not retained on the reticle stage 13, the wafer W 16 is not retained on the wafer holder 16, and the liquid LQ is not supplied to the image plane side of the projection optical system PL.

Starting from this state, the main control system 20 firstly drives the driving motor 8f to arrange, at the outgoing plane CJ of the second fly's eye lens 7, the minute circular aperture diaphragm 8e having the minute σ value of the aperture diaphragms 8a to 8e arranged in the aperture diaphragm plate 8 (Step S1). When the arrangement of the aperture diaphragm 8e is completed, the main control system 20 outputs the control signal to the stage-driving system 19 while monitoring the measurement result of the laser interferometer 18 to move the wafer stage 15 so that the opening 32 (ND filter 34) formed on the chassis 30 of the exposure beam sensor 27 is arranged in the exposure area.

When the arrangement of the exposure beam sensor 27 is completed in accordance with the movement of the wafer stage 15, the main control system 20 outputs the control signal to the light source 1 so that the light source 1 effects the light emission. The substantially parallel light flux, which is radiated from the light source 1 in accordance with the light emission of the light source 1, passes through the beam-shaping optical system 2, and the light flux is shaped into the light flux having the predetermined cross section. The light flux successively passes along the interference-reducing section 3, the first fly's eye lens 4, the vibration mirror 5, and the relay optical system 6, and the light flux comes into the second fly's eye lens 7. Accordingly, the large number of secondary light sources are formed on the outgoing plane CJ of the second fly's eye lens 7.

The exposure beam, which is included in the light fluxes from the secondary light sources and which has passed through the aperture diaphragm 8e arranged at the outgoing plane CJ of the second fly's eye lens 7, passes through the condenser optical system 10, and the exposure beam is deflected by the bending mirror 11. In this situation, the reticle R is not retained by the reticle stage 13. Therefore, the exposure beam, which has been deflected by the bending mirror 11, directly comes into the projection optical system PL without passing through the reticle R.

In this arrangement, the projection optical system PL is designed to have the large the numerical aperture NA in order to realize the high resolution. The image of the pattern can be formed on the image plane side even when the angular aperture of the exposure beam directed toward the image plane side of the projection optical system PL is large in a state in which the liquid LQ is supplied to the image plane side of the projection optical system PL. However, in this situation, the liquid LQ is not supplied to the image plane side of the projection optical system PL. Therefore, if the aperture diaphragm 8e having the relatively large σ value is arranged at the outgoing plane CJ of the second fly's eye lens 7, a part of the exposure beam including the outermost ray is subjected to the total reflection at the end portion of the projection optical system PL, which cannot pass through the projection optical system PL.

Figure 45:
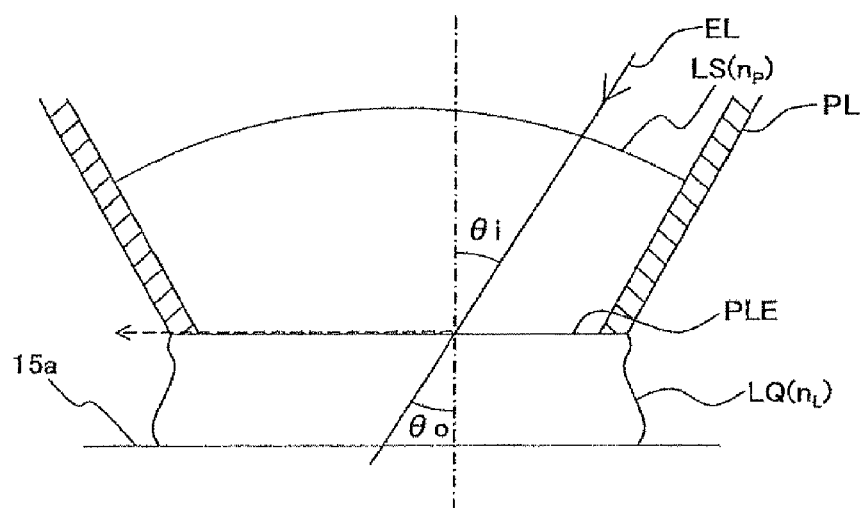
FIG. 45 illustrates the condition under which the total reflection is not caused for a part of the ray of the exposure beam at the end portion of the projection optical system in relation to the refractive index of the medium to make contact with the end portion of the projection optical system.

This situation will be explained with reference to FIG. 45. In FIG. 45, the liquid LQ is supplied to the space between the stage surface 15a and the optical element LS provided at the end portion of the projection optical system PL. The condition, under which the light beam passes through the projection optical system PL and the light beam outgoes from the end portion PLE on the light-outgoing side of the optical element LS to the liquid, is that the exposure beam (outermost ray) EL is not totally reflected by the interface between the optical element LS and the medium existing in the space between the optical element LS and the stage surface 15a, i.e., the end portion PLE on the light-outgoing side of the optical element LS. The total reflection condition resides in that $n_p \cdot \sin \theta i = n_L$ is satisfied, wherein θi represents the incident angle of the exposure beam EL into the end portion PLE on the light-outgoing side, $n_p$ represents the refractive index of the end portion PLE on the light-outgoing end of the optical element LS, and $n_L$ represents the refractive index of the liquid LQ (medium). Therefore, on condition that the incident angle θi satisfies $n_p \cdot \sin \theta i < n_L$, the exposure beam EL is refracted from the end portion PLE on the light-outgoing side toward the liquid, and the exposure beam EL outgoes at the outgoing angle θo. However, when the liquid LQ is absent in the space between the projection optical system PL and the stage surface 15a, the gas having a refractive index $n_G$ exists in the space. Therefore, the condition, under which the total reflection is not caused, resides in $n_p \cdot \sin \theta i < n_G$. However, the refractive index $n_G$ of the gas is usually smaller than the refractive index $n_L$ of the liquid. Therefore, the angle θi, which satisfies this condition, is smaller than that obtained when the liquid exists. As a result, even in the case of the same incident angle θi, the total reflection is occasionally caused as shown by a broken line in FIG. 45, when the liquid LQ is absent (illustrated case resides in the total reflection critical angle). Therefore, in order to measure the exposure beam without allowing the liquid to intervene in the space, it is sometimes necessary that the angle should be adjusted to be smaller than the incident angle approved when the liquid immersion exposure is performed.

In this embodiment, the angular aperture of the exposure beam directed toward the image plane side of the projection optical system PL is adjusted (angular aperture is decreased) by arranging the aperture diaphragm 8e having the minute σ value (for example, 0.25) at the outgoing plane CJ of the second fly's eye lens 7 in Step S11. Therefore, the exposure beam, which has come into the projection optical system PL, can pass through the projection optical system PL. The exposure beam, which has passed through the projection optical system PL, comes into the ND filter 34 (FIG. 3) arranged in the exposure area. The exposure beam is reduced by a predetermined amount, and the exposure beam is detected by the light-receiving element provided for the dose sensor 37. The detection signal is outputted to the main control system 20 to calculate the light amount of the exposure beam radiated onto the exposure area by using the light-reducing ratio of the ND filter 34. Accordingly, the light amount of the exposure beam radiated onto the exposure area is measured in the state in which the reticle R is not retained by the reticle stage 13 (Step S12).

Subsequently, the main control system 20 stops the light emission of the light source 1, and then the control signal is outputted to an unillustrated reticle loader system to export the predetermined reticle R from an unillustrated reticle library. The reticle R is retained on the reticle stage 13 (Step S13). When the reticle R is retained on the reticle stage 13, the main control system 20 allows the light source 1 to effect the light emission again, and the light amount of the exposure beam passed through the reticle R is measured by using the dose sensor 37 (Step S14). Accordingly, it is possible to determine the difference between the light amount of the exposure beam radiated onto the exposure area when the reticle R is retained on the reticle stage 13 and the light amount of the exposure beam radiated onto the exposure area when the reticle R is not retained. The transmittance of the reticle R (incoming light amount into the projection optical system PL) can be determined on the basis of the difference.

Subsequently, the main control system 20 outputs the control signal to the unillustrated reticle loader system to effect the export from the reticle stage 13 and effect the waiting operation. Further, the control signal is outputted to the stage-driving system 19 while monitoring the measurement result of the laser interferometer 18 to move the wafer stage 15 so that the pinhole 31 formed for the chassis 30 of the exposure beam sensor 27 is arranged at the predetermined position in the exposure area. When the arrangement of the exposure beam sensor 27 is completed in accordance with the movement of the wafer stage 15, the main control system 20 outputs the control signal to the light source 1 to allow the light source 1 to effect the light emission. The uneven illuminance of the exposure beam radiated onto the exposure area is measured by using the irradiation irregularity sensor 36 while moving the wafer stage 15 (Step S15).

When the processing as described above is completed, then the main control system 20 outputs the control signal to the light source 1 to change the intensity and the intensity distribution of the exposure beam on the basis of the measurement results obtained in Steps S14 and S15, or the main control system 20 changes the parameter to adjust the optical performance of the projection optical system PL by the aid of the lens controller section 14 (Step S16). Subsequently, the main control system 20 outputs the control signal to the unillustrated reticle loader so that the reticle R is retained on the reticle stage 13. Further, the driving motor 8f is driven so that the aperture diaphragm 8e, which is to be arranged at the outgoing plane CJ of the second fly's eye lens 7, is changed to any one of the aperture diaphragms 8a to 8d for exposing the wafer W. For example, when the zonal illumination is performed, the aperture diaphragm 8b is arranged at the outgoing plane CJ of the second fly's eye lens 7 (Step S17).

Subsequently, the main control system 20 outputs the control signal to the unillustrated wafer loader system to transport the wafer W into the unillustrated chamber of the exposure apparatus EX so that the wafer W is retained on the wafer holder 16. When the wafer W is retained on the wafer holder 16, the main control system 20 outputs the control signals to the liquid supply unit 20 and the liquid recovery unit 22. Accordingly, the liquid LQ is supplied to the space on the image plane side of the projection optical system PL (Step S18), and the exposure process is performed, in which the pattern formed on the reticle R is transferred onto the wafer W via the projection optical system PL and the liquid LQ (Step S19). The exposure process is performed for all of the wafers W of the amount of one lot. The processing shown in FIG. 4 as explained above is performed every time when the exposure process is performed for new lot. The optical performance of the projection optical system PL is adjusted depending on the radiation amount of the exposure beam with respect to the projection optical system PL by using the control parameter determined in Step S16 during the exposure for the wafers W of the amount of one lot.

For the purpose of convenience of the explanation, the flow chart shown in FIG. 4 has been explained as exemplified by the case in which the measurement of the light amount based on the use of the dose sensor 37 (Step S14) and the measurement of the uneven illuminance based on the use of the irradiation irregularity sensor 36 (Step S15) are continuously performed in the state in which the aperture diaphragm 8e having the minute σ value is arranged without any liquid LQ at the outgoing plane CJ of the second fly's eye lens 7. However, any one of the measurements may be performed through the liquid LQ on the image plane side of the projection optical system PL. In particular, the correct uneven illuminance cannot be measured in some cases under the condition (condition of the minute σ value of 0.25) different from the actual exposure condition. Therefore, the measurement in Step S15 may be performed in the state in which the liquid LQ is supplied to the image plane side of the projection optical system PL (i.e., between Step S18 and Step S19) by applying any countermeasure for the liquid immersion to the irradiation irregularity sensor 36, for example, by performing a waterproof treatment to the pinhole 31.

In the embodiment described above, the uneven illuminance is measured by the irradiation irregularity sensor 36 after performing the measurement of the light amount based on the use of the dose sensor 37. However, the steps of exporting and importing the reticle R lower the throughput. Therefore, it is preferable that the light amount is measured by the dose sensor 37 after measuring the uneven illuminance by the irradiation irregularity sensor 36. The reticle R is retracted from the optical path for the exposure beam during the measurement of the uneven illuminance based on the use of the irradiation irregularity sensor 36. However, a reticle (simple glass for the measurement), on which no pattern is formed, may be arranged.

In the embodiment described above, the coherence factor (σ of the illumination system) is changed to adjust the angular aperture of the exposure beam directed to the image plane side of the projection optical system PL by changing the aperture diaphragm to be arranged at the outgoing plane CJ of the second fly's eye lens 7. However, the adjustment of the angular aperture of the exposure beam is not limited thereto, for which various methods can be used. For example, the adjustment may be performed such that a zoom optical system is arranged at the upstream stage (on the side of the light source 1) of the second fly's eye lens 7, and the distribution of the light flux come into the second fly's eye lens 7 is changed to change the light flux distribution of the exposure beam at the outgoing plane CJ of the second fly's eye lens 7. In the embodiment described above, the value of the coherence factor (σ of the illumination system) is set to 0.25. However, there is no limitation thereto. Setting may be made such that the total reflection is not caused for a part of the exposure beam at the end surface of the projection optical system PL even in the state in which liquid LQ is absent on the image plane side of the projection optical system PL, considering the refractive index of the liquid LQ and the numerical aperture of the projection optical system PL.

In the embodiment described above, the measurement by the irradiation irregularity sensor 36 and the measurement by the dose sensor 37 are performed in the state in which the liquid LQ is absent on the image plane side of the projection optical system PL. However, even when the angular aperture of the exposure beam is adjusted, the reflectance at the lower surface of the projection optical system PL is sometimes different between the state in which the liquid LQ exists on the image plane side of the projection optical system PL and the state in which the liquid LQ is absent. In such a situation, the following procedure is available. That is, for example, the exposure beam is radiated in a state in which a reflecting plate having a predetermined reflectance is arranged on the image plane side of the projection optical system PL. The light amount returned from the projection optical system PL is measured for the state in which the liquid LQ exists and the state in which the liquid LQ is absent respectively by using a reflection amount monitor as disclosed, for example, in Japanese Patent Application Laid-open No. 2001-144004 (corresponding to U.S. Pat. No. 6,730,925). The difference therebetween is retained as correction information. The measurement results of the irradiation irregularity sensor 36 and the dose sensor 37, which are obtained without the liquid LQ, are corrected by using the correction information. The disclosure of Japanese Patent Application Laid-open No. 2001-144004 (corresponding to U.S. Pat. No. 6,730,925) is incorporated herein by reference within a range of permission of the domestic laws and ordinances of the state designated or selected in this international application.

The first embodiment has been explained for the case in which the measurement is performed without the liquid LQ by using the irradiation irregularity sensor 36 and the dose sensor 27. However, the measurement without the liquid LQ is also applicable to various measuring units including, for example, a spatial image-measuring unit and a wave front aberration-measuring unit as described later on. In this case, an optical (glass) member, which amounts to the liquid LQ, may be arranged in the space on the image plane side of the projection optical system PL. When such an optical member is arranged, the measurement can be performed even without the liquid LQ under a condition approximate to that of the case in which the space on the image plane side of the projection optical system PL is filled with the liquid LQ. The wave front aberration-measuring unit is disclosed, for example, in U.S. Pat. No. 6,650,399 and United States Patent Publication No. 2004/0090606. The disclosures thereof are incorporated herein by reference.

As described above, in the first embodiment, the exposure beam come into the projection optical system PL can be satisfactorily received via the light-transmitting section of each of the various sensors even when the numerical aperture of the projection optical system is increased as a result of the adoption of the liquid immersion method. Further, the measurement can be performed with the various sensors without being affected by the state of the liquid LQ (for example, the temperature change, the fluctuation, and the transmittance change), because the exposure beam is received without passing through the liquid LQ.

Second Embodiment

Next, an exposure apparatus according to a second embodiment of the present invention will be explained. The overall structure of the exposure apparatus of this embodiment is constructed in approximately the same manner as the exposure apparatus shown in FIG. 1. However, the structure of the exposure beam sensor 27 differs. In the first embodiment, the exposure beam sensor 27 performs the measuring operation (receiving of the exposure beam) without providing the liquid LQ on the image plane side of the projection optical system PL. However, in the following description, an exposure beam sensor 27 performs the measuring operation through the liquid LQ on the image plane side of the projection optical system PL. As shown in FIG. 3, the exposure beam sensor 27 described in the first embodiment is provided with the irradiation irregularity sensor 36 and the dose sensor 37. In the following description, for the purpose of simplification of the explanation, a case will be principally exemplified and explained by way of example, in which the present invention is applied to an irradiation irregularity sensor provided for the exposure beam sensor 27. However, it is a matter of course that the present invention is also applicable to the dose sensor and the spatial image-measuring unit as described later on.

Figure 5A:
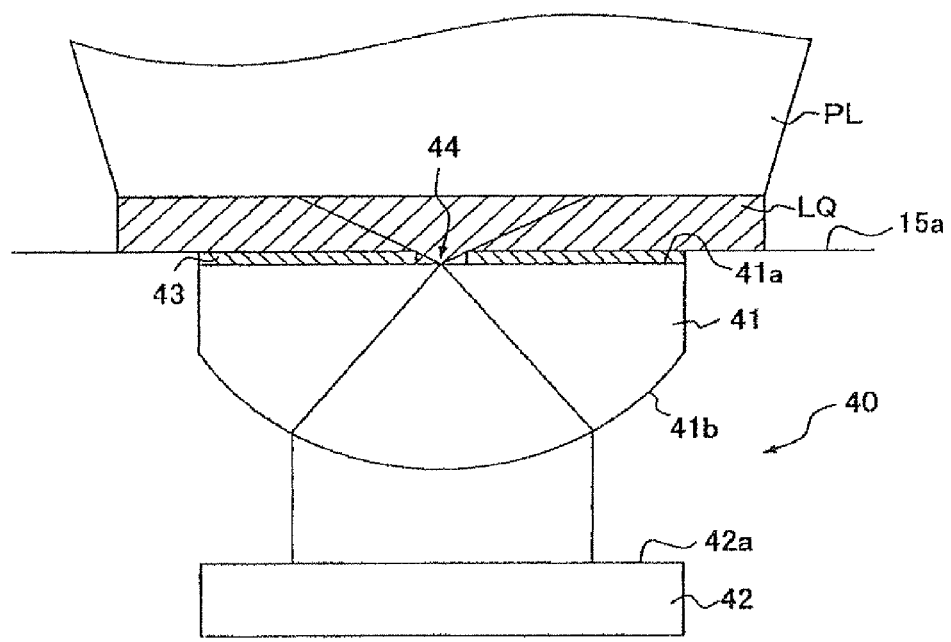
FIGS. 5A and 5B show a schematic arrangement of an irradiation irregularity sensor provided for an exposure apparatus according to a second embodiment of the present invention.
Figure 5B:
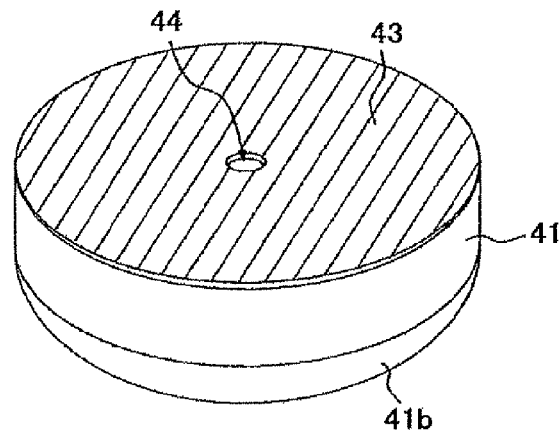

FIG. 5 shows a schematic arrangement of the irradiation irregularity sensor provided for the exposure apparatus according to the second embodiment of the present invention, wherein FIG. 5A shows a sectional view, and FIG. 5B shows a perspective view illustrating a plano-convex lens provided for the irradiation irregularity sensor. As shown in FIG. 5A, the irradiation irregularity sensor 40, which is provided for the exposure apparatus of this embodiment, is constructed to include the plano-convex lens 41 and a light-receiving element 42.

As shown in FIGS. 5A and 5B, the plano-convex lens 41 is an optical lens which is formed with a flat section 41a and a curved section 41b having a predetermined curvature. This embodiment is based on the use of the light beam of the ArF excimer laser light source in the vacuum ultraviolet region as the exposure beam in the same manner as the first embodiment. Therefore, for example, synthetic quartz or fluorite is used as the material for the plano-convex lens 41. A light-shielding section 43 is formed on the flat section 41 of the plano-convex lens 41 by vapor-depositing a metal such as Cr (chromium) onto the entire surface except for a central portion. The metal such as Cr (chromium) is not vapor-deposited on the central portion of the flat section 41a. Accordingly, a light-transmitting section 44, which has a diameter of about ten to twenty or several tens μm, is formed.

The plano-convex lens 41, which is constructed as described above, is attached to the wafer stage 15 so that the flat section 41a formed with the light-shielding section 43 is directed toward the projection optical system PL, and the upper surface (upper surface of the light-shielding section 43) is coincident with the upper surface 15a of the wafer stage 15. The light-receiving element 42 is attached to the wafer stage 15 so that the light-receiving surface 42a is directed toward the curved section 41b of the plano-convex lens 41, and an approximately central portion of the light-receiving surface 42a is arranged on the optical axis of the plano-convex lens 41. The light-receiving surface 42a of the light-receiving element 42 is coated with an AR coat for the ArF laser beam.

For the purpose of convenience of the explanation, it is assumed that the plano-convex lens 41 and the light-receiving element 42 are attached to the wafer stage 15. However, it is preferable that these components are attached in a chassis which is similar to the chassis 30 shown in FIG. 3, and the chassis is provided on the wafer stage 15. In the case of such an arrangement, the plano-convex lens 41 is attached to the chassis so that the upper surface of the plano-convex lens 41 (upper surface of the light-shielding section 43) is coincident with the upper surface of the chassis. Further, the chassis is attached to the wafer stage 15 so that the upper surface of the chassis is coincident with the upper surface 15a of the wafer stage 15.

Even in any one of the case in which the plano-convex lens 41 is attached to the wafer stage 15 and the case in which the plano-convex lens 41 is attached to the chassis similar to the chassis 30 shown in FIG. 3, a waterproof (liquid-proof) countermeasure is applied, for example, by a seal member so that the liquid LQ on the wafer stage 15 does not make inflow into the irradiation irregularity sensor 40. Therefore, even when the liquid LQ is supplied to the space between the projection optical system PL and the wafer stage 15 when the irradiation irregularity sensor 40 is arranged under the projection optical system PL (in the direction) as shown in FIG. 5A, the liquid LQ does not make inflow into the irradiation irregularity sensor 40.

Therefore, the measurement of the uneven illuminance of the exposure beam or the uneven totalized light amount of the exposure beam based on the use of the irradiation irregularity sensor 40 of this embodiment can be performed in the state in which the liquid LQ is supplied to the space between the projection optical system PL and the upper surface 15a of the wafer stage 15 (plano-convex lens 41), while the illumination condition for the illumination optical system IS is set to the illumination condition to be established when the exposure process is performed for the wafer W. The exposure beam, which has come into the projection optical system PL, passes through the projection optical system PL to come into the liquid LQ without being totally reflected at the end portion of the projection optical system PL in the state in which the liquid LQ is supplied to the space between the projection optical system PL and the upper surface 15a of the wafer stage 15.

As shown in FIG. 5A, the exposure beam, which is included in the exposure beam come into the liquid LQ and which has come into the light-shielding section 43, is shielded. Only the exposure beam, which has come into the pinhole-shaped light-transmitting section 44, comes into the plano-convex lens 41 from the flat section 41a. In this arrangement, the refractive index of the plano-convex lens 41 is approximately equivalent to the refractive index of the liquid LQ, or the refractive index of the plano-convex lens 41 is higher than the refractive index of the liquid LQ. Therefore, even when the exposure beam, which has come into the light-transmitting section 44, has a large incident angle, the exposure beam, which has come into the light-transmitting section 44, comes into the plano-convex lens 41 without being totally reflected by the flat section 41a of the plano-convex lens 41 exposed in the light-transmitting section 44. The exposure beam, which has come into the plano-convex lens 41, is collected by the curved section 41b formed for the plano-convex lens 41, and then the exposure beam comes into the light-receiving surface 41a. The exposure beam is received by the light-receiving element 42.

As described above, in this embodiment, the light-shielding section 43 and the light-transmitting section 44 are formed on the flat section 41a of the plano-convex lens 41, and the exposure beam, which has passed through the light-transmitting section 44, is allowed to directly come into the plano-convex lens 41 having the high refractive index without passing through the gas. Therefore, even when the exposure beam having the large incident angle comes into the light-transmitting section 44, the exposure beam can be incorporated into the plano-convex lens 41 without being totally reflected. Further, the exposure beam, which has come into the plano-convex lens 41, is collected by the curved section 41b, and the exposure beam is introduced into the light-receiving surface 42a of the light-receiving element 42. Therefore, even when the exposure beam, which has come into the light-transmitting section 44, has the large incident angle, the exposure beam can be received by the light-receiving element 42.

In the case of the irradiation irregularity sensor 40 shown in FIG. 5, the metal such as Cr (chromium) is vapor-deposited onto the flat section 41a except for the central portion of the plano-convex lens 41 to form the light-shielding section 43 and the light-transmitting section 44. Therefore, as shown in FIG. 5A, the light-transmitting section 44 is consequently formed as a recess. When the liquid LQ, which is supplied to the projection optical system PL, is always circulated by the liquid supply unit 21 and the liquid recovery unit 22, a possibility is assumed such that the flow of the liquid LQ may be disturbed due to the presence of the light-transmitting section 44. Further, it is feared that the bubble may remain in the light-transmitting section 44 when the supply of the liquid LQ onto the plano-convex lens 41 is started. An irradiation irregularity sensor shown in FIG. 6 described below improves this embodiment in relation to this point.

Figure 6A:
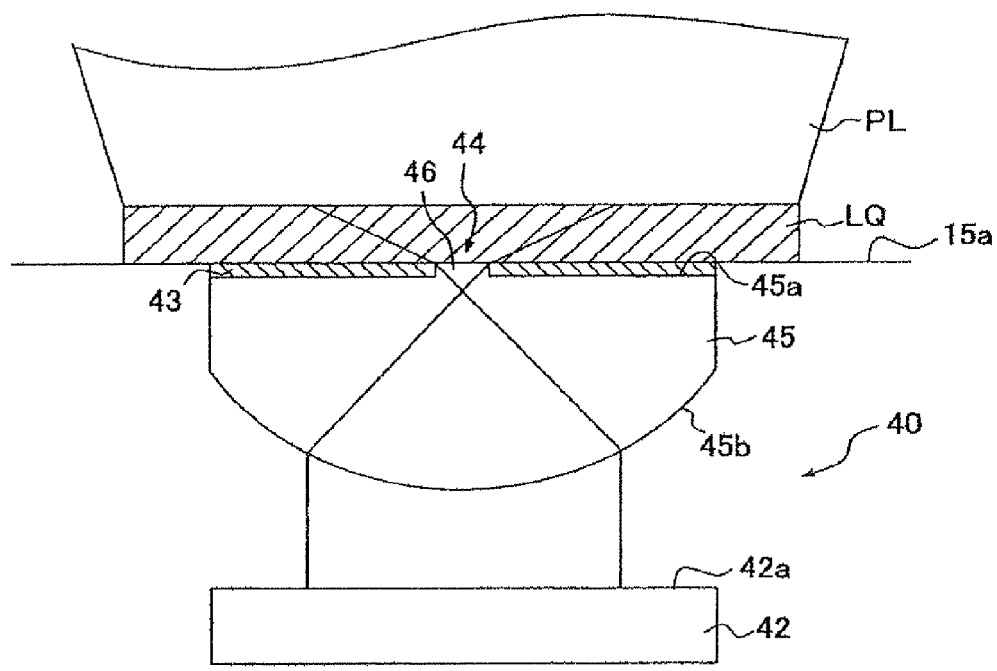
FIGS. 6A and 6B show a modified embodiment of the irradiation irregularity sensor provided for the exposure apparatus according to the second embodiment of the present invention.
Figure 6B:
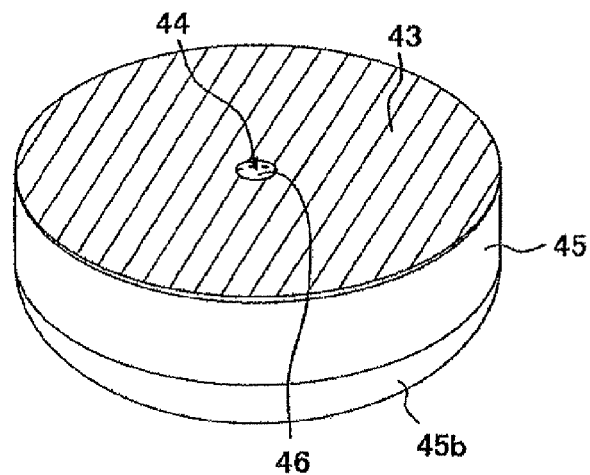

FIG. 6 shows a modified embodiment of the irradiation irregularity sensor provided for the exposure apparatus according to the second embodiment of the present invention, wherein FIG. 6A shows a sectional view, and FIG. 6B shows a perspective view illustrating a plano-convex lens provided for the irradiation irregularity sensor. The irradiation irregularity sensor 40 shown in FIG. 6 differs in that the plano-convex lens 45 is provided in place of the plano-convex lens 41 provided for the irradiation irregularity sensor 40 shown in FIG. 5. As shown in FIG. 6, the plano-convex lens 45 has a flat section 45a and a curved section 45b which are formed in the same manner as the flat section 41a and the curved section 41b formed for the plano-convex lens 41. However, the plano-convex lens 45 differs in that the flat section 45a is not flat over the entire surface, and a projection 46 having a flat upper portion is formed in the vicinity of the center of the flat section 45a.

The light-shielding section 43 is formed on the flat section 45a by vapor-depositing a metal such as Cr (chromium) except for the projection 46. The projection 46, which is formed at the central portion of the flat section 45a, has the height which is designed to be approximately the same as the thickness of the light-shielding section 43. In other words, in the case of the illuminance sensor 40 shown in FIG. 6, the projection 46 is formed as the pinhole-shaped light-transmitting section 44. Accordingly, as shown in FIG. 6, even when the liquid LQ is supplied to the space between the projection optical system PL and the wafer stage 15 (plano-convex lens 45) in a state in which the irradiation irregularity sensor 40 is arranged under the projection optical system PL (in the –Z direction), then the liquid LQ does not flow into the light-transmitting section 44, and the flow of the liquid LQ is not disturbed. Further, no bubble remains at the light-transmitting section 44. Therefore, when the irradiation irregularity sensor 40 constructed as shown in FIG. 6 is used, it is possible to perform the more correct measurement.

In the second embodiment, the projection 46 is formed integrally with the plano-convex lens 45. However, the projection 46 and the plano-convex lens 45 may be formed separately. Alternatively, the projection 46 and the plano-convex lens 45 may be formed of different substances. In this case, those usable as the substance for forming the projection 46 include such substances that the exposure beam can be transmitted therethrough, the refractive index of the substance is approximately equivalent to the refractive index of the material for the plano-convex lens 45, or the refractive index of the substance is higher than the refractive index of the liquid LQ, and the refractive index of the substance is lower than the refractive index of the material for the plano-convex lens 45.

Third Embodiment

Next, an exposure apparatus according to a third embodiment of the present invention will be explained. The entire structure of the exposure apparatus of this embodiment is constructed in approximately the same manner as the exposure apparatus shown in FIG. 1, in the same manner as in the second embodiment described above. However, the structure of the exposure beam sensor 27 differs. Also in this embodiment, an explanation will be principally made about an irradiation irregularity sensor provided for the exposure beam sensor 27.

Figure 7A:
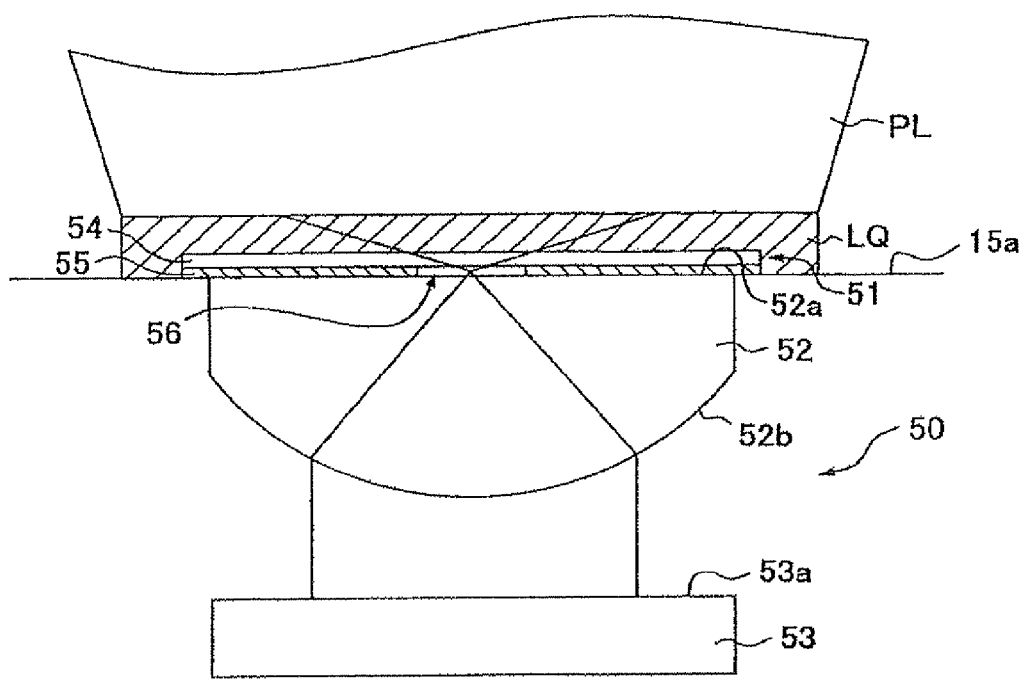
FIGS. 7A and 7B show a schematic arrangement of an irradiation irregularity sensor provided for an exposure apparatus according to a third embodiment of the present invention.
Figure 7B:
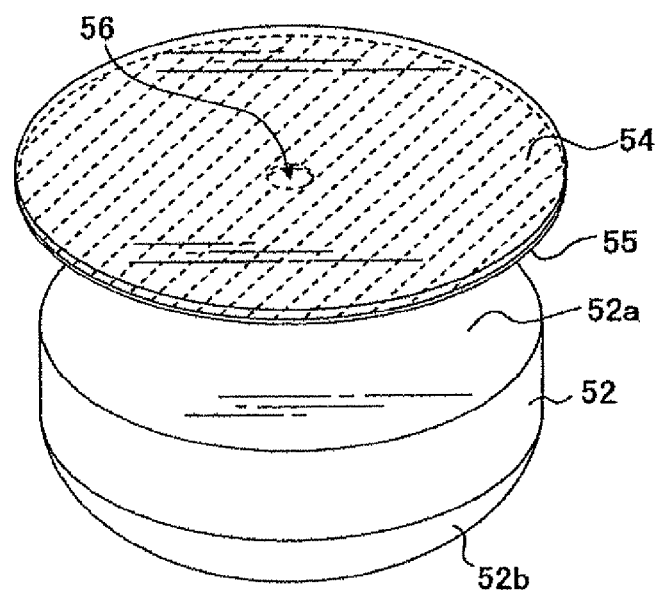

FIG. 7 shows a schematic arrangement of the irradiation irregularity sensor provided for the exposure apparatus according to the third embodiment of the present invention, wherein FIG. 7A shows a sectional view, and FIG. 7B shows a perspective view illustrating an aperture plate and a plano-convex lens provided for the irradiation irregularity sensor. As shown in FIG. 7A, the irradiation irregularity sensor 50 provided for the exposure apparatus of this embodiment is constructed to include an upper plate 51, the plano-convex lens 52, and a light-receiving element 53.

As shown in FIGS. 7A and 7B, the upper plate 51 is provided with a parallel flat plate 54 composed of synthetic quarts or fluorite which has a high transmittance with respect to the light beam of the ArF excimer laser light source in the vacuum ultraviolet region. A light-shielding section 55 is formed on one surface of the parallel flat plate 54 by vapor-depositing a metal such as Cr (chromium) onto the entire surface except for a central portion. The central portion, on which the metal such as Cr (chromium) is not vapor-deposited, is a circular light-transmitting section 56. The plano-convex lens 52 is an optical lens composed of synthetic quartz or fluorite formed with a flat section 52a and a curved section 52b having a predetermined curvature in the same manner as the plano-convex lens 41 shown in FIG. 5.

The upper plate 51 is attached to make abutment against the upper surface 15a of the wafer stage 15 with the surface formed with the light-shielding section 55 being directed downwardly. The plano-convex lens 52 is attached to make abutment against (make tight contact with) the light-shielding section 55 of the upper plate 51 with the flat section 52a being directed toward the projection optical system PL. The light-receiving element 53 is equivalent to the light-receiving element 42 shown in FIG. 5. The light-receiving element 53 is attached to the wafer stage 15 so that the light-receiving surface 53a is directed toward the curved section 52b of the plano-convex lens 52, and the approximately central portion of the light-receiving surface 53a is arranged on the optical axis of the plano-convex lens 52.

The upper plate 51, the plano-convex lens 52, and the light-receiving element 53 may be attached in a chassis similar to the chassis 30 shown in FIG. 3 in the same manner as in the second embodiment, and the chassis may be provided on the wafer stage 15. In the case of such an arrangement, the upper plate 51 is attached while allowing the light-shielding section 55 to make abutment against the chassis, and the chassis is attached to the wafer stage 15 so that the upper surface of the chassis is coincident with the upper surface 15a of the wafer stage 15. A waterproof countermeasure is applied with a seal member or the like for the upper plate 51 between the upper plate 51 and the upper surface of the wafer stage 15 or the upper surface of the chassis.

In the case of the irradiation irregularity sensor 50 constructed as described above, the upper plate 51 serves to avoid any invasion of the liquid LQ into the irradiation irregularity sensor 50. Even when the irradiation irregularity sensor 50 of this embodiment is used, then the illumination condition of the illumination optical system IS is set to the illumination condition to be established when the exposure process is performed for the wafer W, and the measurement can be performed for the uneven illuminance or the like in the state in which liquid LQ is supplied to the space between the projection optical system PL and the wafer stage 15.

The exposure beam, which has come into the projection optical system PL in the state in which the liquid LQ is supplied to the space between the projection optical system PL and the upper surface 15a of the wafer stage 15, is not totally reflected at the end portion of the projection optical system PL, and the exposure beam passes through the projection optical system PL to come into the liquid LQ. The refractive index of the parallel flat plate 54 provided for the upper plate 51 is approximately equivalent to the refractive index of the liquid LQ, or the refractive index is higher than the refractive index of the liquid LQ. Therefore, the exposure beam, which has passed through the liquid LQ, comes into the upper plate 51. The light beam from the light-transmitting section 56 formed through the upper plate 51 comes into the plano-convex lens 52. The exposure beam, which has come into the plano-convex lens 52, is collected by the curved section 52b formed for the plano-convex lens 52. The exposure beam is guided to the light-receiving surface 53a, and the exposure beam is received by the light-receiving element 53.

Figure 8:
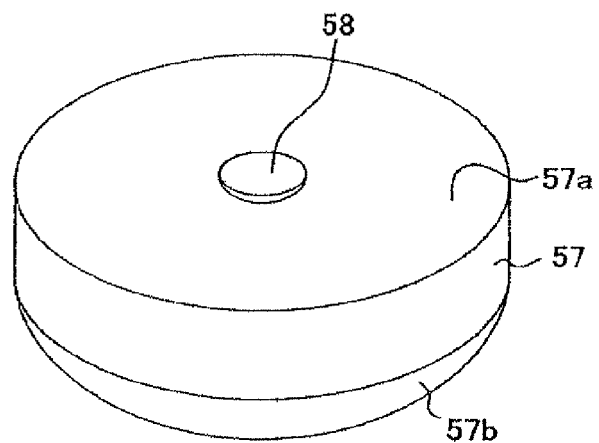
FIG. 8 shows a perspective view illustrating another example of a plano-convex lens provided for the irradiation irregularity sensor provided for the exposure apparatus according to the third embodiment of the present invention.

In this embodiment, the flat section 52a of the plano-convex lens 52 is in contact with the surface on which the light-shielding section 55 of the upper plate 51 is formed. Therefore, the light beam from the light-transmitting section 56 can be introduced into the light-receiving element 53 by the plano-convex lens 52 without passing through the gas. With reference to FIG. 7, when the space is consequently formed at the light-transmitting section 56 between the lower surface of the parallel flat plate 54 and the upper surface of the plano-convex lens 52 due to the thickness of the light-shielding section (film) formed on one surface of the parallel flat plate 54, a light-transmissive medium other than the gas, which includes, for example, liquid, supercritical fluid, paste, and solid, may be intervened in the space of the light-transmitting section 56 between the light-transmitting section and the light-collecting member, for example, in a form of thin film. Alternatively, an adhesive, through which the exposure beam is transmissive, can be used to join the parallel flat plate 54 and the plano-convex lens 52 to allow the adhesive to intervene in the space of the light-transmitting section 56 as well. In this arrangement, it is desirable that the refractive index of the substance intervened in the light-transmitting section 56 with respect to the exposure beam is approximately equivalent to the refractive indexes of the plano-convex lens 52 and the parallel flat plate 54. Further, a plano-convex lens 57 shown in FIG. 8 may be provided in place of the plano-convex lens 52. FIG. 8 shows a perspective view illustrating another example of the plano-convex lens provided for the irradiation irregularity sensor provided for the exposure apparatus according to the third embodiment of the present invention. The plano-convex lens 57 shown in FIG. 8 is formed with a flat section 57a and a curved section 57b in the same manner as the plano-convex lens 52 shown in FIG. 7. However, the plano-convex lens 57 differs in that the flat section 57a is not flat over the entire surface, and a projection 58 having a flat upper portion is formed in the vicinity of the center of the flat section 57a.

The height of the projection 58 is set to be approximately the same as the thickness of the light-shielding section 55 formed for the upper plate 51. The diameter of the projection 58 is set to be approximately the same as the diameter of the light-transmitting section 56 formed for the upper plate 51. When the flat section 57a of the plano-convex lens 57 constructed as described above is in contact with the surface of the upper plate 51 formed with the light-shielding section 55, the projection 58 is fitted to the light-transmitting section 56 formed for the upper plate 51. Accordingly, the exposure beam, which is included in the exposure beam come into the parallel flat plate 54 of the upper plate 51 and which has come into the light-transmitting section 56, passes through the light-transmitting section 56 so that the exposure beam comes into the plano-convex lens 57 from the upper surface of the projection 58. In FIG. 8, the projection 58 is formed integrally with the plano-convex lens 57. However, the projection 58 and the plano-convex lens 57 may be formed separately. Alternatively, the projection 58 and the plano-convex lens 57 may be formed of different substances. In this case, it is desirable that the substance for forming the projection 58 is such a substance that the exposure beam can be transmitted therethrough, and the substance has the refractive index approximately equivalent to the refractive indexes of the material for the parallel flat plate 54 and the material for the plano-convex lens 57.

This embodiment is constructed such that the light-shielding section 55 is formed on the bottom surface side of the parallel flat plate 54 to allow the plano-convex lens 52 (57) to make the abutment. However, the light-shielding section 55 may be formed at the flat section 52a (57a) of the plano-convex lens 52 (57) to allow the parallel flat plate 54 to make the abutment.

Fourth Embodiment

Figure 9:
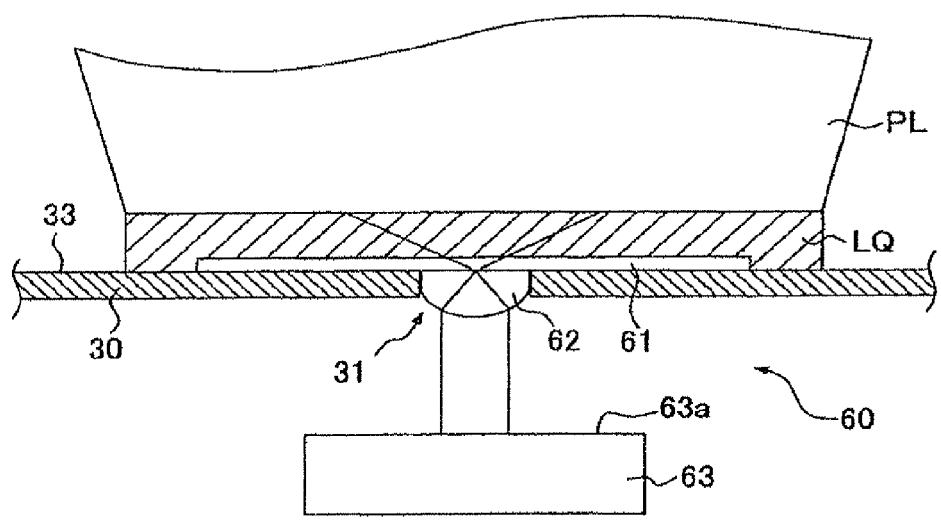
FIG. 9 shows a sectional view illustrating a schematic arrangement of an irradiation irregularity sensor provided for an exposure apparatus according to a fourth embodiment of the present invention.

Next, an exposure apparatus according to a fourth embodiment of the present invention will be explained. The entire structure of the exposure apparatus of this embodiment is constructed in approximately the same manner as the exposure apparatus shown in FIG. 1, in the same manner as in the second and third embodiments described above. However, the structure of the exposure beam sensor 27 differs. Also in this embodiment, an explanation will be principally made about an irradiation irregularity sensor provided for the exposure beam sensor 27. FIG. 9 shows a sectional view illustrating a schematic arrangement of the irradiation irregularity sensor provided for the exposure apparatus according to the fourth embodiment of the present invention. As shown in FIG. 9, the irradiation irregularity sensor 60 provided for the exposure apparatus of this embodiment is constructed to include a parallel flat plate 61, a plano-convex lens 62, and a light-receiving element 63.

The parallel flat plate 61 is composed of synthetic quartz or fluorite having a high transmittance with respect to the light beam of the ArF excimer laser light source in the vacuum ultraviolet region. The parallel flat plate 61 is attached to the upper surface 33 of the chassis 30 so that the pinhole 31 formed for the chassis 30 shown in FIG. 3 is covered therewith. A waterproof countermeasure is applied to the parallel flat plate 61 by a seal member or the like between the parallel flat plate 61 and the upper surface 33 of the chassis 30 so that the liquid LQ, which is supplied to the image plane side of the projection optical system PL, does not make inflow into the irradiation irregularity sensor 60 via the pinhole 31.

The plano-convex lens 62 is an optical lens composed of synthetic quartz or fluorite having its diameter designed to be approximately equivalent to or slightly smaller than the diameter of the pinhole 31. The plano-convex lens 62 has its flat section which is stuck to the parallel flat plate 61, and thus the plano-convex lens 62 is arranged in the pinhole 31. The light-receiving element 63 is similar to the light-receiving element 42 shown in FIG. 5. The light-receiving element 63 is attached in the chassis 30 so that the light-receiving surface 63a is directed toward the curved section of the plano-convex lens 62, and an approximately central portion of the light-receiving surface 63a is arranged on the optical axis of the plano-convex lens 62. The areal size of the light-receiving surface 63a of the light-receiving element 42 may be appropriately changed depending on the width of the light flux of the exposure beam come thereinto.

Also in the case of the irradiation irregularity sensor 60 of this embodiment, the measurement can be performed, for example, for the uneven illuminance in the state in which the liquid LQ is supplied to the space between the projection optical system PL and the upper surface 33 of the chassis 30, while the illumination condition of the illumination optical system IS is set to the illumination condition to be established when the exposure process is performed for the wafer W. The exposure beam, which has come into the projection optical system PL in the state in which the liquid LQ is supplied to the space between the projection optical system PL and the upper surface 33 of the chassis 30, is not totally reflected at the end portion of the projection optical system PL, and the exposure beam passes through the projection optical system PL to come into the liquid LQ.

The refractive indexes of the parallel flat plate 61 and the plano-convex lens 62 are approximately equivalent to the refractive index of the liquid LQ, or the refractive indexes of the parallel flat plate 61 and the plano-convex lens 62 are higher than the refractive index of the liquid LQ. Therefore, the exposure beam, which is included in the exposure beam come into the parallel flat plate 61 through the liquid LQ and which is directed toward the pinhole 31, is allowed to come into the plano-convex lens 62 and collected. The exposure beam is introduced into the light-receiving surface 63a, and the exposure beam is received by the light-receiving element 63. As described above, also in this embodiment, the exposure beam, which comes from the projection optical system PL into the liquid LQ, does not pass through the gas until the exposure beam outgoes from the Plano-convex lens 62. Therefore, even when the exposure beam having a large incident angle comes into the pinhole 31, the exposure beam can be incorporated into the plano-convex lens 62 without being totally reflected. Further, the exposure beam can be received by the light-receiving element 63. When the invasion of the liquid LQ from the surrounding of the plano-convex lens 62 can be avoided, it is enough that the parallel flat plate 61 is dispensed with.

In the example shown in FIG. 9, the plano-convex lens 62 is arranged in the pinhole 31, which is stuck to the parallel flat plate 61 attached onto the chassis 30. However, the diameter of the plano-convex lens 62 is approximately equivalent to that of the pinhole 31, i.e., ten to twenty or several tens μm. Therefore, it is sometimes difficult to deal with the plano-convex lens 62. In such a situation, it is preferable that a convex lens, which is similar to the plano-convex lens 62, is integrally formed on the parallel flat plate 61, and the parallel flat plate 61 is attached onto the chassis 30 so that the convex lens is arranged in the pinhole 31. When the thickness of the upper plate of the chassis 30 is extremely thin, it is also appropriate that a large plano-convex lens is arranged on the lower surface of the chassis 30. Also in this case, the light beam from the pinhole 31 can be collected to arrive at the light-receiving element in the same manner as in FIG. 7A.

Fifth Embodiment

Figure 10:
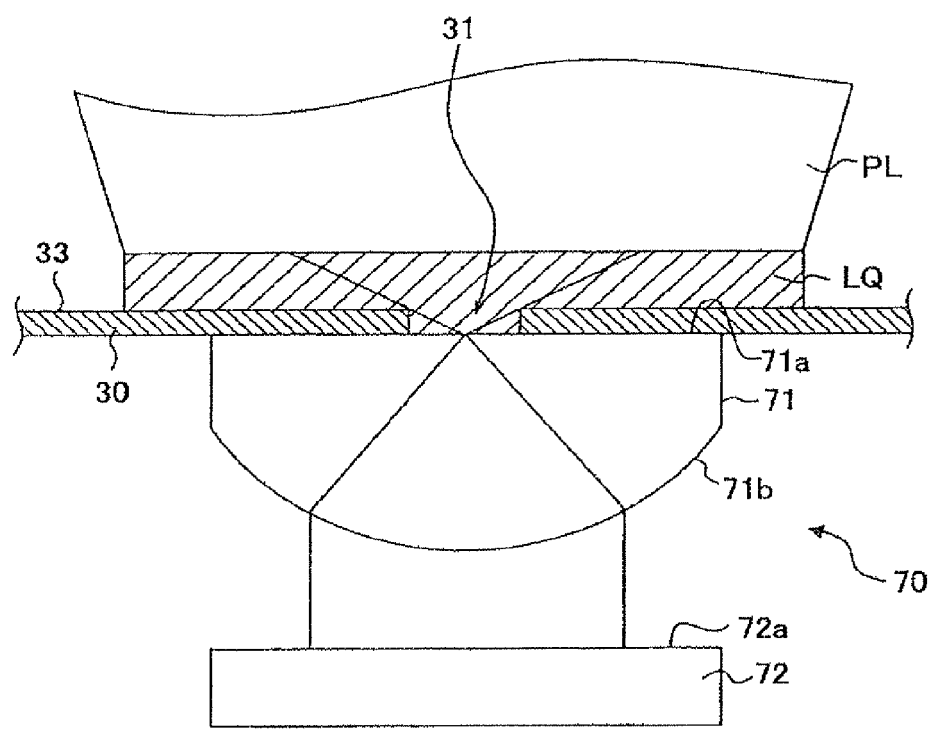
FIG. 10 shows a sectional view illustrating a schematic arrangement of an irradiation irregularity sensor provided for an exposure apparatus according to a fifth embodiment of the present invention.

Next, an exposure apparatus according to a fifth embodiment of the present invention will be explained. The entire structure of the exposure apparatus of this embodiment is constructed in approximately the same manner as the exposure apparatus shown in FIG. 1, in the same manner as in the second and fourth embodiments described above. However, the structure of the exposure beam sensor 27 differs. Also in this embodiment, an explanation will be principally made about an irradiation irregularity sensor provided for the exposure beam sensor 27. FIG. 10 shows a sectional view illustrating a schematic arrangement of the irradiation irregularity sensor provided for the exposure apparatus according to the fifth embodiment of the present invention. As shown in FIG. 10, the irradiation irregularity sensor 70 provided for the exposure apparatus of this embodiment is constructed to include a plano-convex lens 71 and a light-receiving element 72.

The plano-convex lens 71 is composed of synthetic quartz or fluorite having a high transmittance with respect to the light beam of the ArF excimer laser light source in the vacuum ultraviolet region, which has the diameter designed to be larger than the diameter of the pinhole 31 formed for the chassis 30 shown in FIG. 3. The plano-convex lens 71 has a flat section 71a which is stuck to the inner portion of the chassis 30 at the position of formation of the pinhole 31. Accordingly, a state is given, in which the pinhole 31 is closed by the plano-convex lens 71. It is possible to avoid the invasion of the liquid LQ into the irradiation irregularity sensor 70 via the pinhole 31. When the plano-convex lens 71 is stuck to the inner portion of the chassis 30, it is preferable to apply a waterproof countermeasure by a seal member or the like.

The light-receiving element 72 is similar to the light-receiving element 42 shown in FIG. 5. The light-receiving element 72 is attached in the chassis 30 so that the light-receiving surface 72a is directed toward the curved section 71b of the plano-convex lens 72, and an approximately central portion of the light-receiving surface 72a is arranged on the optical axis of the plano-convex lens 71. Also in the case of the irradiation irregularity sensor 70 of this embodiment, the measurement can be performed, for example, for the uneven illuminance in the state in which the liquid LQ is supplied to the space between the projection optical system PL and the upper surface 33 of the chassis 30, while the illumination condition of the illumination optical system IS is set to the illumination condition to be established when the exposure process is performed for the wafer W.

The exposure beam, which comes into the projection optical system PL in the state in which the liquid LQ is supplied to the space between the projection optical system PL and the upper surface 33 of the chassis 30, is not totally reflected at the end portion of the projection optical system PL, and the exposure beam passes through the projection optical system PL to come into the liquid LQ. The refractive index of the plano-convex lens 71 is approximately equivalent to the refractive index of the liquid LQ, or the refractive index of the plano-convex lens 71 is higher than the refractive index of the liquid LQ. Therefore, the exposure beam, which is included in the exposure beam come into the liquid LQ and which comes into the pinhole 31, is allowed to come into the plano-convex lens 71 and collected. The exposure beam is introduced into the light-receiving surface 72a, and the exposure beam is received by the light-receiving element 72.

As described above, in this embodiment, the exposure beam, which has come into the liquid LQ from the projection optical system PL and which has passed through the pinhole 31, directly comes into the plano-convex lens 71 having the high refractive index without passing through the gas. Therefore, even when the exposure beam having a large incident angle comes into the pinhole 31, the exposure beam can be incorporated into the plano-convex lens 71 without being totally reflected. Further, the exposure beam can be received by the light-receiving element 72.

In this embodiment, a possibility is assumed such that the flow of the liquid LQ may be disturbed due to the presence of the pinhole 31, and the liquid LQ may be excited or boiled due to the occurrence of the vortex flow to generate the bubble in the liquid LQ, in the same manner as in the second embodiment. In order to avoid such an inconvenience, the plano-convex lens 57 shown in FIG. 8 can be used as the plano-convex lens 71, and the plano-convex lens 57 can be stuck to the inner portion of the chassis 30 so that the projection 58, which is formed on the flat section 57a, is fitted to the pinhole 31. Alternatively, a substance, through which the exposure beam is transmissive, may be intervened in the pinhole 31.

The second to fifth embodiments have been explained above as exemplified by the case in which the plano-convex lens 41, 45, 52, 57, 62, 71 and the light-receiving element 42, 53, 63, 72 are arranged separately. However, in order to maximally avoid the absorption of the exposure beam by oxygen or the like, the plano-convex lens 41, 45, 52, 57, 62, 71 and the light-receiving element 42, 53, 63, 72 may be in contact with each other. The foregoing embodiments have been explained as exemplified by the plano-convex lens 41, 45, 52, 57, 62, 71 as the light-collecting member. However, other than the above, it is possible to use, for example, DOE (diffractive optical element), small lens array, Fresnel lens, and reflecting mirror.

Sixth Embodiment

Next, an exposure apparatus according to a sixth embodiment of the present invention will be explained. The entire structure of the exposure apparatus of this embodiment is also constructed in approximately the same manner as the exposure apparatus shown in FIG. 1. However, the structure of the exposure beam sensor 27 differs. The exposure beam sensor 27 provided for the exposure apparatus of this embodiment performs the measuring operation through the liquid LQ on the image plane side of the projection optical system PL, in the same manner as in the second to fifth embodiments described above. However, this embodiment will be principally explained as exemplified by a dose sensor provided for the exposure beam sensor 27. It is a matter of course that this embodiment is also applicable to the irradiation irregularity sensor described above and the spatial image-measuring unit as described later on.

Figure 11A:
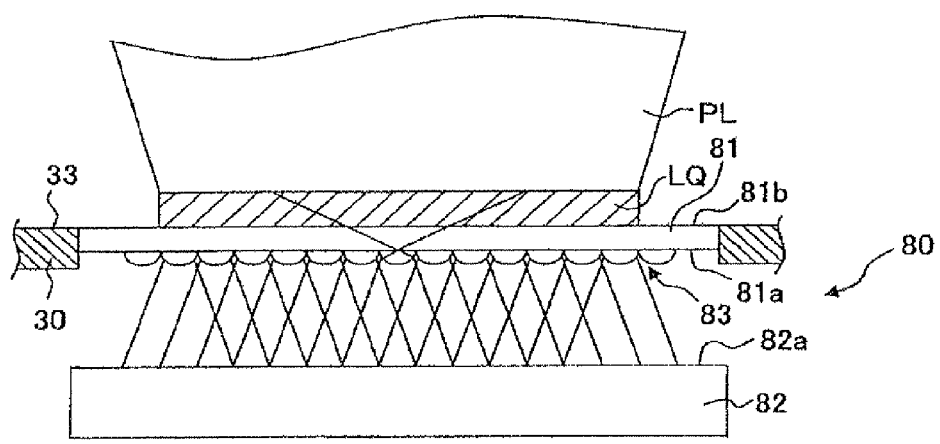
FIGS. 11A and 11B show a schematic arrangement of a dose sensor provided for an exposure apparatus according to a sixth embodiment of the present invention.
Figure 11B:
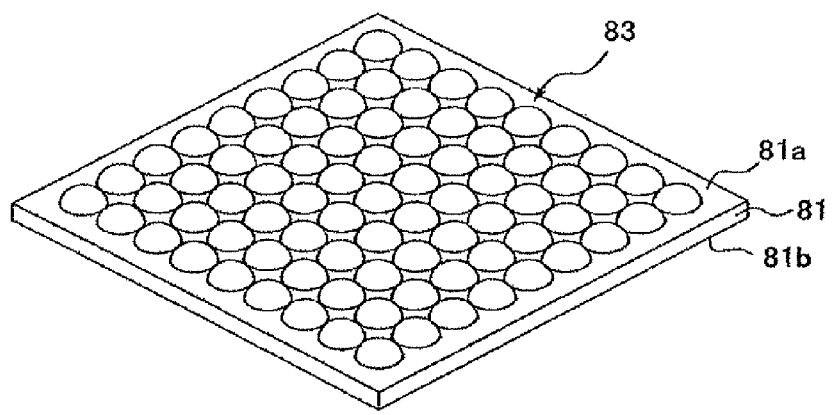

FIG. 11 shows a schematic arrangement of the dose sensor provided for the exposure apparatus according to the sixth embodiment of the present invention. As shown in FIG. 11A, the dose sensor 80 provided for the exposure apparatus of this embodiment is constructed to include a light-collecting plate 81 and a light-receiving element 82. The light-collecting plate 81 is composed of synthetic quartz or fluorite having a high transmittance with respect to the light beam of the ArF excimer laser light source in the vacuum ultraviolet region. As shown in FIGS. 11A and 11B, a microlens array 83 is formed on one surface (surface to make no contact with the liquid LQ) 81a of the light-collecting plate 81.

The microlens array 83 is an optical element which is composed of a large number of circular microlenses having the positive refractive power arranged, for example, in the two directions perpendicular to one another. The microlens array 83 shown in FIG. 11 is illustrated by way of example in every sense. The shape of the microlenses is not limited to the circular shape, which may be a square shape. The arrangement is not limited to the arrangement in the two perpendicular directions, which may be a dense arrangement. The microlens array 83 is constructed, for example, by performing the etching treatment to one surface of a parallel plane glass plate to form a group of microlenses.

The light-collecting plate 81 is provided in the opening 32 formed for the chassis 30 so that the flat surface 81b, which is opposed to the surface 81a formed with the microlens array 83, is directed toward the projection optical system PL (in the +Z direction), and the surface 81b is coincident with the upper surface 33 of the chassis 30 shown in FIG. 3. In this embodiment, the ND filter 34 shown in FIG. 3 is not provided. Another arrangement is also available such that the microlens array 83 is stuck to the ND filter 34, or the ND filter is provided between the microlens array 83 and the light-receiving element 82. A waterproof countermeasure is applied between the light-collecting plate 81 and the chassis 30 so that the liquid LQ, which is supplied to the image plane side of the projection optical system PL, does not make inflow into the chassis 30.

The light-receiving element 82 is arranged so that the light-receiving surface 82a is directed toward the light-collecting plate 81, and an approximately central portion of the light-receiving surface 82a is positioned just under the approximately central portion of the light-collecting plate 81 (in the −Z direction). The light-receiving element 82 is attached closely to the light-collecting plate 81 so that most of the light flux collected by the light-collecting plate 81 is received by the light-receiving surface 82a. An AR coat for the ArF laser beam is applied to the light-receiving surface 82a of the light-receiving element 82.

When the light amount of the exposure beam radiated onto the exposure area is measured by using the dose sensor 80 of this embodiment, the measurement can be performed in such a state that the illumination condition of the illumination optical system IS is set to the illumination condition to be established when the exposure process is performed for the wafer W, and the liquid LQ is supplied to the space between the projection optical system PL and the upper surface 33 of the chassis 30, unlike the measurement to be performed with the dose sensor 37 of the first embodiment. The exposure beam comes into the projection optical system PL in the state in which the liquid LQ is supplied to the space between the projection optical system PL and the upper surface 33 of the chassis 30. The exposure beam passes through the projection optical system PL to come into the liquid LQ, although even the outmost ray is not totally reflected at the end portion of the projection optical system PL.

The refractive index of the light-collecting plate 81 is approximately equivalent to the refractive index of the liquid LQ, or the refractive index of the light-collecting plate 81 is higher than the refractive index of the liquid LQ. Therefore, the exposure beam, which has come into the liquid LQ, comes into the light-collecting plate 81. The wavefront of the exposure beam is two-dimensionally divided by the large number of microlenses which form the microlens array 83 formed on the surface 81a of the light-collecting plate 81, and the wavefront is converged by the refractive function of the microlenses. After that, the respective divided wavefronts have come into the light-receiving surface 82a of the light-receiving element 82 and received.

As described above, also in this embodiment, the exposure beam, which comes into the liquid LQ from the projection optical system PL, does not pass through the gas until the exposure beam outgoes from the light-collecting plate 81. Therefore, even when the exposure beam having a large incident angle comes into the light-collecting plate 81, the exposure beam can be incorporated into the light-collecting plate 81 without being totally reflected. Further, the exposure beam can be received by the light-receiving element 82. As for the dose sensor, the areal size of the opening 32 is large. Therefore, if an arrangement is adopted such that any single lens is provided for the opening 32 to collect the incoming light beam as with the plano-convex lens 41, 52, 71 used for the irradiation irregularity sensor explained in the second, third, and fifth embodiments, then the dose sensor is consequently large-sized, and any inconvenience arises when the sensor is provided on the wafer stage 15 shown in FIG. 1. In this embodiment, the microlens array 82 is used without using the single lens as described above. Thus, it is possible to realize the small size and the light weight of the dose sensor 80.

Figure 12:
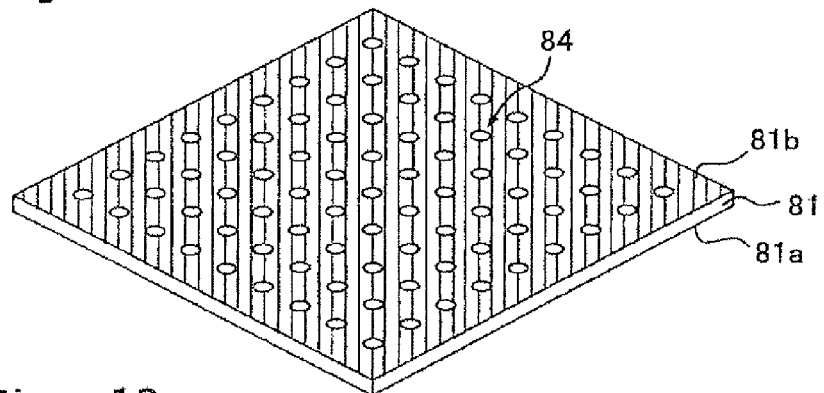
FIG. 12 shows a perspective view illustrating an exemplary structure of a light-collecting plate formed with apertures for an microlens array.

The foregoing explanation has been made for the case in which the microlens array 83 is formed on one surface 81a of the light-collecting plate 81. However, it is also preferable to use a light-collecting plate in which microlens arrays are formed on both surfaces (surfaces 81a, 81b). Alternatively, a fly's eye lens may be used in place of the microlens array. When the microlens array 83 is formed on only one surface 81a of the light-collecting plate 81, apertures 84 may be formed and used corresponding to the large number of respective microlenses for forming the microlens array 83, on the surface 81b of the light-collecting plate 81 directed toward the projection optical system PL as shown in FIG. 12. FIG. 12 shows a perspective view illustrating an exemplary arrangement of the light-collecting plate in which the apertures corresponding to the microlens array are formed.

The apertures 84 shown in FIG. 12 are formed, for example, such that a metal such as Cr (chromium) is vapor-deposited onto the entire surface of the surface 81b, and the portions corresponding to the respective microlenses are subjected to the etching. The aperture 84 functions as a diaphragm to restrict the amount of the light flux come into each of the microlenses. Therefore, it is possible to provide the function equivalent to that of the ND filter. In this embodiment, the illumination condition of the illumination optical system IS is set to the illumination condition to be established when the exposure process is performed for the wafer W. Therefore, in view of the protection of the light-collecting plate 81 and the light-receiving element 82, it is desirable to form the apertures 84. In this embodiment, the explanation has been made about the dose sensor 80 provided for the exposure beam sensor 27. However, for example, this arrangement is also applicable to the irradiation irregularity sensor by using the light-collecting plate formed with the microlens array in place of the plano-convex lens 41 shown in FIG. 5.

Seventh Embodiment

Next, an exposure apparatus according to a seventh embodiment of the present invention will be explained. The entire structure of the exposure apparatus of this embodiment is constructed in approximately the same manner as the exposure apparatus shown in FIG. 1. However, the structure of the exposure beam sensor 27 differs. The exposure beam sensor 27 provided for the exposure apparatus of this embodiment performs the measuring operation through the liquid LQ on the image plane side of the projection optical system PL, in the same manner as in the second to fifth embodiments described above. However, this embodiment will be principally explained about a dose sensor provided for the exposure beam sensor 27.

Figure 13:
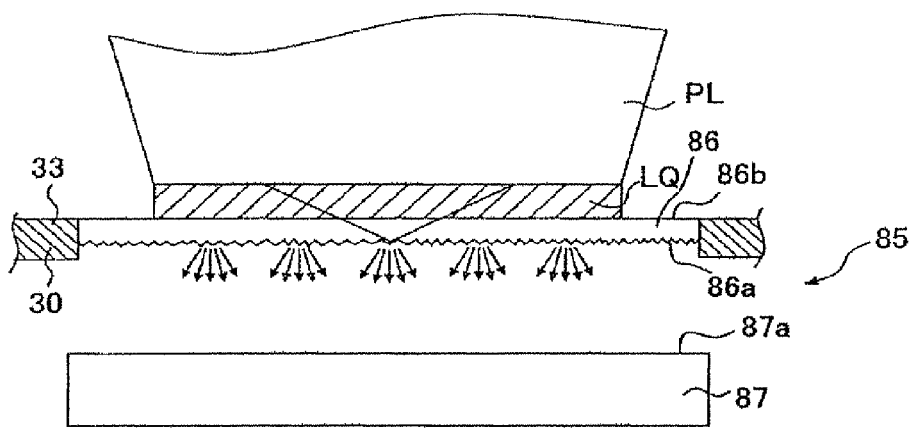
FIG. 13 shows a schematic arrangement of a dose sensor provided for an exposure apparatus according to a seventh embodiment of the present invention.

FIG. 13 shows a schematic arrangement of the dose sensor provided for the exposure apparatus according to the seventh embodiment of the present invention. As shown in FIG. 13, the dose sensor 85 provided for the exposure apparatus of this embodiment is constructed to include a diffusion plate 86 and a light-receiving element 87. The diffusion plate 86 is provided in the opening 32 formed for the chassis 30. The diffusion plate 86 is composed of synthetic quartz or fluorite. The diffusion plate 84 has a surface 86a formed with minute irregularities or concave/convex portions and a flat surface 86b. The diffusion plate 86 is provided in the opening 32 so that the surface 86b is directed toward the projection optical system PL (in the +Z direction), and the surface 86b is coincident with the upper surface 33 of the chassis 30 shown in FIG. 3. A waterproof countermeasure is applied with a seal member or the like between the diffusion plate 86 and the chassis 30. The light-receiving element 87 is arranged so that the light-receiving surface 87a is directed toward the diffusion plate 86, and an approximately central portion of the light-receiving surface 87a is positioned just under an approximately central portion of the diffusion plate 86 (in the −Z direction). The light-receiving element 87 is arranged in a state in which the light-receiving surface 87a is disposed closely to the diffusion plate 86. An AR coat for the ArF laser beam is applied to the light-receiving surface 87a of the light-receiving element 87.

When the light amount of the exposure beam radiated onto the exposure area is measured by using the dose sensor 85 of this embodiment, the measurement is performed in such a state that the illumination condition of the illumination optical system is set to the illumination condition to be established when the exposure process is performed for the wafer W, and the liquid LQ is supplied to the space between the projection optical system PL and the upper surface 33 of the chassis 30, in the same manner as in the sixth embodiment. When the exposure beam comes into the projection optical system PL in this state, the exposure beam passes through the projection optical system PL, while even the outmost ray is not totally reflected at the end portion of the projection optical system PL, and the exposure beam comes into the liquid LQ. Further, the exposure beam comes into the diffusion plate 86 having the refractive index which is approximately equivalent to or higher than the refractive index of the liquid LQ. The exposure beam, which comes into the diffusion plate 86, is diffused by the surface 86a formed with the minute irregularities when the exposure beam outgoes from the diffusion plate 86. After that, the exposure beam has come into the light-receiving surface 87a of the light-receiving element 87 and received.

As described above, also in this embodiment, the exposure beam, which comes into the liquid LQ from the projection optical system PL, does not pass through the gas until the exposure beam outgoes from the diffusion plate 86. Therefore, even when the exposure beam having a large incident angle comes into the diffusion plate 86, the exposure beam is not totally reflected. Further, when the exposure beam outgoes from the diffusion plate 86, the exposure beam is diffused. Accordingly, a larger amount of the exposure beam having the large incident angle can be received by the light-receiving element 87. Further, it is possible to realize a small size of the dose sensor 85 in the same manner as in the sixth embodiment.

The foregoing explanation has been made as exemplified by the case in which the diffusion plate 86, in which the minute irregularities are formed on only one surface 86a, is used. However, it is also preferable to use a diffusion plate 86 in which minute irregularities are formed on both surfaces (86a, 86b). Alternatively, a diffraction plate, in which DOE (diffractive optical element) is formed for allowing the incoming exposure beam to come into the light-receiving element while diffracting the exposure beam in accordance with the diffractive function, may be used in place of the diffusion plate 86. In this case, it is desirable that DOE is designed so that the angle of diffraction is small for the light flux having a large incident angle, and the diffraction is increased for the light flux having a large incident angle. When the diffraction plate is used, those appropriately usable include one in which DOE is formed on only one surface and one in which DOE is formed on both surfaces. The diffusion plate and the diffraction plate as described above can be also applied to the irradiation irregularity sensor.

Eighth Embodiment

Next, an exposure apparatus according to an eighth embodiment of the present invention will be explained. The entire structure of the exposure apparatus of this embodiment is constructed in approximately the same manner as the exposure apparatus shown in FIG. 1. However, the structure of the exposure beam sensor 27 differs. The exposure beam sensor 27 provided for the exposure apparatus of this embodiment performs the measuring operation through the liquid LQ on the image plane side of the projection optical system PL, in the same manner as in the second to fifth embodiments described above. However, this embodiment will be principally explained about a dose sensor provided for the exposure beam sensor 27.

Figure 14:
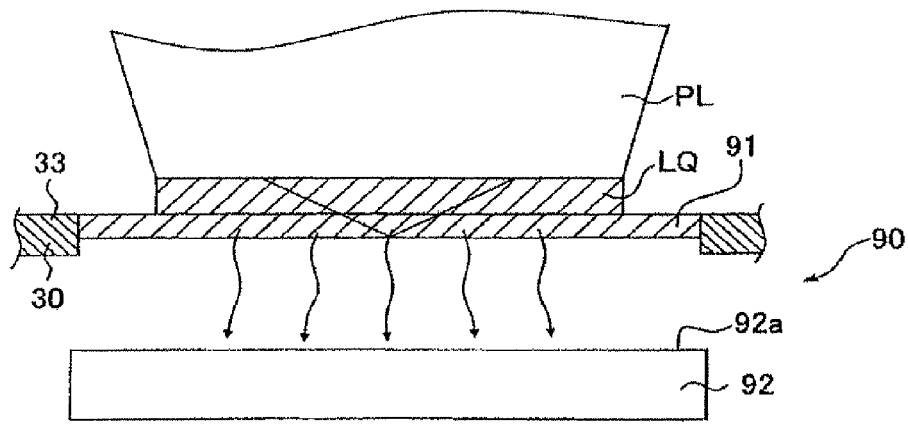
FIG. 14 shows a schematic arrangement of a dose sensor provided for an exposure apparatus according to an eighth embodiment of the present invention.

FIG. 14 shows a schematic arrangement of the dose sensor provided for the exposure apparatus according to the eighth embodiment of the present invention. As shown in FIG. 14, the dose sensor 90 provided for the exposure apparatus of this embodiment is constructed to include a fluorescent plate 91 and a light-receiving element 92. The fluorescent plate 91 is provided in the opening 32 formed for the chassis 30 while allowing the upper surface to make coincidence. The fluorescent plate 91 is excited by the incoming exposure beam to emit the fluorescence or the phosphorescence having a wavelength different from that of the exposure beam. In other words, the fluorescent plate 91 effects the wavelength conversion, for example, into the light in the visible region for the exposure beam having the wavelength in the vacuum ultraviolet region. Those usable as the fluorescent plate 91 include, for example, a light-transmissive plate which contains an organic dye material and a light-transmissive plate which has the surface coated with an organic dye for absorbing the exposure beam to emit the fluorescence or the phosphorescence having the wavelength longer than that of the exposure beam. In this arrangement, the light-receiving element can be appropriately selected depending on the sensitivity of the fluorescence wavelength.

A waterproof countermeasure is applied with a seal member or the like between the fluorescent plate 91 and the chassis 30. The light-receiving element 92 has such a characteristic that the light, which is in the wavelength region (for example, visible region) different from the wavelength of the exposure beam, is received. The light-receiving element 92 is arranged at the position closely to the fluorescent plate 91, while an approximately central portion of the light-receiving surface 92a is positioned just under an approximately central portion or the center of the fluorescent plate 91 (in the direction). An AR coat for the light in the visible region including the fluorescence and the phosphorescence is applied to the light-receiving surface 92a of the light-receiving element 92.

When the light amount of the exposure beam radiated onto the exposure area is measured by using the dose sensor 90 of this embodiment, the measurement is performed in such a state that the illumination condition of the illumination optical system IS is set to the illumination condition to be established when the exposure process is performed for the wafer W, and the liquid LQ is supplied to the space between the projection optical system PL and the upper surface 33 of the chassis 30, in the same manner as in the sixth and seventh embodiments. The relationship between the amount of the light come into the fluorescent plate 91 and the amount of the light subjected to the wavelength conversion and outgone from the fluorescent plate 91 is previously determined before measuring the light amount of the exposure beam.

When the exposure beam comes into the projection optical system PL in the state in which the illumination condition of the illumination optical system IS is set to the illumination condition during the exposure, the exposure beam passes through the projection optical system PL without being totally reflected at the end portion of the projection optical system PL, and the exposure beam comes into the fluorescent plate 91 through the liquid LQ. When the exposure beam comes into the fluorescent plate 91, a part or all of the light amount thereof is absorbed by the fluorescent plate 91 to emit the fluorescence or the phosphorescence having the light amount corresponding to the absorbed light amount. The fluorescence or the phosphorescence has the wavelength which is different from the wavelength of the exposure beam, which outgoes from the fluorescent plate 91 in directions not depending on the incident angle of the exposure beam. After that, the fluorescence or the phosphorescence has come into the light-receiving surface 92a of the light-receiving element 92 and received.

As described above, also in this embodiment, the exposure beam, which comes into the liquid LQ from the projection optical system PL, does not pass through the gas until the exposure beam outgoes from the fluorescent plate 91. Therefore, even when the exposure beam having a large incident angle comes into the fluorescent plate 91, the exposure beam is not totally reflected. Further, even when the exposure beam having the large incident angle comes, the exposure beam is converted into the fluorescence or the phosphorescence having the different wavelength to outgo in the directions different from the incident angle as well. Therefore, the light beam is easily received by the light-receiving element 92. Further, it is possible to realize a small size of the dose sensor 90 in the same manner as in the sixth and seventh embodiments.

When all of the exposure beam come into the fluorescent plate 91 is not converted into the fluorescence or the phosphorescence having the different wavelength, a part of the exposure beam passes through the fluorescent plate 91 to come into the light-receiving element 92. As described above, the light-receiving characteristic of the light-receiving element 92 is such a characteristic that the light beam in the wavelength region different from that of the exposure beam is received. Therefore, no serious problem arises even when the exposure beam comes into the light-receiving element 92. However, when any measurement error arises, for example, due to the generation of heat on account of the fact that the exposure beam transmitted through the fluorescent plate 91 comes into the light-receiving element 92, it is preferable to provide, between the fluorescent plate 91 and the light-receiving element 92, a filter through which the light beam in the wavelength region including the fluorescence or the phosphorescence generated by the fluorescent plate 91 is transmitted and which blocks or shields the light beam in the wavelength region including the exposure beam.

Ninth Embodiment

Next, an exposure apparatus according to a ninth embodiment of the present invention will be explained. The entire structure of the exposure apparatus of this embodiment is constructed in approximately the same manner as the exposure apparatus shown in FIG. 1. However, the structure of the exposure beam sensor 27 differs. The exposure beam sensor 27 provided for the exposure apparatus of this embodiment performs the measuring operation through the liquid LQ on the image plane side of the projection optical system PL, in the same manner as in the second to fifth embodiments described above. An explanation will be made principally about an irradiation irregularity sensor provided for the exposure beam sensor 27. It is a matter of course that this embodiment is also applicable to the dose sensor described above and the spatial image-measuring unit as described later on.

Figure 15A:
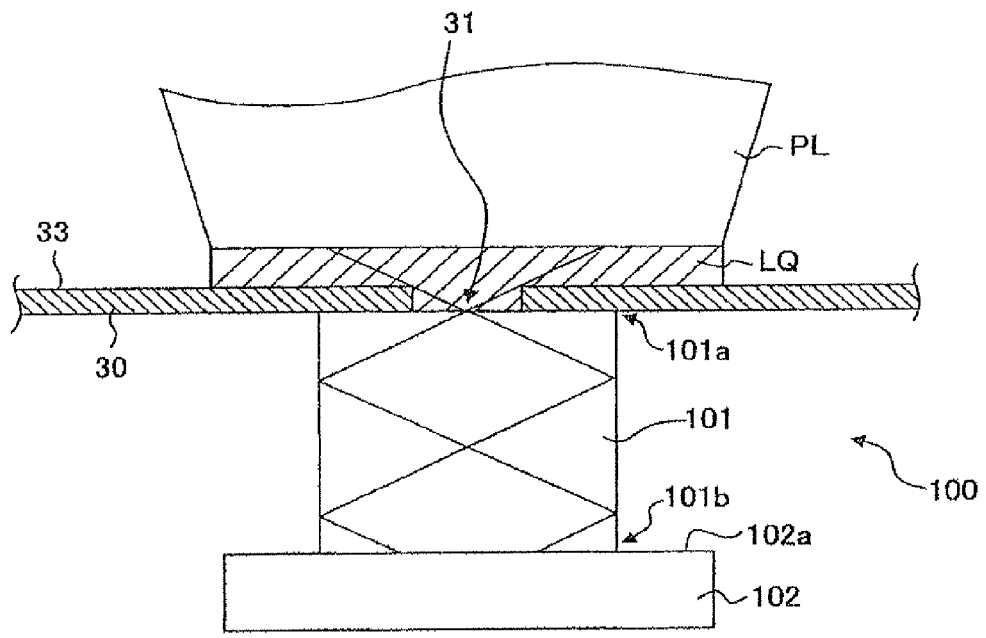
FIGS. 15A and 15B show a schematic arrangement of an irradiation irregularity sensor provided for an exposure apparatus according to a ninth embodiment of the present invention.

FIG. 15 shows a schematic arrangement of the irradiation irregularity sensor provided for the exposure apparatus according to the ninth embodiment of the present invention. As shown in FIG. 15A, the irradiation irregularity sensor 100 provided for the exposure apparatus of this embodiment is constructed to include a waveguide member 101 and a light-receiving element 102. The waveguide member 101 has a columnar shape having a diameter larger than the diameter of the pinhole 31 formed for the chassis 30 shown in FIG. 3. The waveguide member 101 is arranged in a state in which one end 101a abuts against the lower portion of the pinhole 31 (in the direction), while allowing the central axis to be approximately coincident with the central position of the pinhole 31.

The waveguide member 101 is composed of synthetic quartz or fluorite. The exposure beam, which comes from one end 101a into the inside, undergoes the waveguide while effecting the total reflection at the outer circumference (boundary between the air and the waveguide member) to allow the exposure beam to outgo from the other end 101b. Those usable as the waveguide member 101 include, for example, an optical fiber and a rod integrator as a type of optical integrator. A waterproof countermeasure is applied by a seal member or the like for the portion of the waveguide member 101 which abuts against the chassis 30. The light-receiving element 102 has such a characteristic that the light in the wavelength region including the exposure beam is received. The light-receiving element 102 is arranged in a state in which the light-receiving surface 102a abuts against the other end 101b of the waveguide member 101. An AR coat for the ArF laser beam is applied to the light-receiving surface 102a of the light-receiving element 102.

The reason, why the light-receiving surface 102a of the light-receiving element 102 is in contact with the other end 101b of the waveguide member 101, is that the exposure beam having a large outgoing angle, which has outgone from the other end 101b, has come into the light-receiving surface 102a of the light-receiving element 102 and received. In other words, the following reason is affirmed. That is, the exposure beams having various angles outgo from the other end 101b of the waveguide member 101. Therefore, all of the exposure beams, which have outgo while making expansion, cannot be allowed to come into the light-receiving surface 102a, and especially it is impossible to receive the exposure beam having the large outgoing angle in a state in which the other end 101b of the waveguide member 101 is separated from the light-receiving surface 102a of the light-receiving element 102.

When the light amount of the exposure beam radiated onto the exposure area is measured by using the irradiation irregularity sensor 100 of this embodiment, the measurement is performed in such a state that the illumination condition of the illumination optical system IS is set to the illumination condition to be established when the exposure process is performed for the wafer W, and the liquid LQ is supplied to the space between the projection optical system PL and the upper surface 33 of the chassis 30, in the same manner as in the sixth to eighth embodiments. When the exposure beam comes into the projection optical system PL in this state, then the exposure beam is not totally reflected at the end portion of the projection optical system PL, and the exposure beam passes through the projection optical system PL. The exposure beam comes into the waveguide member 101 from one end 101a through the liquid LQ and the pinhole 31. The exposure beam, which has come into the waveguide member 101, advances in the waveguide member 101 while being reflected by the outer circumference of the waveguide member 101. The exposure beam is received by the light-receiving element 102 arranged in the state of abutment against the other end 101b of the waveguide member 101.

As described above, in this embodiment, the exposure beam, which comes into the liquid LQ from the projection optical system PL and which passes through the pinhole 31, comes into the waveguide member 101 without passing through the gas. Therefore, it is possible to receive a greater part of the exposure beam radiated onto the exposure area including the exposure beam having the large incident angle. The foregoing explanation has been made about the case in which the exposure beam is subjected to the waveguide while effecting the total reflection at the outer circumference by utilizing the difference in the refractive index between the waveguide member 101 and the air. However, when the incident angle of the exposure beam with respect to the outer circumference is small, the exposure beam sometimes outgo from the outer circumference to the outside. Therefore, it is desirable that a metal such as Cr (chromium) is vapor-deposited on the outer circumference of the waveguide member 101.

Figure 15B:
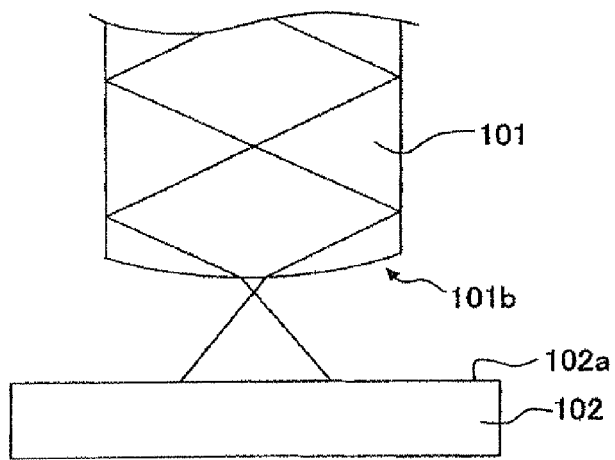

In view of the structure of the irradiation irregularity sensor 100, it is also assumed that the waveguide member 101 and the light-receiving member 102 are inevitably arranged separately. In such a situation, as shown in FIG. 15B, it is desirable that the shape of the other end 101b is a curved shape (lens shape) to maximally decrease the outgoing angle of the exposure beam allowed to advance in the waveguide member 101. Further, the foregoing embodiment has been explained about the columnar waveguide member 101. However, those usable for the shape thereof include quadratic prism shapes and other shapes.

Tenth Embodiment

Next, an exposure apparatus according to a tenth embodiment of the present invention will be explained. The entire structure of the exposure apparatus of this embodiment is constructed in approximately the same manner as the exposure apparatus shown in FIG. 1. However, the structure of the exposure beam sensor 27 differs. The exposure beam sensor 27 provided for the exposure apparatus of this embodiment performs the measuring operation through the liquid LQ on the image plane side of the projection optical system PL, in the same manner as in the second to fifth embodiments described above. An explanation will be made principally about an irradiation irregularity sensor provided for the exposure beam sensor 27.

Figure 16:
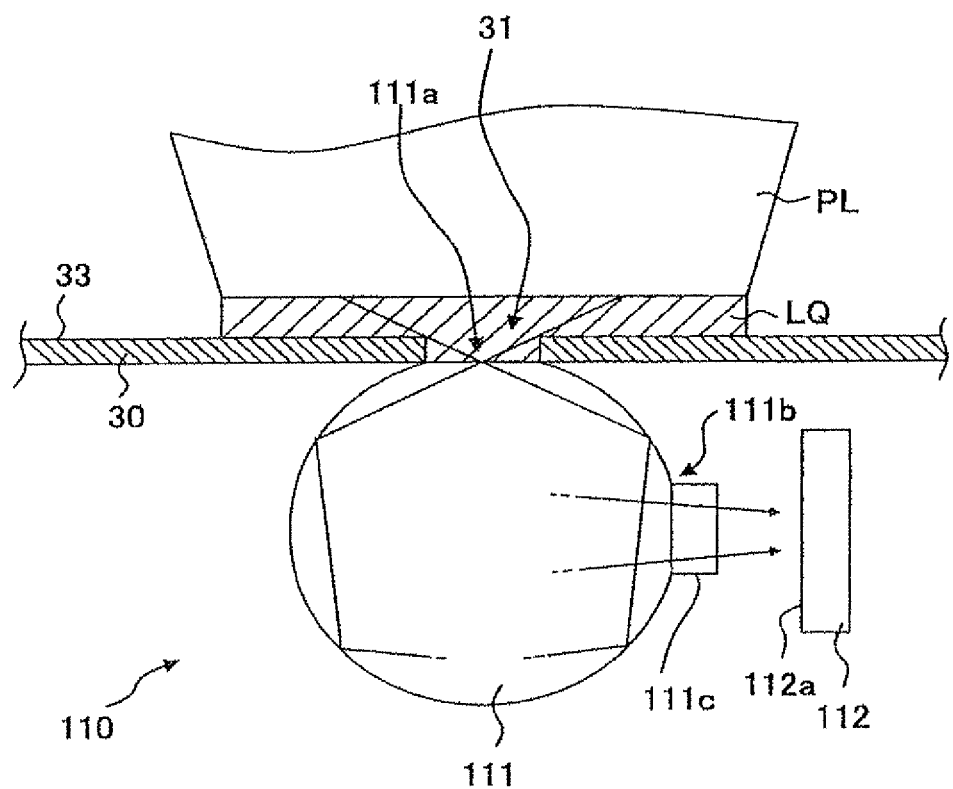
FIG. 16 shows a schematic arrangement of an irradiation irregularity sensor provided for an exposure apparatus according to a tenth embodiment of the present invention.

FIG. 16 shows a schematic arrangement of the irradiation irregularity sensor provided for the exposure apparatus according to the tenth embodiment of the present invention. As shown in FIG. 16, the irradiation irregularity sensor 110 provided for the exposure apparatus of this embodiment is constructed to include an integrating sphere 111 as a type of optical integrator and a light-receiving element 112. The integrating sphere 111 is composed of synthetic quartz or fluorite. Parts of the integrating sphere 111 are cut out to be flat to form an incoming section 111a and an outgoing section 111b.

The incoming section 111a has a diameter which is set to be larger than the diameter of the pinhole 31 formed for the chassis 30 shown in FIG. 3. The integrating sphere 111 is arranged under the pinhole 31 (in the −Z direction) in a state in which the central position of the incoming section 111a is approximately coincident with the central position of the pinhole 31, and the circumference of the pinhole 31 is in contact with the outer circumference of the incoming section 111a. A waterproof countermeasure is applied with a seal member or the like for the portion at which the incoming section 111a abuts against the chassis 30.

The outgoing section 111b is formed to have the diameter of a predetermined size at a predetermined position with respect to the incoming section 111a. The position, at which the outgoing section 111b is formed, is, for example, a position of crossing at the right angle between a straight line which passes through the center of the incoming section 111a and which is perpendicular to the incoming section 111a and a straight line which passes through the center of the outgoing section 111b and which is perpendicular to the outgoing section 111b. In the example shown in FIG. 16, the outgoing section 111b is provided with a guide section 111c for reflecting the exposure beam having a large outgoing angle to introduce the exposure beam into the light-receiving element 112.

The light-receiving element 112 has such a characteristic that the light in the wavelength region including the exposure beam is received. The light-receiving element 112 is arranged in a state in which the light-receiving surface 112a is directed toward the outgoing section 111b. An AR coat for the ArF laser beam is applied to the light-receiving surface 112a of the light-receiving element 112. In this case, an explanation will be made about the arrangement in which the guide section 111c is provided for the outgoing section 111b of the integrating sphere 111 to arrange the integrating sphere 111 and the light-receiving element 112 separately. However, another arrangement is also available, in which the guide section 111c is omitted, and the light-receiving surface 112a of the light-receiving element 112 is in contact with the outgoing section 111b of the integrating sphere 111.

When the light amount of the exposure beam radiated onto the exposure area is measured by using the irradiation irregularity sensor 110 of this embodiment, the measurement is performed in such a state that the illumination condition of the illumination optical system IS is set to the illumination condition to be established when the exposure process is performed for the wafer W, and the liquid LQ is supplied to the space between the projection optical system PL and the upper surface 33 of the chassis 30, in the same manner as in the sixth to ninth embodiments. When the exposure beam comes into the projection optical system PL in this state, then the exposure beam is not totally reflected at the end portion of the projection optical system PL, and the exposure beam passes through the projection optical system PL. The exposure beam comes into the integrating sphere ill from the light-incoming end 111a through the liquid LQ and the pinhole 31 without passing through the gas. The exposure beam, which has come into the integrating sphere 111, is multiply reflected by the outer circumference of the integrating sphere 111. Finally, the exposure beam outgoes from the light-outgoing end 111b. The light beam, which is included in the exposure beam outgone from the light-outgoing end 111b and which has a small outgoing angle, directly comes into the light-receiving surface 112a. The light beam, which has a large outgoing angle, is reflected by the guide section 111c, and then the light beam is allowed to come into the light-receiving surface 112 and received.

As described above, also in this embodiment, the exposure beam, which comes into the liquid LQ from the projection optical system PL and which passes through the pinhole 31, comes into the integrating sphere 111 without passing through the gas. Therefore, even when the exposure beam having a large incident angle comes into the light-incoming end 111a, then the exposure beam is not totally reflected, and the exposure beam can be finally received by the light-receiving element 112. It is desirable that a metal such as Cr (chromium) is vapor-deposited on the entire integrating sphere 111 except for the incoming section 111a and the outgoing section 111b, in the same manner as in the ninth embodiment described above.

Other Embodiments

The second to fifth embodiments have been explained as exemplified by the case in which one plano-convex lens 41, 45, 52, 57, 62, 71 is provided as the light-collecting member for collecting the exposure beam. The sixth to tenth embodiments have been explained about the arrangement in which the light-collecting plate 81, the diffusion plate 86, the fluorescent plate 91, the waveguide member 101, or the integrating sphere 111 is included as the optical system for allowing the exposure beam to come into the light-receiving element. However, it is desirable to adopt an arrangement in which a plurality of lenses are provided between the plano-convex lens 41, 45, 52, 57, 62, 71 and the light-receiving element as well as between the light-collecting plate 81, the diffusion plate 86, the fluorescent plate 91, the waveguide member 101, or the integrating sphere 111 and the light-receiving element to introduce the exposure beam or the like into the light-receiving element.

Figure 17:
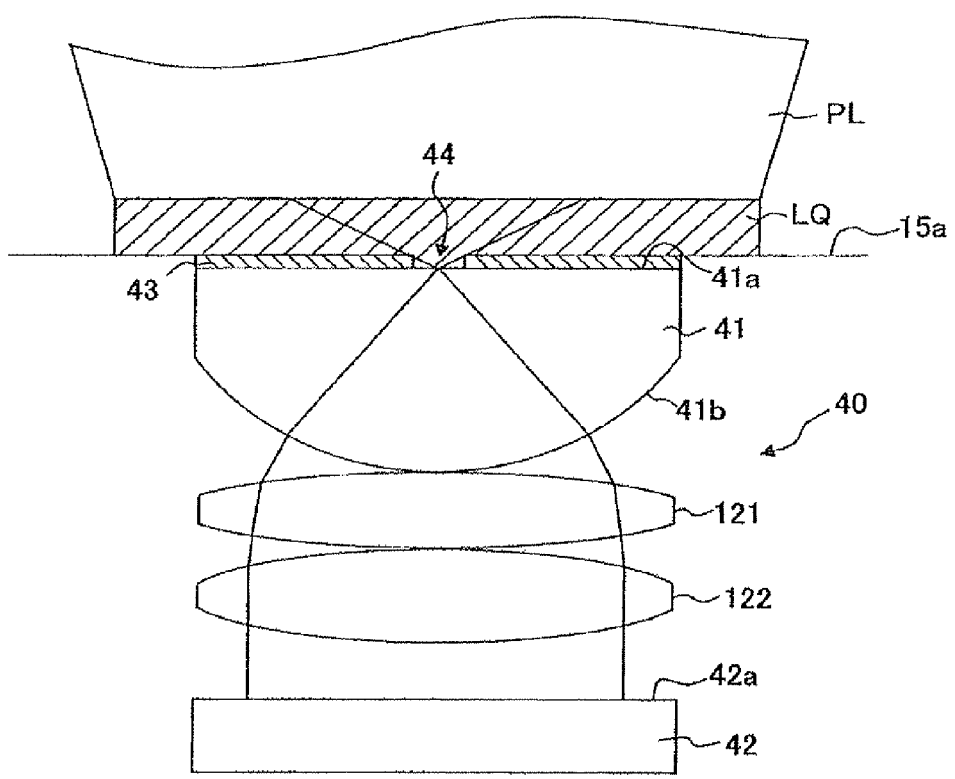
FIG. 17 shows a modified embodiment of the irradiation irregularity sensor 40 provided for the exposure apparatus according to the second embodiment.

FIG. 17 shows a modified embodiment of the irradiation irregularity sensor 40 provided for the exposure apparatus according to the second embodiment. In the example shown in FIG. 17, two lenses 121, 122 are provided between the plano-convex lens 41 and the light-receiving element 42 in order that the exposure beam from the plano-convex lens 41, especially the exposure beam having the large incident angle is converted into the parallel light beam more easily. The exposure beam, which is converted into the parallel light beam by providing the lenses 121, 122 between the plano-convex lens 41 and the light-receiving element 42, is introduced into the light-receiving element 42. The lenses as described above can be also used for the third to tenth embodiments. The number of the lens or lenses may be arbitrary.

The second to tenth embodiments have been explained as exemplified by the case in which the illumination condition of the illumination optical system IS is set to the illumination condition to be established when the exposure process is performed for the wafer W, and the uneven illuminance is measured in the state in which the liquid LQ is supplied to the image plane side of the projection optical system PL. However, also in these embodiments, the angular aperture of the exposure beam can be adjusted to measure, for example, the unevenness and the light amount by adjusting the light flux distribution of the exposure beam at the outgoing plane CJ by arranging the aperture diaphragm 8e having the minute σ value at the outgoing plane CJ of the second fly's eye lens 7 in the state in which the liquid LQ is not supplied to the image plane side of the projection optical system PL, in the same manner as in the first embodiment.

In the exposure apparatus shown in FIG. 1, the irradiation irregularity sensor and the dose sensor are provided in one chassis 30. However, the irradiation irregularity sensor and the dose sensor may be separately on the wafer stage 15. When the surface (upper surface) of the exposure beam sensor 27 to make contact with the liquid is water-repellent in order to recover the liquid LQ with ease, it is feared that the water repellence may be deteriorated by the radiation of the exposure beam (ultraviolet radiation). Therefore, when the measurement is performed by using the sensor having the water-repellent surface to make contact with the liquid LQ, an energy (light amount) adjuster provided with a plurality of ND filters, which is disclosed, for example, in Japanese Patent Application Laid-open No. 2001-144044 (corresponding to U.S. Pat. No. 6,730,925), may be appropriately used to attenuate the light amount of the exposure beam to not more than 50% and desirably not more than 20% of the maximum light amount.

In the embodiments described above, the explanation has been made about the irradiation irregularity sensor for measuring the uneven illuminance and the totalized uneven light amount and the dose sensor for measuring the light amount (radiation amount) of the exposure beam radiated onto the image plane side of the projection optical system PL. However, the present invention is also applicable, for example, to a sensor which measures the wavefront aberration as disclosed in U.S. Pat. No. 6,650,399, a spatial image-measuring sensor which measures, for example, the imaging characteristic as disclosed in Japanese Patent Application Laid-open No. 2002-14005 (corresponding to United State Patent Publication No. 2002/0041377), and a sensor which is detachable with respect to a substrate stage as disclosed in Japanese Patent Application Laid-open No. 11-238680 and International Publication No. 02/063664 (corresponding to United State Patent Publication No. 2004/0090606). Even when the numerical aperture of the projection optical system is large, the exposure beam, which has passed through the projection optical system, can be received. It is possible to execute various types of measurements at desired accuracies. The disclosures of the patent documents are incorporated herein by reference within a range of permission of the domestic laws and ordinances of the state designated or selected in this international application.

Eleventh Embodiment

Figure 20:
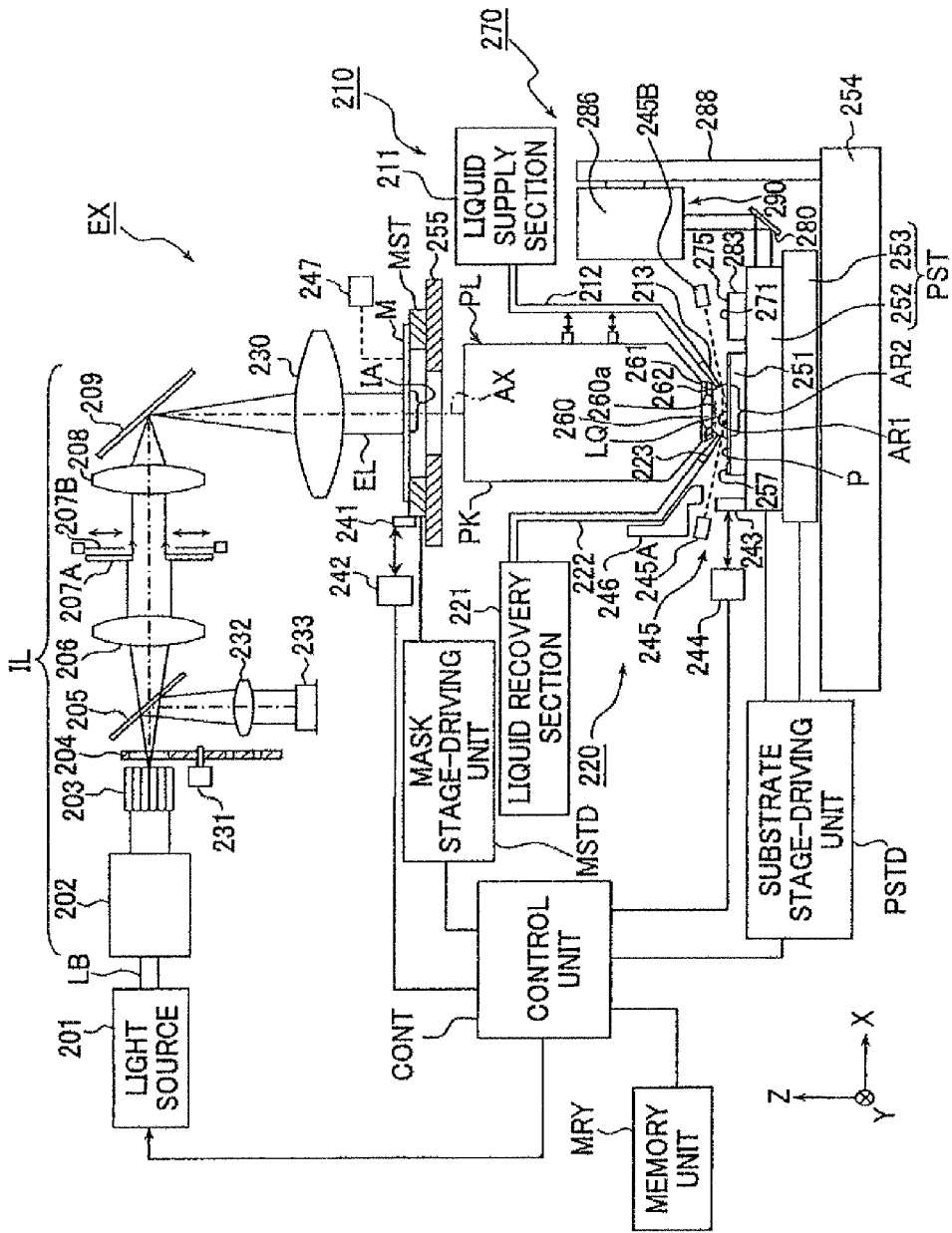
FIG. 20 shows a schematic arrangement illustrating an embodiment of an exposure apparatus according to the present invention.

An exposure apparatus according to an eleventh embodiment of the present invention will be explained below with reference to the drawings. FIG. 20 shows a schematic arrangement illustrating an embodiment of the exposure apparatus of the present invention.

With reference to FIG. 20, the exposure apparatus EX comprises a mask stage MST which supports the mask M, a substrate stage PST which supports the substrate P, an illumination optical system IL which illuminates, with the exposure beam EL, the mask M supported by the mask stage MST, a projection optical system PL which projects an image of the pattern of the mask M illuminated with the exposure beam EL onto the substrate P supported by the substrate stage PST to perform the exposure, a control unit CONT which integrally controls the overall operation of the exposure apparatus EX, and a memory unit MRY which is connected to the control unit CONT and which stores various types of information in relation to the exposure process. The exposure apparatus EX further comprises a spatial image-measuring unit 270 which is used to measure the imaging characteristic (optical characteristic) of the projection optical system PL. The spatial image-measuring unit 270 is provided with a light receiver 290 which receives the light beam (exposure beam EL) which has passed through the projection optical system PL via a slit plate 275 having a slit section 271 arranged on the image plane side of the projection optical system PL.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX comprises a liquid supply mechanism 210 which supplies the liquid LQ onto the substrate P, and a liquid recovery mechanism 220 which recovers the liquid LQ from the substrate P. The exposure apparatus EX forms a liquid immersion area AR2 (locally) on a part of the substrate P including a projection area AR1 of the projection optical system PL by the liquid LQ supplied from the liquid supply mechanism 210 at least during the period in which the image of the pattern of the mask M is transferred onto the substrate P. Specifically, the exposure apparatus EX is operated as follows. That is, the space between the surface of the substrate P and the optical element 260 on the side of the end portion (image plane side) of the projection optical system PL is filled with the liquid LQ. The image of the pattern of the mask M is projected onto the substrate P to expose the substrate P therewith by irradiating the exposure beam EL via the projection optical system PL and the liquid LQ disposed between the projection optical system PL and the substrate P.

This embodiment will be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction resides in the direction which is coincident with the optical axis AX of the projection optical system PL, the X axis direction resides in the synchronous movement direction (scanning direction) for the mask M and the substrate P in the plane perpendicular to the Z axis direction, and the Y axis direction resides in the direction (non-scanning direction) perpendicular to the Z axis direction and the X axis direction. The directions of rotation (inclination) about the X axis, the Y axis, and the Z axis are designated as θX, θY, and θZ directions respectively. The term "substrate" referred to herein includes those obtained by coating a semiconductor wafer surface with a photoresist as a photosensitive material, and the term "mask" includes a reticle formed with a device pattern to be subjected to the reduction projection onto the substrate.

The illumination optical system IL converts the light flux (laser beam) LB radiated from a light source 201 into the exposure beam EL to illuminate, with the exposure beam EL, the mask M supported by the mask stage MST. Those usable as the exposure beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (UV light beams) such as the ArF excimer laser beam (wavelength: 193 nm) and the $F_2$ laser beam (wavelength: 157 nm). In this embodiment, the ArF excimer laser beam is used.

In this embodiment, pure water is used for the liquid LQ. Those capable of being transmitted through pure water include the ArF excimer laser beam as well as the emission line (g-ray, h-ray, i-ray) in the ultraviolet region radiated, for example, from a mercury lamp and the far ultraviolet light beam (DUV light beam) such as the KrF excimer laser beam (wavelength: 248 nm).

In this embodiment, the light source 201 is an excimer laser light source for irradiating the ArF excimer laser beam (wavelength: 193 nm). The control unit CONT controls, for example, the switching ON/OFF of the laser beam emission, the central wavelength, the spectrum half value width, and the repeating frequency.

The illumination optical system IL includes, for example, a beam-shaping optical system 202, an optical integrator 203, an illumination system aperture diaphragm plate 204, a relay optical system 206, 208, a fixed mask blind 207A, a movable mask blind 207B, a mirror 209, and a condenser lens 230. In this embodiment, a fly's eye lens is used as the optical integrator 203. However, it is also allowable to use, for example, a rod type (internal reflection type) integrator or a diffraction optical element. For example, a cylindrical lens or a beam expander is included in the beam-shaping optical system 202 in order that the cross-sectional shape of the laser beam LB pulse-emitted by the light source 201 is shaped so that the laser beam LB efficiently comes into the optical integrator 203 provided on the downstream side of the optical path for the laser beam LB. The optical integrator (fly's eye lens) 203 is arranged on the optical path for the laser beam LB radiated from the beam-shaping optical system 202 to form a surface light source composed of a large number of point light sources (light source images), i.e., a secondary light source in order to illuminate the mask M with a uniform illuminance distribution.

The illumination system aperture diaphragm plate 204, which is composed of a disk-shaped member, is arranged in the vicinity of the outgoing side focal plane of the optical integrator 203. Those arranged at approximately equal angular intervals in the illumination system aperture diaphragm plate 204 include, for example, an aperture diaphragm (ordinary diaphragm) composed of an ordinary circular aperture, an aperture diaphragm (small σ diaphragm) composed of a small circular aperture to decrease the σ value as the coherence factor, an aperture diaphragm (zonal diaphragm) for the zonal illumination, and a modified aperture diaphragm composed of a plurality of apertures arranged eccentrically for the modified light source method (four-spot illumination diaphragm referred to as "SHRINC" as well). The illumination system aperture diaphragm plate 204 is rotated by a driving unit 231 such as a motor controlled by the control unit CONT. Accordingly, any one of the aperture diaphragms is selectively arranged on the optical path for the exposure beam EL.

In this embodiment, the illumination system aperture diaphragm plate 204 is used to adjust the light intensity distribution on the pupil plane of the illumination optical system IL. However, it is also allowable to use another optical system as disclosed in U.S. Pat. No. 6,563,567. The disclosure thereof is incorporated herein by reference within a range of permission of the domestic laws and ordinances of the state designated or selected in this international application.

A beam splitter 205, which has a small reflectance and a large transmittance, is arranged on the optical path for the exposure beam EL which has passed through the illumination system aperture diaphragm plate 204. Further, the relay optical system (206, 208) is arranged on the optical path downstream therefrom with the mask blinds 207A, 207B intervening therebetween. The fixed mask blind 207A is arranged on the plane slightly defocused from the conjugate plane with respect to the pattern surface of the mask M, for which a rectangular aperture is formed to define the illumination area IA on the mask M. The movable mask blind 207B, which has an aperture with the variable width and the variable position in the directions corresponding to the scanning direction (X axis direction) and the non-scanning direction (Y axis direction) perpendicular thereto respectively, is arranged in the vicinity of the fixed mask blind 207A. The illumination area IA is restricted by the aid of the variable mask blind 207B upon the start and the completion of the scanning exposure. Thus, the exposure for any unnecessary portion is avoided. In this embodiment, the movable mask blind 207B is also used to set the illumination area when the spatial image is measured as described later on. On the other hand, a light-collecting lens 232, and an integrator sensor 233 composed of a light-receiving element such as a PIN type photodiode having satisfactory sensitivity in the far ultraviolet region and having a high response frequency in order to detect the pulse light emission of the light source 201 are arranged on the optical path for the exposure beam EL reflected by the beam splitter 205 included in the illumination optical system IL.

The function of the illumination optical system IL constructed as described above will be briefly explained. The laser beam LB, which is pulse-emitted from the light source 201, comes into the beam-shaping optical system 202, and the cross-sectional shape thereof is shaped herein to efficiently come into the optical integrator 203 on the downstream side. After that, the laser beam LB comes into the optical integrator 203. Accordingly, the secondary light source is formed on the outgoing side focal plane of the optical integrator 203 (pupil plane of the illumination optical system IL). The exposure beam EL, which outgoes from the secondary light source, passes through any one of the aperture diaphragms on the illumination system aperture diaphragm plate 204, and then the exposure beam EL comes into the beam splitter 205 having the large transmittance and the small reflectance. The exposure beam EL, which is transmitted through the beam splitter 205, passes through the first relay lens 206, and the exposure beam EL passes through the rectangular aperture of the fixed mask blind 207A and the movable mask blind 207B. After that, the exposure beam EL passes through the second relay lens 208, and the optical path is bent vertically downwardly by the mirror 209. The exposure beam EL, for which the optical path has been bent by the mirror 209, passes through the condenser lens 203 to illuminate, with the uniform illuminance distribution, the illumination area IA on the mask M retained by the mask stage MST.

On the other hand, the exposure beam EL, which is reflected by the beam splitter 205, is received by the integrator sensor 233 via the light-collecting lens 232. The photoelectric conversion signal of the integrator sensor 233 is supplied to the control unit via a signal processing unit having an A/D converter and an unillustrated peak hold circuit. In this embodiment, the measured value of the integrator sensor 233 is used to control the exposure amount, and the measured value is also used to calculate the radiation amount for the projection optical system PL. The radiation amount is used to calculate the amount of change of the imaging characteristic caused by the absorption of the illumination light beam by the projection optical system PL together with the substrate reflectance (this value can be also determined on the basis of the output of the integrator sensor and the output of an unillustrated reflectance monitor). In this embodiment, the radiation amount is calculated at predetermined intervals by the control unit CONT on the basis of the output of the integrator sensor 233. The result of the calculation is stored as the radiation hysteresis in the memory unit MRY.

The mask stage MST is movable while retaining the mask M. The mask M is fixed, for example, by the vacuum attraction (or the electrostatic attraction). The mask stage MST is supported in a non-contact manner over a mask base 255 by the aid of a gas bearing (air bearing) as a non-contact bearing. The mask stage MST is two dimensionally movable in the plane perpendicular to the optical axis AX of the projection optical system PL, i.e., in the XY plane and finely rotatable in the θZ direction by the mask stage-driving unit MSTD including a linear motor or the like. The mask stage MST is movable over the mask base 255 at a designated scanning velocity in the X axis direction. The mask stage MST has the movement stroke of such an extent that the entire surface of the mask M can traverse at least the optical axis AX of the projection optical system PL.

A movement mirror 241 is provided on the mask stage MST. A laser interferometer 242 is provided at the position opposed to the movement mirror 241. The position in the two-dimensional direction and the angle of rotation in the θZ direction (sometimes including the angles of rotation in the θX direction and in the θY direction as well) of the mask M on the mask stage MST are measured in real time by the laser interferometer 242. The measurement result is outputted to the control unit CONT. The control unit CONT controls the position of the mask M supported by the mask stage MST by driving the mask stage-driving unit MSTD on the basis of the measurement result of the laser interferometer 242.

The projection optical system PL projects the pattern of the mask M onto the substrate P at a predetermined projection magnification β. The projection optical system PL comprises a plurality of optical elements including an optical element (lens) 260 provided at the end portion on the side of the substrate P. The optical elements are supported by a barrel PK. In this embodiment, the projection optical system PL resides in the reducing system in which the projection magnification β is, for example, ¼ or ⅕. The projection optical system PL may be based on any one of the 1× magnification system and the magnifying system. The projection optical system PL may be based on any one of the dioptric system, the catoptric system, and the cata-dioptric system.

The optical element 260, which is disposed at the end portion of the projection optical system PL of this embodiment, is retained by a lens cell 262. The lens cell 262, which retains the optical element 260, is connected by a connecting mechanism 261 to the end portion of the barrel PK. The liquid LQ in the liquid immersion area AR2 makes contact with the optical element 260. The optical element 260 is formed of fluorite. The fluorite has a high affinity for water. Therefore, the liquid LQ can be in tight contact with the substantially entire surface of the liquid contact surface 260a of the optical element 260. That is, in this embodiment, the liquid (water) LQ is supplied, which has the high affinity for the liquid contact surface 260a of the optical element 260. Therefore, the tight contact performance is enhanced between the liquid LQ and the liquid contact surface 260a of the optical element 260. It is possible to reliably fill the optical path between the optical element 260 and the substrate P with the liquid LQ. The optical element 260 may be made of quartz which has a high affinity for water. Alternatively, a water-attracting (lyophilic or liquid-affinitive) treatment may be performed to the liquid contact surface 260a of the optical element 260 to further enhance the affinity for the liquid LQ.

The substrate stage PST is movable while retaining the substrate P. The substrate stage PST is constructed to include an XY stage 253 and a Z tilt stage 252 which is provided on the XY stage 253. The XY stage 253 is supported in a non-contact manner by the aid of a gas bearing (air bearing) as an unillustrated non-contact bearing over the upper surface of a stage base 254. The XY stage 253 is two dimensionally movable in the plane perpendicular to the optical axis AX of the projection optical system PL, i.e., in the XY plane and finely rotatable in the θZ direction by the substrate stage-driving unit PSTD including a linear motor or the like. The Z tilt stage is provided on the XY stage 253. A substrate holder 251 is provided on the Z tilt stage 252. The substrate P is retained, for example, by the vacuum attraction by the substrate holder 251. The Z tilt stage 252 is provided movably in the Z axis direction, the θX direction, and the θY direction as well by an actuator as described later on. The substrate stage-driving unit PSTD, which includes the actuator, is controlled by the control unit CONT. The substrate stage PST controls the focus position (Z position) and the angle of inclination of the substrate P so that the surface of the substrate P is adjusted to match the image plane of the projection optical system PL in the auto-focus manner and the auto-leveling manner. Further, the substrate stage PST positions the substrate P in the X axis direction and the Y axis direction.

An auxiliary plate 257 is provided on the substrate stage PST (substrate holder 251) so that the substrate P is surrounded thereby. The auxiliary plate 257 has a flat surface having approximately the same height as that of the surface of the substrate P retained by the substrate holder 251. Even when the edge area of the substrate P is subjected to the exposure, the liquid LQ can be retained under the projection optical system PL owing to the auxiliary plate 257.

The auxiliary plate 257 is formed only around the substrate holder 251. However, the auxiliary plate 257 can be also arranged around the spatial image-measuring unit 270 and between the substrate holder 251 and the spatial image-measuring unit 270 so that the upper surface of the substrate stage PST is substantially flush. Accordingly, even when the upper surface of the spatial image-measuring unit 270 is smaller than the liquid immersion area AR2, the liquid LQ can be retained under the projection optical system PL owing to the auxiliary plate 257.

A movement mirror 243 is provided on the substrate stage PST (Z tilt stage 252). A laser interferometer 244 is provided at the position opposed to the movement mirror 243. The two-dimensional direction and the angle of rotation of the substrate P on the substrate stage PST are measured in real time by the laser interferometer 244. The measurement result is outputted to the control unit CONT. The control unit CONT positions the substrate P supported by the substrate stage PST by driving the substrate stage-driving unit PSTD including, for example, the linear motor on the basis of the measurement result of the laser interferometer 244.

The exposure apparatus EX further comprises a focus-detecting system 245 which detects the position of the surface of the substrate P supported by the substrate stage PST (substrate holder 251). The focus-detecting system 245 includes a light-emitting section 245A which emits the detecting light flux in an oblique direction through the liquid LQ onto the substrate P, and a light receiver 245B which receives the reflected light beam of the detecting light flux reflected by the substrate P. The light-receiving result of the focus-detecting system 245 (light receiver 245B) is outputted to the control unit CONT. The control unit CONT can detect the position information in the Z axis direction about the surface of the substrate P on the basis of the detection result of the focus-detecting system 245. The information about the inclination of the substrate P in the θX and θY directions can be detected by emitting a plurality of detecting light fluxes from the light-emitting section 245A. The structure usable for the focus-detecting system 245 is disclosed, for example, in Japanese Patent Application Laid-open No. 6-283403 (corresponding to U.S. Pat. No. 5,448,332). The disclosure thereof is incorporated herein by reference within a range of permission of the domestic laws and ordinances of the state designated or selected in this international application. Another system is also usable as the focus-detecting system 245, in which the detecting light flux is emitted onto the surface of the substrate P without passing through the liquid LQ outside the liquid immersion area AR2 to receive the reflected light beam thereof.

The control unit CONT controls the movement in the Z axis direction and the two-dimensional inclination (rotation in the θX and θY directions) of the Z tilt stage 252 by the aid of the substrate stage-driving unit PSTD including Z position-driving sections 256A to 256C (see, for example, FIG. 21) as described later on so that the focal deviation is zero on the basis of the focal deviation signal (defocus signal), for example, the S-curve signal supplied from the light receiver 245B, for example, during the scanning exposure. That is, the control unit CONT executes the autofocus and the autoleveling to substantially match the imaging plane of the projection optical system PL and the surface of the substrate P by controlling the movement of the Z tilt stage 252 by using the multiple-point focus-detecting system 245.

A substrate alignment system 246 based on the off-axis system, which detects an alignment mark formed on the substrate P or a reference mark formed on an unillustrated reference member provided on the substrate stage PST, is provided in the vicinity of the end portion of the projection optical system PL. A mask alignment system 247, which detects the reference mark provided on the reference member via the mask M and the projection optical system PL, is provided in the vicinity of the mask stage MST. In this embodiment, an alignment sensor based on the image processing system, i.e., the so-called FIA (Field Image Alignment) system is used as the alignment system. A system disclosed, for example, in Japanese Patent Application Laid-open No. 4-65603 (corresponding to U.S. Pat. No. 5,493,403) can be used for the substrate alignment system 246. A system disclosed, for example, in Japanese Patent Application Laid-open No. 7-176468 (corresponding to U.S. Pat. No. 5,646,313) can be used for the mask alignment system 247.

Figure 21:
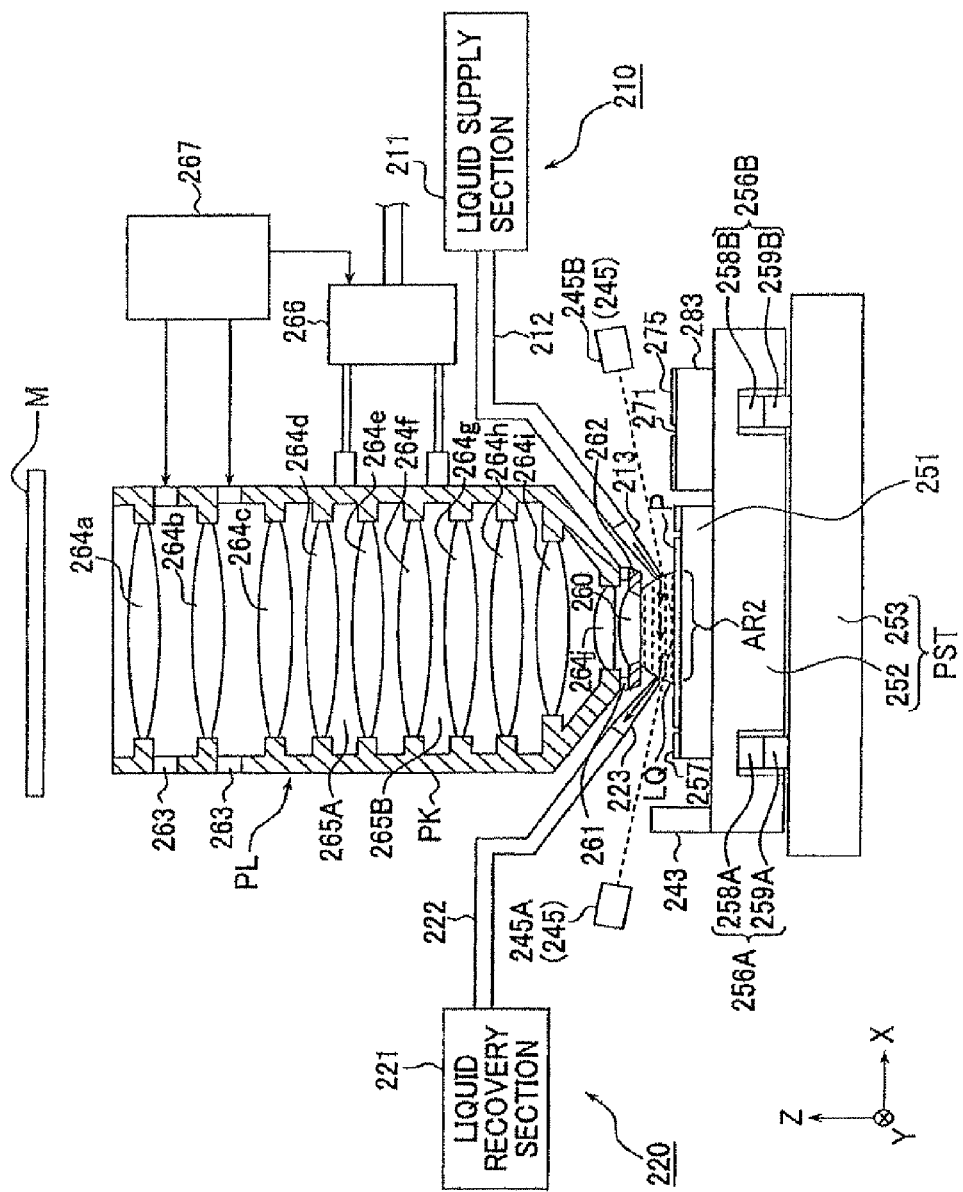
FIG. 21 shows a schematic arrangement illustrating those disposed in the vicinity of an end portion of a projection optical system, a liquid supply mechanism, and a liquid recovery mechanism.

FIG. 21 shows a magnified view illustrating the liquid supply mechanism 210, the liquid recovery mechanism 220, and the projection optical system PL. The projection optical system PL comprises a plurality of (ten in this embodiment) optical elements 264a to 264j retained by the barrel PK, and the optical element 260 retained by the lens cell 262 on the image plane side of the projection optical system PL (on the side of the substrate P). Parts of the optical elements 264a to 264j for constructing the projection optical system PL, for example, the optical elements 264a, 264b are constructed to be finely drivable in the direction of the optical axis AX and in the direction of inclination with respect to the XY plane by a plurality of driving elements (for example, piezoelectric elements) 263 respectively. First and second tightly closed chambers 265A, 265B, which are in a tightly closed state respectively, are formed between the optical elements 264d, 264e and between the optical elements 264f, 264g. A clean gas, for example, dry air is supplied to the first and second tightly closed chambers 265A, 265B via a pressure-adjusting mechanism 266 from an unillustrated gas supply mechanism.

In this embodiment, the pressure-adjusting mechanism 266, which adjusts the driving voltage applied to each of the driving elements 263 (driving amount of the driving element) and the gas pressure (internal pressure) in each of the first and second tightly closed chambers 265A, 265B, is controlled by an imaging characteristic control unit 267 in response to the instruction from the control unit CONT. Accordingly, the imaging characteristic including, for example, the field curvature, the distortion, and the magnification of the projection optical system PL is corrected. The imaging characteristic-adjusting mechanism, which adjusts the imaging characteristic as described above, may be constructed by only the movable optical element such as the optical element 264a. The number of the movable optical element or optical elements is arbitrary as well. However, in this arrangement, the number of the movable optical elements corresponds to the correctable types of the imaging characteristics of the projection optical system PL except for the focus. Therefore, the number of the movable optical elements may be determined depending on the types of the imaging characteristics for which any correction is required.

The Z tilt stage 252 is supported at three points on the XY stage 253 by three Z position-driving sections 256A, 256B, 256C (although the Z position-driving section 256C on the back side of the paper surface is not shown). The Z position-driving sections 256A to 256C are constructed to include three actuators (for example, voice coil motors) 259A, 259B, 259C (although the actuator 259C on the back side of the paper surface in FIG. 21 is not shown) which independently drive the respective support points on the lower surface of the Z tilt stage 252 in the direction of the optical axis of the projection optical system PL (in the Z direction), and encoders 258A, 258B, 258C (although the encoder 258C on the back side of the paper surface in FIG. 21 is not shown) which detect the driving amounts in the Z axis direction (displacement from the reference position) provided by the Z position-driving sections 256A, 256B, 256C of the Z tilt stage 252. A linear encoder, which is based on, for example, the optical system or the capacitance system, is used for each of the encoders 258A to 258C. In this embodiment, the driving unit, which drives the Z tilt stage 252 in the direction of the optical axis AX (in the Z axis direction) and the directions of inclination with respect to the surface (XY surface) perpendicular to the optical axis, i.e., the θX and θY directions, is constructed by the actuators 256A, 256B, 256C. The driving amounts in the Z axis direction of the respective support points (displacement amounts from the reference point), which are provided by the Z position-driving sections 256A, 256B, 256C of the Z tilt stage 252 and measured by the encoders 258A to 258C, are outputted to the control unit CONT. The control unit CONT determines the position in the Z axis direction and the leveling amount (θX rotation amount, θY rotation amount) of the Z tilt stage 252 on the basis of the measurement results of the encoders 258A to 258C.

The liquid supply mechanism 210 supplies the liquid LQ to the space between the projection optical system PL and the substrate P during the predetermined period including the period in which the exposure process is performed. The liquid supply mechanism 210 comprises a liquid supply section 211 which is capable of feeding the liquid LQ, and supply nozzles 213 which are connected to the liquid supply section 211 via a supply tube 212 and which supply, onto the substrate P, the liquid LQ fed from the liquid supply section 211. The supply nozzles 213 are arranged closely to the surface of the substrate P. The liquid supply section 211 includes, for example, a tank for accommodating the liquid LQ, and a pressurizing pump. The liquid supply section 211 supplies the liquid LQ onto the substrate P via the supply tube 212 and the supply nozzles 213. The operation of the liquid supply section 211 for supplying the liquid is controlled by the control unit CONT. The control unit CONT is capable of controlling the liquid supply amount per unit time to be supplied onto the substrate P by the liquid supply section 211. It is not necessarily indispensable that the exposure apparatus EX is provided with the tank, the pressurizing pump, and other components of the liquid supply mechanism 210. At least a part thereof can be replaced with the equipment of the factory or the like in which the exposure apparatus EX is installed.

The liquid recovery mechanism 220 recovers the liquid LQ from the space between the projection optical system PL and the substrate P in the predetermined period including the period in which the exposure process is performed. The liquid recovery mechanism 220 comprises recovery nozzles 223 which are arranged closely to the surface of the substrate P, and a liquid recovery section 221 which is connected to the recovery nozzles 223 via a recovery tube 222. The liquid recovery section 221 is constructed to include, for example, a vacuum system (suction unit) including a vacuum pump, and a tank for accommodating the recovered liquid LQ. The operation of the liquid recovery section 221 is controlled by the control unit CONT. When the vacuum system of the liquid recovery section 221 is driven, the liquid LQ on the substrate P is recovered by the aid of the recovery nozzles 223. As for the vacuum system, it is also allowable to use a vacuum system of the factory in which the exposure apparatus EX is arranged, without providing the vacuum pump for the exposure apparatus. Further, it is not necessarily indispensable that the exposure apparatus EX is provided with the tank of the liquid recovery mechanism 220 as well. At least a part thereof can be replaced with the equipment of the factory or the like in which the exposure apparatus EX is installed.

It is preferable that a gas/liquid separator, which separates the gas from the liquid LQ sucked from the recovery nozzles 223, is provided at an intermediate position of the recovery tube 222, specifically between the recovery nozzles 223 and the vacuum system. When the liquid LQ on the substrate P is sucked and recovered, there is such a possibility that a situation arises for the liquid recovery section (vacuum system) 221 in which the liquid LQ is recovered together with the surrounding gas (air). Therefore, when the gas/liquid separator is used to separate the gas from the liquid recovered by the recovery nozzles 223, it is possible to avoid the occurrence of the inconvenience which would be otherwise caused, for example, such that the liquid LQ flows into the vacuum system and the vacuum system is out of order. The liquid LQ recovered by the liquid recovery section 221 is, for example, discarded or cleaned, and the liquid LQ is returned, for example, to the liquid supply section 211 and reused.

The liquid supply mechanism 210 and the liquid recovery mechanism 220 are supported separately from the projection optical system PL. Accordingly, the vibration, which is generated by the liquid supply mechanism 210 and the liquid recovery mechanism 220, is not transmitted to the projection optical system PL.

Figure 22:
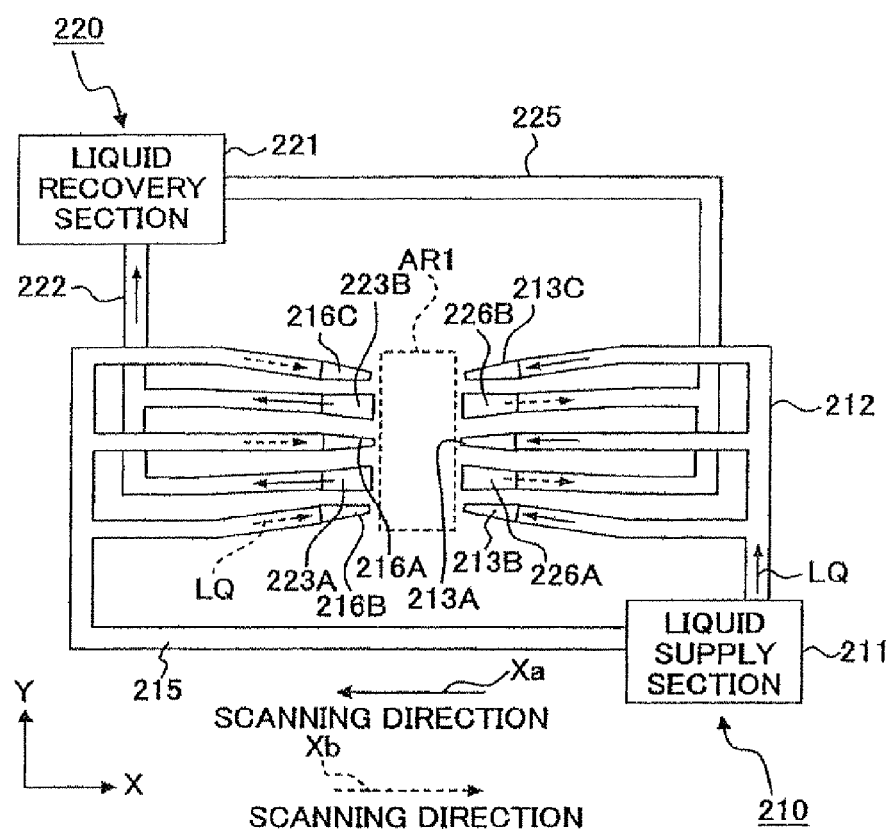
FIG. 22 shows a plan view illustrating a positional relationship among the projection area of the projection optical system, the liquid supply mechanism, and the liquid recovery mechanism.

FIG. 22 shows a plan view illustrating the positional relationship between the projection area AR1 of the projection optical system PL and the liquid supply mechanism 210 and the liquid recovery mechanism 220. The projection area AR1 of the projection optical system PL has a rectangular shape (slit shape) which is long in the Y axis direction. The three supply nozzles 213A to 213C are arranged on the +X side, and the two recovery nozzles 223A, 223B are arranged on the −X side so that the projection area AR1 is interposed in the X axis direction. The supply nozzles 213A to 213C are connected to the liquid supply section 211 via the supply tube 212. The recovery nozzles 223A, 223B are connected to the liquid recovery section 221 via the recovery tube 222. The supply nozzles 216A to 216C and the recovery nozzles 226A, 226B are arranged in such a positional relationship that the supply nozzles 213A to 213C and the recovery nozzles 223A, 223B are rotated by approximately 180°. The supply nozzles 213A to 213C and the recovery nozzles 226A, 226B are arranged alternately in the Y axis direction, and the supply nozzles 216A to 216C and the recovery nozzles 223A, 223B are arranged alternately in the Y axis direction. The supply nozzles 216A to 216C are connected to the liquid supply section 211 via the supply tube 215, and the recovery nozzles 226A, 226B are connected to the liquid recovery section 221 via the recovery tube 225.

Figure 23:
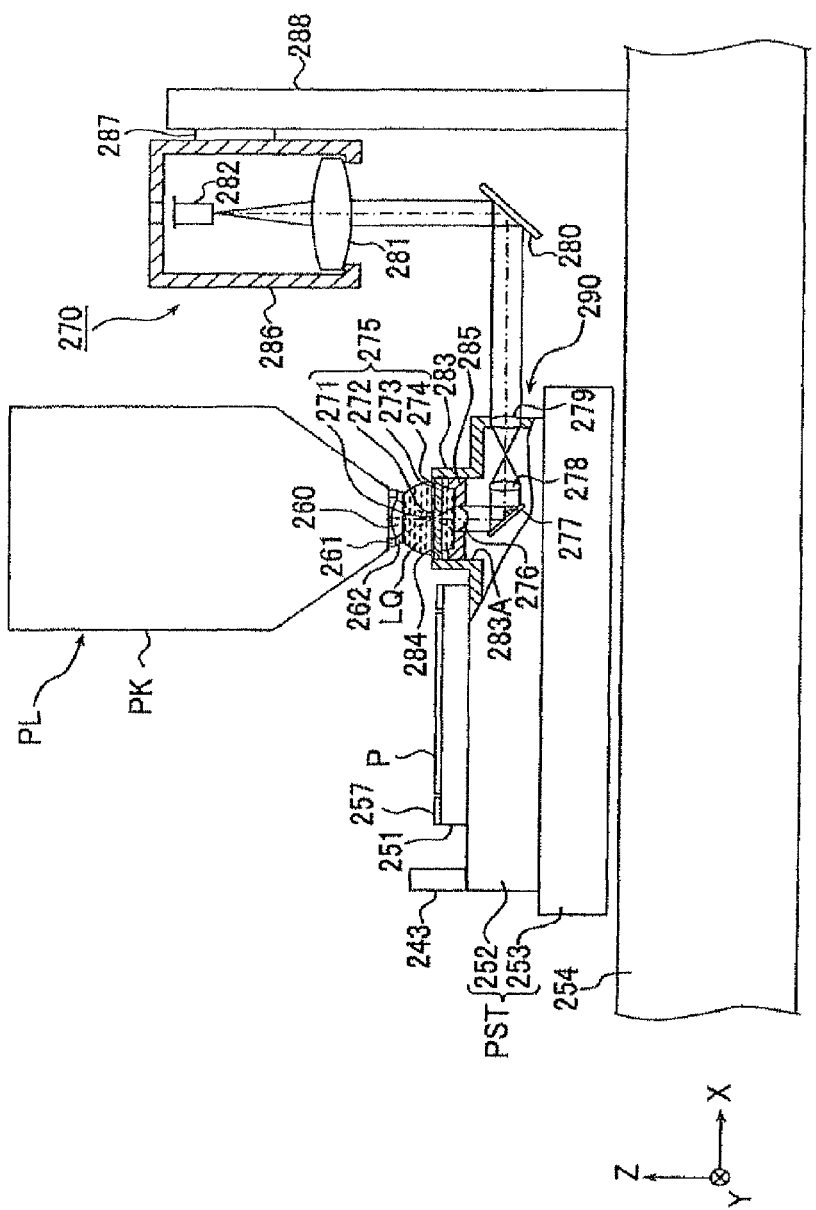
FIG. 23 shows a schematic arrangement illustrating an embodiment of a light receiver according to the present invention.

FIG. 23 shows a schematic arrangement illustrating the spatial image-measuring unit 270 to be used for the measurement of the imaging characteristic (optical characteristic) of the projection optical system PL. The spatial image-measuring unit 270 is provided with a light receiver 290 which receives the light beam which has passed through the projection optical system PL via a slit plate 275 having a slit section 271 arranged on the image plane side of the projection optical system PL. The slit plate 275 is provided for the Z tilt stage 252 on the image plane side of the projection optical system PL. The light receiver 290 includes an optical element 276 which is arranged at a position near to the slit plate 275 in the Z tilt stage 252, a bending mirror 277 which bends the optical path for the light beam which has passed through the optical element 276, an optical element 278 into which the light beam which has passed along the mirror 277 comes, a light-feeding lens 279 which feeds the light beam which has passed through the optical element 278 to the outside of the Z tilt stage 252, a mirror 280 which is provided outside the Z tilt stage 252 and which bends the optical path for the light beam fed from the light-feeding lens 279, a light-receiving lens 281 which receives the light beam which has passed along the mirror 280, and an optical sensor (light-receiving element) 282 which is composed of a photoelectric conversion element for receiving the light beam which has passed through the light-receiving lens 281.

The slit plate 275 includes a glass plate member 274 which is rectangular as viewed in a plan view, a light-shielding film 272 which is composed of chromium or the like provided at a central portion of the upper surface of the glass plate member 274, a reflective film 273 which is composed of aluminum or the like provided around the light-shielding film 272, i.e., at portions of the upper surface of the glass plate member 274 except for the light-shielding film 272, and the slit section 271 which is an aperture pattern formed at a part of the light-shielding film 272. The glass plate member 274, which is a transparent member, is exposed at the slit section 271. The light beam is transmissive through the slit section 271.

A projection 283 is provided at a position adjacent to the substrate holder 251 on the upper surface of the Z tilt stage 252. An opening 284 is provided at the upper portion of the projection 283. The slit plate 275 is detachable with respect to the opening 284. The slit plate 275 is fitted vertically from an upper position in a state in which the opening 284 is closed thereby.

Those usable as the material for forming the glass plate member 274 include, for example, synthetic quartz and fluorite having the satisfactory transmittance with respect to the ArF excimer laser light beam and the KrF excimer laser light beam. The synthetic quartz has a refractive index of 1.56 with respect to the ArF excimer laser light beam and a refractive index of about 1.51 with respect to the KrF excimer laser light beam.

The optical element 276 is arranged under the slit section 271 in the Z tilt stage 252, which is retained by a holding member 285. The holding member 285, which retains the optical element 275, is attached to the inner wall surface 283A of the projection 283. The light beam, which has passed through the optical element 276 arranged in the Z tilt stage 252, is subjected to the bending of the optical path thereof by the mirror 277, and then the light beam passes through the optical element 278. The light beam, which has passed through the optical element 278, is fed to the outside of the Z tilt stage 252 by the light-feeding lens 279 fixed to the side wall on the +X side of the Z tilt stage 252. The light beam, which has been fed to the outside of the Z tilt stage 252 by the light-feeding lens 279, is introduced into the light-receiving lens 281 by the mirror 280. The light-receiving lens 281 and the optical sensor 282 arranged over the light-receiving lens 281 are accommodated in a case 286 while marinating the predetermined positional relationship. The case 286 is fixed to the portion in the vicinity of the upper end of a support column 288 provided on the upper surface of the stage base 254 by the aid of an attachment member 287.

For example, the mirror 277, the optical element 278, and the light-feeding lens 279 are detachable with respect to the Z tilt stage 252. The support column 288, which supports the case 286 for accommodating the light-receiving lens 281 and the optical sensor 282, is detachable with respect to the stage base 254.

A photoelectric conversion element (light-receiving element), for example, a photomultiplier tube (PMT), which is capable of accurately detecting the faint or weak light beam, is used for the optical sensor 282. The photoelectric conversion signal from the optical sensor 282 is fed to the control unit CONT via a signal processing unit.

Figure 24:
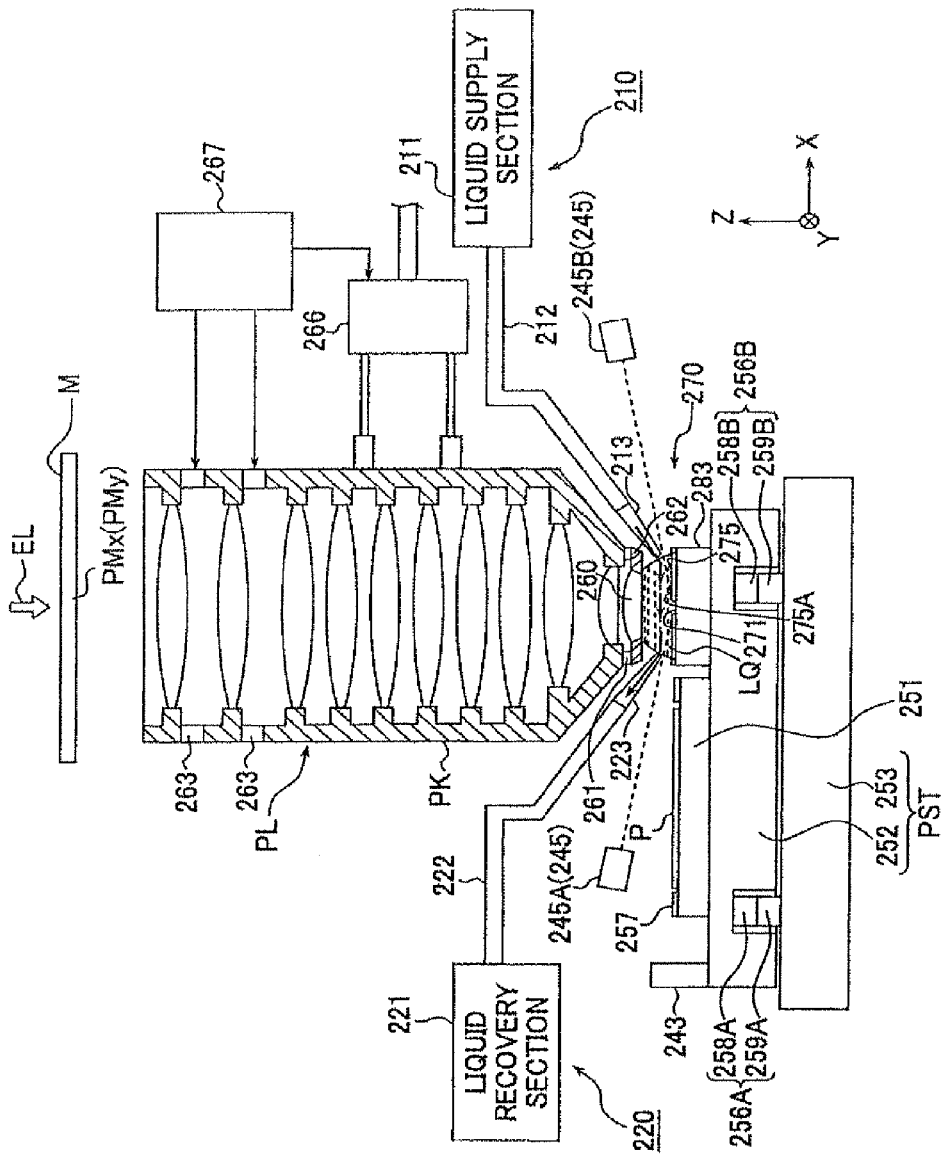
FIG. 24 schematically shows a state in which the light receiver performs the measuring operation.

FIG. 24 shows a state in which the imaging characteristic of the projection optical system PL is measured by using the spatial image-measuring unit 270. As shown in FIG. 24, the liquid LQ is allowed to flow to the space between the slit plate 275 and the optical element 260 on the end portion side (image plane side) of the projection optical system PL by using the liquid supply mechanism 210 and the liquid recovery mechanism 220 in a state in which the projection optical system PL and the slit plate 275 are opposed to one another during the measurement of the imaging characteristic of the projection optical system PL. The light beam (exposure beam EL), which has passed through the projection optical system PL and the liquid LQ, is radiated onto the slit plate 275 for constructing the spatial image-measuring unit 270 in a state in which the space between the slit plate 275 and the optical element 260 of the projection optical system PL is filled with the liquid LQ. In this situation, the information about the surface position of the upper surface 275A of the slit plate 275 can be detected by using the focus-detecting system 245.

Figure 25:
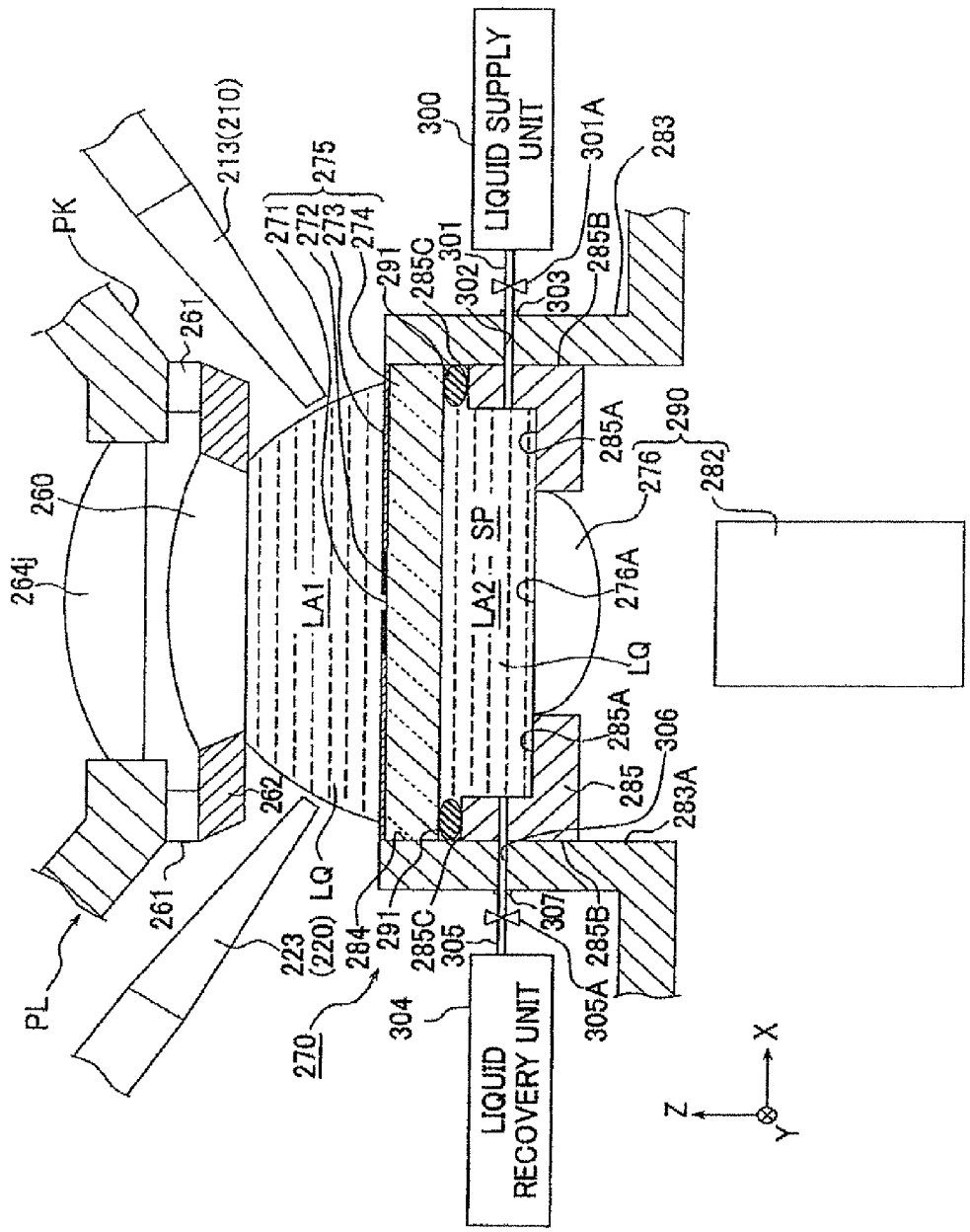
FIG. 25 shows a magnified view illustrating major parts to depict an embodiment of an optical member and a light receiver according to the present invention.
Figure 26:
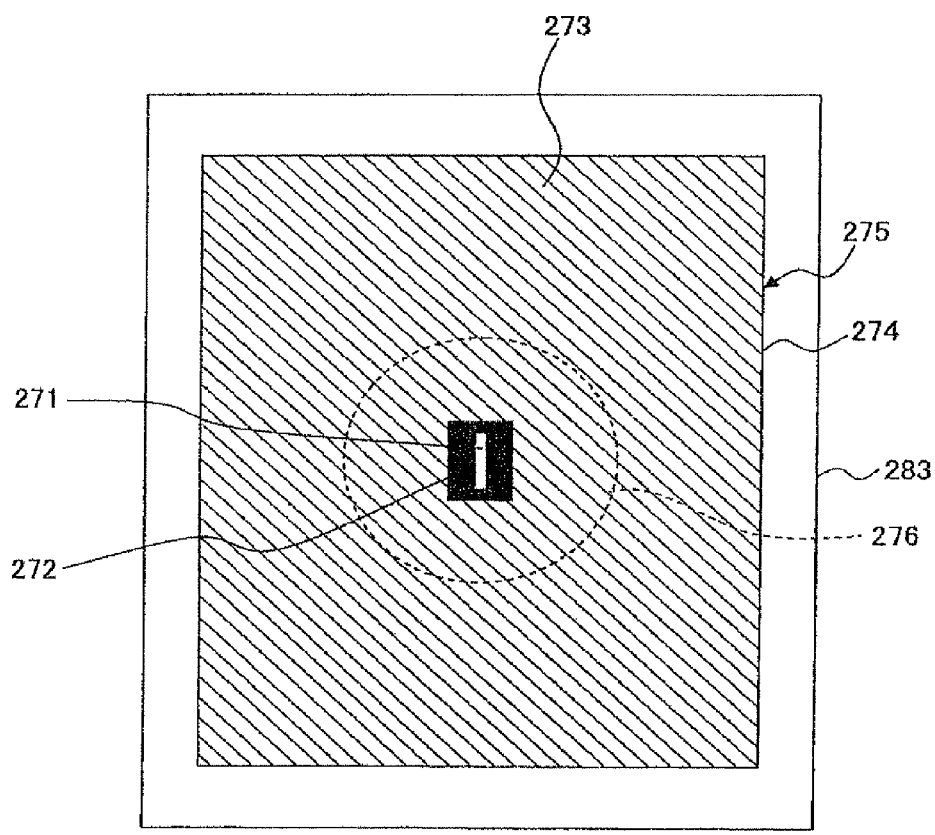
FIG. 26 shows a plan view illustrating the optical member shown in FIG. 25.

FIG. 25 shows a magnified sectional view illustrating major parts of the spatial image-measuring unit 270 disposed in the vicinity of the optical element 276 and the slit plate 275 arranged in the projection 283. FIG. 26 shows a plan view illustrating the slit plate 275 as viewed from an upper position. In FIG. 25, the light receiver 290 is depicted in a simplified manner. FIG. 25 shows only the optical sensor 282 which receives the light beam which has passed through the optical element 276 and the optical element 276 which is arranged at the position nearest to the slit plate 275 on the optical path for the light beam, of the plurality of optical elements and members for constructing the light receiver 290. In the spatial image-measuring unit 270 shown in FIG. 25, the space between the slit plate 275 and the light receiver 290 is filled with the liquid LQ. In this embodiment, the space, which is filled with the liquid LQ, is disposed between the lower surface of the slit plate 275 fitted to the opening 284 of the projection 283 and the optical element 276 arranged at the position nearest to the slit plate 275, of the plurality of optical elements (optical members) arranged on the optical path of the light receiver 290. The optical element 276 is retained by the holding member 285 attached to the inner wall surface 283A of the projection 283 at the position under the slit plate 275. The space SP, which is surrounded by the slit plate 275, the holding member 285, and the optical element 276, is filled with the liquid LQ. In this embodiment, the optical element 276 is composed of a plano-convex lens, which is arranged such that the flat surface thereof is directed upwardly. The inner bottom surface 285A of the holding member 285 is substantially flush with the upper surface (flat surface) 276A of the optical element 276. The holding member 285 is formed to have a ]-shaped form (like a shape of staple) directed substantially upwardly as viewed in a sectional view. The outer side surface 285B of the holding member 285 makes tight contact with the inner wall surface 283A of the projection 283. A seal member 291 such as an O-ring is provided between the slit plate 275 and the upper end surface (joining surface with respect to the slit plate 275) 285C of the holding member 285. Accordingly, the inconvenience is avoided, which would be otherwise caused such that the liquid LQ with which the space SP is filled leaks to the outside.

The slit plate 275 and the holding member 285 which retains the optical element 276 are detachable with respect to the inner wall surface 283A of the projection 283. When the holding member 285 is attached, then the holding member 285, which retains the optical element 276, is inserted into the projection 283 from the opening 284 of the projection 283 (in this situation, the slit plate 275 is not attached), and the holding member 285 and the inner wall surface 283A of the projection 283 are fixed by an unillustrated fixing member. Subsequently, the slit plate 275 is fitted to the opening 284. On the other hand, when the holding member 285 is detached, it is appropriate that the slit plate 275 is removed from the opening 284, and then the holding member 285 is pulled out via the opening 284.

The exposure apparatus EX further comprises a liquid supply unit 300 which supplies the liquid LQ to the space SP between the slit plate 275 and the optical element 276 of the light receiver 290, and a liquid recovery unit 304 which recovers the liquid LQ from the space SP. A supply flow passage 302, which is connected to the space SP, is formed through the wall portions of the projection 283 and the holding member 285 disposed on the +X side. A recovery flow passage 306, which is connected to the space SP, is formed through the wall portions disposed on the −X side. One end of a supply tube 301 is connected to the liquid supply unit 300, and the other end of the supply tube 301 is connected to the supply flow passage 302 by the aid of a joint 303. One end of a recovery tube 305 is connected to the liquid recovery unit 304, and the other end of the recovery tube 305 is connected to the recovery flow passage 306 by the aid of a joint 307. Valves 301A, 305A, which open/close the flow passages, are provided at intermediate positions of the supply tube 301 and the recovery tube 305 respectively. The operations of the liquid supply unit 300, the liquid recovery unit 304, and the valves 301A, 305A are controlled by the control unit CONT. The control unit CONT controls these components to supply and recover the liquid LQ with respect to the space SP, and thus the space SP is filled with the liquid LQ.

As shown in FIG. 26, the slit plate 275 includes a light-shielding film 272 which is composed of chromium or the like and which is provided at the central portion of the upper surface of the glass place member 274 that is rectangular as viewed in a plan view, a reflective film 273 which is composed of aluminum or the like and which is provided around the light-shielding film 272, i.e., at the portions of the upper surface of the glass plate member 274 except for the light-shielding film 272, and the slit section 271 which is an aperture pattern formed at a part of the light-shielding film 272. The glass plate member 274, which is a transparent member, is exposed at the slit section 271. The light beam is transmissive through the slit section 271. The slit section 271 is a rectangular (oblong) slit in which the Y axis direction is the longitudinal direction. The slit section 271 has a predetermined width 2D.

Next, an explanation will be made about the procedure for measuring the imaging characteristic of the projection optical system PL by using the spatial image-measuring unit 270 as described above.

When the spatial image (projection image) is measured, the control unit CONT moves the substrate stage PST so that the projection optical system PL is opposed to the slit plate 275 (in other words, the state shown in FIG. 24 is established). The liquid supply mechanism 210 and the liquid recovery mechanism 220 are used to fill, with the liquid LQ, the space between the slit plate 275 and the optical element 260 disposed at the end portion of the projection optical system PL. Concurrently with this operation (or before or after this operation), the control unit CONT uses the liquid supply unit 300 and the liquid recovery unit 304 to fill, with the liquid LQ, the space between the slit plate 275 and the optical element 276 of the light receiver 290 as shown in FIG. 25. In the following description, the liquid immersion area, which is formed by filling, with the liquid LQ, the space between the projection optical system PL and the slit plate 275, is appropriately referred to as "first liquid immersion area LA1", and the liquid immersion area, which is formed by filling, with the liquid LQ, the space between the slit plate 275 and the light receiver 290 (optical element 276), is appropriately referred to as "second liquid immersion area LA2".

When the spatial image is measured, the mask M provided with the measuring mark as described later on is supported on the mask stage MST. The control unit CONT illuminates the mask M with the exposure beam EL by the illumination optical system IL. The light beam (exposure beam EL), which passes through the measuring mark, the projection optical system PL, and the liquid LQ in the first liquid immersion area LA1, is radiated onto the slit plate 275. The light beam, which has passed through the slit section 271 of the slit plate 275, comes into the optical element 276 through the liquid LQ in the second liquid immersion area LA2.

The numerical aperture NA of the projection optical system is improved by the liquid LQ in the first liquid immersion area LA1 between the projection optical system PL and the slit plate 275. Therefore, if the numerical aperture NA of the optical element 276 of the light receiver 290 is not improved in response to the numerical aperture NA of the projection optical system PL, then there is such a possibility that the optical element 276 cannot satisfactorily import or incorporate (all of) the light beam which has passed through the projection optical system PL, and it is impossible to receive the light beam in a well-suited manner. Accordingly, when the numerical aperture NA of the projection optical system PL is improved by filling, with the liquid LQ, the space between the projection optical system PL and the slit plate 275 as in this embodiment, the space between the slit plate 275 and the optical element 276 of the light receiver 290 is also filled with the liquid LQ to improve the numerical aperture NA of the optical element 276 of the light receiver 290. Thus, the optical element 276 of the light receiver 290 can satisfactorily import the light beam which has passed through the projection optical system PL.

The optical element 276 collects the light beam which has passed through the second liquid immersion area LA2. The light beam, which is collected by the optical element 276, passes along the mirror 277, the optical element 278, and the light-feeding lens 279, and the light beam is led to the outside of the substrate stage PST (FIG. 23). The optical path is bent by the mirror 280 for the light beam having been led to the outside of the substrate stage PST. The light beam passes through the light-receiving lens 281, and the light beam is received by the optical sensor 282. The photoelectric conversion signal (light amount signal), which corresponds to the light-receiving amount, is outputted from the optical sensor 282 via the signal processing unit to the control unit CONT.

In this embodiment, the projection image (spatial image) of the measuring mark is measured in the slit scan manner as described later on. Therefore, during this process, the light-feeding lens 279 is moved with respect to the light-receiving lens 281 and the optical sensor 282. Accordingly, in the case of the spatial image-measuring unit 270, the sizes of the respective lenses and the mirror 280 are designed so that all of the light beam, which passes through the light-feeding lens 279 that is movable within a predetermined range, comes into the light-receiving lens 281.

In the case of the spatial image-measuring unit 270, the optical sensor 282 is provided at the predetermined position outside the substrate stage PST. Therefore, the influence exerted, for example, on the measurement accuracy of the laser interferometer 244, which is caused by the heat generation by the optical sensor 282, is suppressed within a feasible range. Further, the outside and the inside of the substrate stage PST are not connected by any light guide or the like. Therefore, the driving accuracy of the substrate stage PST is not affected unlike the case in which the outside and the inside of the substrate stage PST are connected by the light guide. Of course, the optical sensor 282 may be provided inside the substrate stage PST, when the influence of the heat or the like can be neglected or excluded. That is, parts of the plurality of optical elements and light-receiving elements for constructing the light receiver 290 may be provided on the substrate stage PST, or all of them may be provided on the substrate stage PST.

In this embodiment, those usable as the liquid LQ for the "first liquid immersion area LA1" and the "second liquid immersion area LA2" may be a liquid of the same type or liquids of different types, especially liquids having different refractive indexes with respect to the exposure beam. In particular, it is preferable that the liquid, which is used for the "first liquid immersion area LA1", is selected in consideration of NA or the refractive index of the optical element provided at the end portion of the projection optical system. On the other hand, the liquid, which is used for the "second liquid immersion area LA2", can be selected in consideration of the refractive index of the glass plate member 274 and/or the size and the refractive index of the optical element 276.

This embodiment has been explained about the example wherein the spatial image-measuring unit 270, in which the space between the slit plate 275 and the light receiver 290 (optical element 276) is filled with the liquid LQ, is applied to the liquid immersion exposure apparatus. However, the spatial image-measuring unit 270 (light receiver 290) according to the present invention can be also applied to a dry exposure apparatus (ordinary exposure apparatus) in which the exposure is performed while the space between the projection optical system PL and the substrate P is not filled with the liquid LQ. When the spatial image is measured in the dry exposure apparatus, the exposure beam EL, which has passed through the projection optical system PL, is radiated onto the slit plate 275 in a state in which the projection optical system PL and the slit plate 275 are opposed to one another on condition that the space between the projection optical system PL and the slit plate 275 is not filled with the liquid LQ and the space between the slit plate 275 and the optical element 276 of the light receiver 290 is filled with the liquid LQ (on condition that the first liquid immersion area LA1 is not formed and only the second liquid immersion area LA2 is formed). The optical element 276 of the light receiver 290 undergoes the improvement in the numerical aperture NA owing to the liquid LQ with which the space between the slit plate 275 and the optical element 276 is filled. Therefore, the light beam can be satisfactorily received even in the case of the dry exposure apparatus which is provided with the projection optical system having the large numerical aperture NA (for example, NA>0.9). The light beam, which has passed through the projection optical system PL, can be also received satisfactorily, for example, by allowing the optical element 276 of the light receiver 290 to make tight contact with the slit plate 275. An effect is obtained such that the entire light receiver 290 can be made compact.

In this embodiment, the space SP between the slit plate 275 and the optical element 276 is filled with the liquid LQ by supplying and recovering the liquid LQ by using the liquid supply unit 300 and the liquid recovery unit 304. However, the space SP can be also filled with the liquid LQ, for example, upon the production of the exposure apparatus EX without using the liquid supply unit 300 and the liquid recovery unit 304. In this case, for example, the slit plate 275 may be detached from the projection 283 (Z tilt stage 252), and the liquid LQ in the space SP may be periodically exchanged. Alternatively, a liquid, which is excellent in storage performance and which requires no exchange, may be used as the liquid LQ. On the other hand, the space SP can be always filled with the fresh (clean) liquid LQ by supplying and recovering the liquid LQ by using the liquid supply unit 300 and the liquid recovery unit 304. The liquid supply operation and the liquid recovery operation of the liquid supply unit 300 and the liquid recovery unit 304 may be stopped during the measurement with the spatial image-measuring unit 270. For example, when the holding member 285, which retains the slit plate 275 and the optical element 276, is detached from the projection 283 (Z tilt stage 252), the attachment/detachment operation can be performed without causing any leakage of the liquid LQ by detaching the holding member 285 which retains the optical element 276 and the slit plate 275 after recovering the liquid LQ from the space SP by using the liquid recovery unit 304.

A light-transmissive member (optical member, glass member), which has approximately the same refractive index as that of the liquid LQ, may be arranged between the slit plate 275 and the light receiver 290 (optical element 276) without filling the space between the slit plate 275 and the light receiver 290 (optical element 276) with the liquid LQ. Such a light-transmissive member includes, for example, quartz and fluorite. In this embodiment, the liquid LQ is pure water. It is approved that the refractive index of pure water with respect to the ArF excimer laser light beam is approximately 1.44. On the other hand, it is approved that the refractive index of quartz with respect to the ArF excimer laser light beam is approximately 1.56. Therefore, a light-transmissive member composed of quartz may be arranged between the slit plate 275 and the optical element 276 in place of the formation of the second liquid immersion area LA2 with the liquid (pure water) LQ.

An exemplary operation for measuring the spatial image based on the use of the spatial image-measuring unit 270 will be explained below, for example, with reference to FIG. 24. As described above, FIG. 24 shows the state in which the spatial image is measured. Those usable as the mask M during the spatial image measurement include, for example, those which are exclusively used to measure the spatial image, and those obtained by forming exclusive measuring marks on the mask for producing the device to be used to produce the device. Alternatively, it is also allowable to use the following material in place of the mask as described above. That is, a fixed mark plate (reference mark plate), which is composed of a glass material having the same quality as that of the mask, is provided on the mask stage MST, and a measuring mark is formed on the mark plate.

Figure 27A:
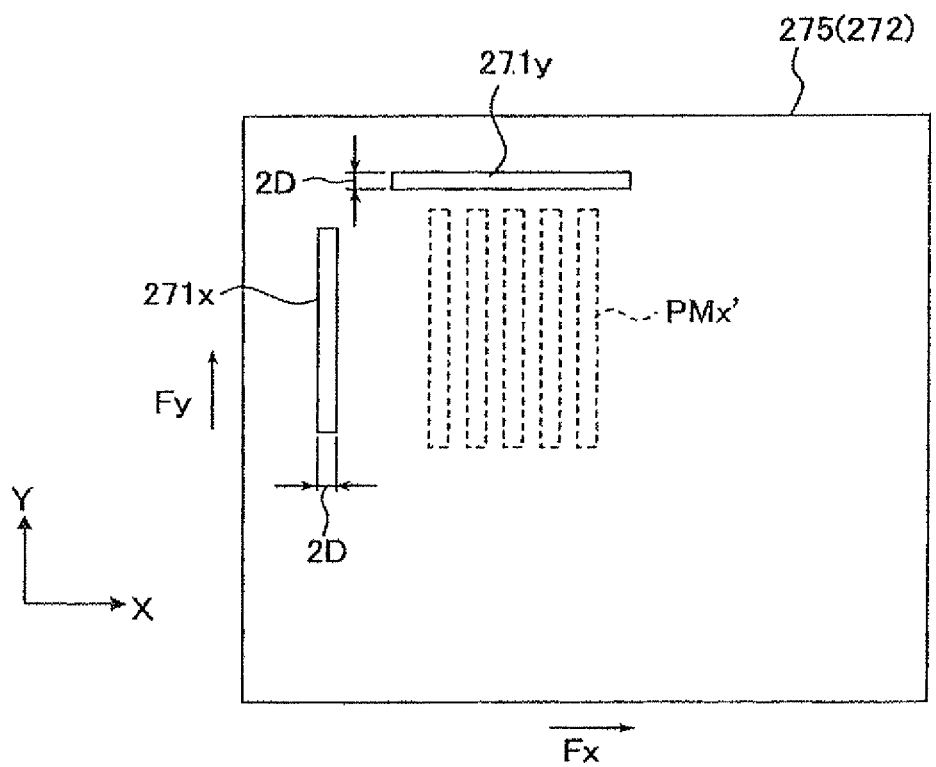
FIGS. 27A and 27B show an exemplary light-transmitting section of the optical member.

A measuring mark PMx (FIG. 24) and a measuring mark PMy (FIG. 24) are formed at predetermined positions on the mask M so that they are disposed closely to one another. The measuring mark PMx is composed of a line-and-space (L/S) mark which has the periodicity in the X axis direction and which has a ratio (duty ratio) of 1:1 between the width of the line portion and the width of the space portion. The measuring mark PMy is composed of an L/S mark which has the periodicity in the Y axis direction and which has a duty ratio of 1:1. Each of the measuring marks PMx, PMy is composed of a line pattern having the same line width. As shown in FIG. 27A, the slit plate 275, which constitutes the spatial image-measuring unit 270, is provided with a slit section 271$x$ which has a predetermined width 2D and which extends in the Y axis direction and a slit section 271$y$ which has a predetermined width 2D and which extends in the X axis direction, the slit section 271$x$ and the slit section 271$y$ being formed in a predetermined positional relationship as shown in FIG. 27A. As described above, for example, a plurality of slit sections 271$x$, 271$y$ are actually formed for the slit plate 275. However, the slit sections are represented by the slit section 271 as depicted, for example, in FIGS. 20 to 26.

For example, when the spatial image of the measuring mark PMx is measured, then the movable mask blind 207B shown in FIG. 20 is driven by the control unit CONT by the aid of the unillustrated blind-driving unit, and the illumination area of the exposure beam EL is restricted to be a predetermined area including the portion of the measuring mark PMx. When the control unit CONT starts the light emission of the light source 201 in this state, and the exposure beam EL is radiated onto the measuring mark PMx, then the light beam (exposure beam EL), which is diffracted and scattered by the measuring mark PMx, is refracted by the projection optical system PL, and the spatial image (projection image) of the measuring mark PMx is formed on the image plane of the projection optical system PL. In this situation, it is assumed that the substrate stage PST is provided at the position at which the spatial image PMx' of the measuring mark PMx is formed on the +X side (or −X side) of the slit section 271$x$ on the slit plate 275 as shown in FIG. 27A.

Figure 27B:
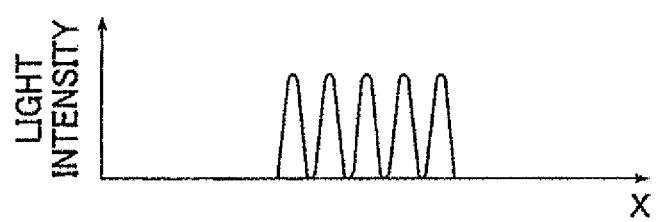
Figure 28:
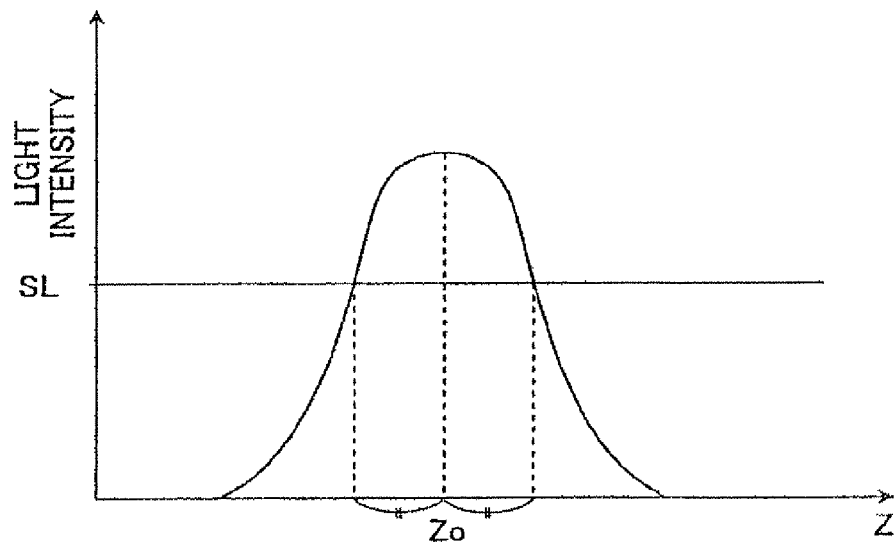
FIG. 28 shows an exemplary light-receiving signal received by the light receiver.

When the substrate stage PST is driven in the +X direction as shown by the arrow Fx in FIG. 27A by the substrate stage-driving unit PSTD under the instruction of the control unit CONT, the slit section 271$x$ is scanned in the X axis direction with respect to the spatial image PMx'. The light beam (exposure beam EL), which passes through the slit section 271$x$ during the scanning, is received by the optical sensor 282 via the light-receiving optical system in the substrate stage PST (Z tilt stage 252), the mirror 280 disposed outside the substrate stage PST, and the light-receiving lens 281. The photoelectric conversion signal thereof is supplied to the signal processing unit. The signal processing unit applies the predetermined processing to the photoelectric conversion signal, and the light intensity signal corresponding to the spatial image PMx' is supplied to the control unit CONT. During this process, in order to suppress the influence caused by any dispersion of the light emission intensity of the exposure beam EL supplied from the light source 201, the signal, which is obtained by normalizing the signal from the optical sensor 282 with the signal from the integrator sensor 233 shown in FIG. 20, is supplied by the signal processing unit to the control unit CONT. FIG. 27B shows an example of the photoelectric conversion signal (light intensity signal) obtained when the spatial image is measured as described above.

When the spatial image of the measuring mark PMy is measured, then the substrate stage PST is provided at the position at which the spatial image of the measuring mark PMy is formed on the +Y side (or on the −Y side) of the slit section 271y on the slit plate 275, and the measurement is performed in the slit scan manner in the same manner as described above. Accordingly, it is possible to obtain the photoelectric conversion signal (light intensity signal) corresponding to the spatial image of the measuring mark PMy. The measuring mark is not limited to the mark as described above, which may be appropriately determined depending on, for example, the measurement accuracy and the imaging characteristic of the measurement objective.

When the measurement is performed in order to obtain, for example, the information about the adjustment of the imaging characteristic, the focus of the projection optical system PL and another predetermined imaging characteristic (for example, at least one of various aberrations such as the field curvature, the magnification, the distortion, the comatic aberration, and the spherical aberration) are measured by using the spatial image-measuring unit 270 (FIG. 20) as described later on, while the optical elements 264a, 264b are driven one by one, and while the pressures of the first and second tightly closed chambers 265A, 265B are changed one by one, firstly upon the initial adjustment as shown in FIG. 21 to determine the amounts of the imaging characteristic change with respect to the driving amounts of the optical elements 264a, 264b and the pressure changes in the first and second tightly closed chambers 265A, 265B.

An explanation will be made below about a method for detecting the best focus position of the projection optical system PL as an example of the operation for measuring the imaging characteristic. In this procedure, it is premised that the ordinary diaphragm of the illumination system aperture diaphragm plate 204 is selected, and the ordinary illumination condition is established as the illumination condition. For example, a mask M, which is formed with a measuring mark PMx (or PMy) composed of an L/S pattern having a duty ratio of 50% and a line width of 1 µm, is used to detect the best focus position. At first, the mask M is loaded on the mask stage MST by an unillustrated loader unit. Subsequently, the control unit CONT moves the mask stage MST by the aid of the mask stage-driving unit MSTD so that the measuring mark PMx on the mask M is approximately coincident with the optical axis of the projection optical system PL. Subsequently, the control unit CONT defines the illumination area by driving and controlling the movable mask blind 207B so that the exposure beam EL is radiated onto only the portion of the measuring mark PMx. The control unit CONT radiates the exposure beam EL onto the mask M in this state to measure the spatial image of the measuring mark PMx in the slit scan manner by using the spatial image-measuring unit 270 while scanning the substrate stage PST in the X axis direction in the same manner as described above. During this process, control unit CONT repeats the measurement of the spatial image of the measuring mark PMx a plurality of times while changing, at a predetermined step pitch, the position of the slit plate 275 in the Z axis direction (i.e., the position of the Z tilt stage 252) by the aid of the substrate stage-driving unit PSTN, and the light intensity signals (photoelectric conversion signals), which are obtained by the respective repetitions, are stored in the memory unit MRY. The position of the slit plate 275 in the Z axis direction is changed by controlling the actuators 259A, 259B, 259C on the basis of the measured values of the encoders 258A, 258B, 258C for the Z tilt stage 252. The control unit CONT performs the Fourier transformation for the plurality of light amount signals (photoelectric conversion signals) obtained by the repetitions as described above respectively to determine the contrast which is the amplitude ratio between the 1st order frequency component and the 0-order frequency component of each of them. The control unit CONT detects the Z position of the Z tilt stage 252 (i.e., the position of the slit plate 275 in the Z axis direction) corresponding to the light intensity signal at which the contrast is maximized. This position is determined as the best focus position of the projection optical system PL. The contrast sensitively changes depending on the focus position (defocus amount). Therefore, it is possible to measure (determine) the best focus position of the projection optical system PL accurately with ease. The control unit CONT performs the focus calibration to reset (calibrate) the detection origin (detection reference point) of the focus-detecting system 245 on the basis of the determined best focus position. Accordingly, the predetermined surface on the substrate stage PST (for example, the surface of the substrate P or the surface of the slit plate 275) can be thereafter positioned at the position which is optically conjugate with the reference plane of the mask M by the focus-detecting system 245.

The amplitudes of the frequency components of the 2nd order or higher order real numbers are generally small, and the amplitudes cannot be obtained sufficiently with respect to the electric noise and the optical noise in some cases. However, when no problem arises in view of the S/N ratio (signal/noise ratio), the best focus position can be also determined by observing the change of the amplitude ratios of the higher order frequency components. There is no limitation to the method based on the use of the contrast. The best focus position can be also detected by a technique to detect the Z position (focus position) at which the derivative value of the light intensity signal is maximized.

The explanation has been made in this case about the method (slit scan system) in which the slit section 271 (slit plate 275) is scanned in the predetermined direction in the XY plane when the best focus position of the projection optical system PL is measured. However, the following procedure is also available. That is, a spatial image of a measuring mark such as an isolated line mark is formed on the image plane of the projection optical system PL. The slit plate 275 (Z tilt stage 252) is scanned (subjected to the scanning) in the Z axis direction within a predetermined stroke range about the center of the best focus position so that the slit section 271 (slit plate 275) is scanned in the direction of the optical axis AX (Z axis direction) relative to the spatial image. The best focus position is determined on the basis of the light intensity signal (peak value) obtained in the situation as described above. In this procedure, it is preferable to use the measuring mark with which the spatial image of the measuring mark has, on the image plane, a dimension and a shape approximately coincident with the shape of the slit section 271 (271x or 271y). When the spatial image is measured as described above, it is possible to obtain the light intensity signal as shown in FIG. 26. In this case, the position of the peak of the signal waveform of the light intensity signal may be directly found out, and thus the Z position of the point may be regarded as the best focus position $Z_0$. Alternatively, the light intensity signal may be sliced by using a predetermined slice level line SL, and the Z position of the midpoint between the two points of intersection of the light intensity signal and the slice level line SL may be regarded as the best focus position $Z_0$. In any case, this method makes it possible to detect the best focus position by scanning the slit plate 275 in the Z axis direction only once. Therefore, it is possible to improve the throughput.

Figure 29:
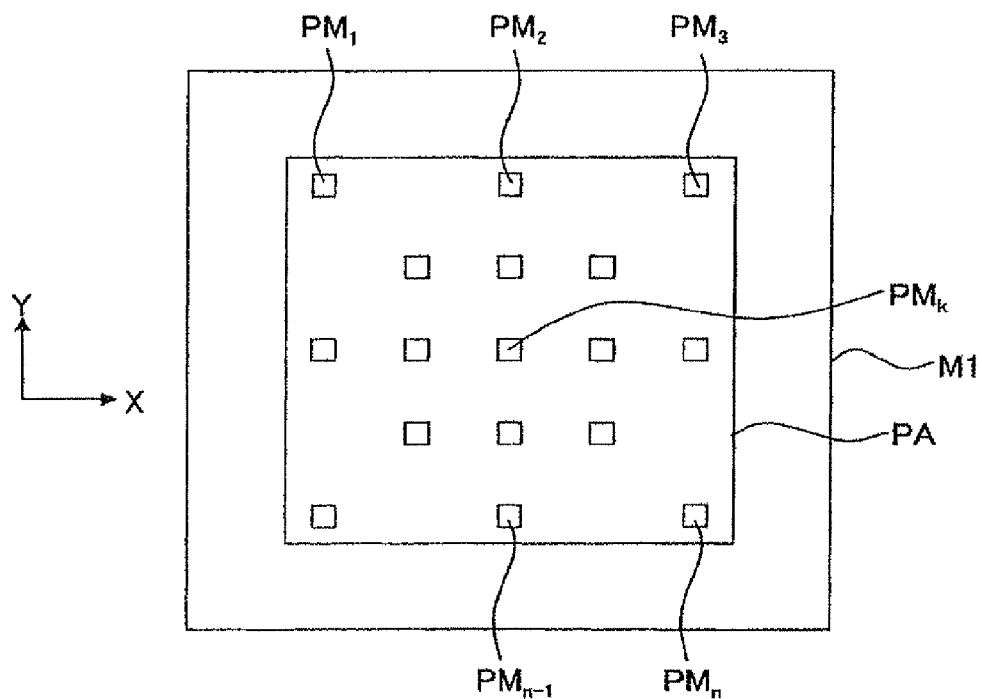
FIG. 29 shows an exemplary mask to be used when the imaging characteristic of the projection optical system is measured.

Next, an explanation will be made about a method for detecting the image plane shape of the projection optical system PL (field curvature) as an example of the operation for measuring the imaging characteristic. When the field curvature is detected, a mask M1 is used as shown in FIG. 29 by way of example, wherein measuring marks $PM_1$ to $PM_n$, each of which has the same dimension and the same cycle as those of the measuring mark PMx described above, are formed in a pattern area PA. After the mask M1 is loaded on the mask stage MST, the control unit CONT moves the mask stage MST by the aid of the mask stage-driving unit MSTD so that the measuring mark $PM_k$, which is disposed at the center of the mask M1, is approximately coincident with the optical axis of the projection optical system PL. That is, the mask M1 is positioned with respect to the reference point. It is assumed that all of the measuring marks $PM_1$ to $PM_n$ are positioned in the field of the projection optical system PL when the positioning has been performed with respect to the reference point. Subsequently, the control unit CONT defines the illumination area by driving and controlling the movable mask blind 207B so that the exposure beam EL is radiated onto only the portion of the $PM_1$. The control unit CONT radiates the exposure beam EL onto the mask M1 in this state to measure the spatial image of the measuring mark $PM_1$ and detect the best focus position of the projection optical system PL by using the spatial image-measuring unit 270 in the slit scan manner in the same manner as described above. The obtained result is stored in the memory unit MRY. When the detection of the best focus position based on the use of the measuring mark $PM_1$ is completed, the control unit CONT defines the illumination area by driving and controlling the movable mask blind 207B so that the exposure beam EL is radiated onto only the portion of the measuring mark $PM_2$. In this state, the spatial image is measured for the measuring mark $PM_2$, and the best focus position of the projection optical system PL is detected in the slit scan manner in the same manner as described above. The obtained result is stored in the memory unit MRY. After that, the control unit CONT repeatedly performs the measurement of the spatial image and the detection of the best focus position of the projection optical system PL for the measuring marks $PM_3$ to $PM_n$ while changing the illumination area in the same manner as described above. The control unit CONT performs the predetermined statistical processing on the basis of the respective best focus positions $Z_1, Z_2, \ldots, Z_n$ obtained as described above. Accordingly, the field curvature of the projection optical system PL is calculated.

Figure 30:
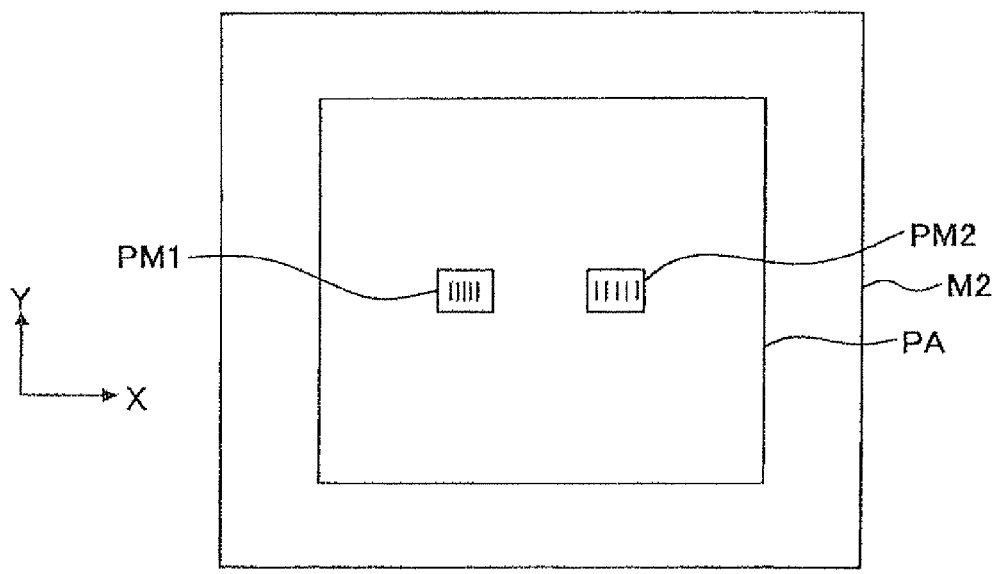
FIG. 30 shows an exemplary mask to be used when the imaging characteristic of the projection optical system is measured.

When the spherical aberration of the projection optical system PL is detected, a mask M2 shown in FIG. 30 is used. Two measuring marks PM1, PM2, which are separated from each other by a predetermined distance in the X axis direction, are formed at approximately central portions in the Y axis direction in a pattern area PA of the mask M2 shown in FIG. 30. The measuring mark PM1 has an L/S pattern having the same dimension and the same cycle as those of the measuring mark PMx described above. The measuring mark PM2 has an L/S pattern in which a line pattern having the same dimension as that of the measuring mark PMx is aligned in the X axis direction at a different cycle (for example, about 1.5 to 2 times the cycle (mark pitch) of the measuring mark PM1). After the mask M2 is loaded on the mask stage MST, the control unit CONT moves the mask stage MST by the aid of the mask stage-driving unit MSTD so that the measuring mark PM1 on the mask M2 is approximately coincident with the optical axis of the projection optical system PL. Subsequently, the control unit CONT defines the illumination area by driving and controlling the movable mask blind 207B so that the exposure beam EL is radiated onto only the portion of the measuring mark PM1. The control unit CONT radiates the exposure beam EL onto the mask M2 in this state to measure the spatial image of the measuring mark PM1 and detect the best focus position of the projection optical system PL by using the spatial image-measuring unit 270 in the slit scan manner in the same manner as described above. The obtained result is stored in the memory unit MRY. When the detection of the best focus position based on the use of the measuring mark PM1 is completed, the control unit CONT moves the mask stage MST by the predetermined distance in the −X direction by the aid of the mask stage-driving unit MSTD so that the exposure beam EL is radiated onto the measuring mark PM2. The spatial image of the measuring mark PM2 is measured, and the best focus position of the projection optical system PL is detected in this state in the slit scan manner in the same manner as described above. The obtained result is stored in the memory unit MRY. The control unit CONT calculates the spherical aberration of the projection optical system PL by calculation on the basis of the difference between the respective obtained best focus positions $Z_1$ and $Z_2$.

Figure 31:
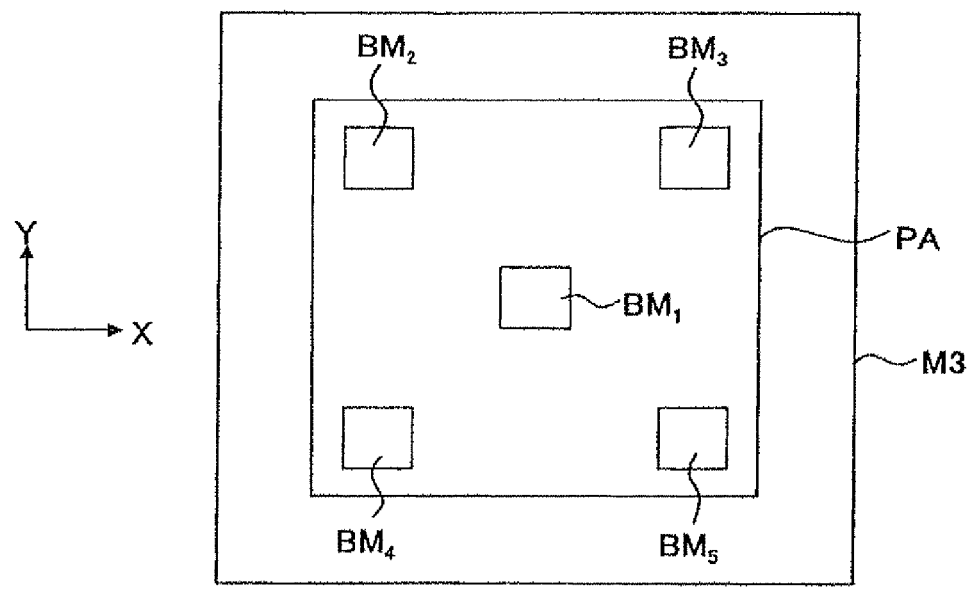
FIG. 31 shows an exemplary mask to be used when the imaging characteristic of the projection optical system is measured.

When the magnification and the distortion of the projection optical system PL are detected, a mask M3 shown in FIG. 31 is used. A total of five measuring marks $BM_1$ to $BM_5$, each of which is composed of, for example, a square mark of 120 µm square (30 µm square on the slit plate 275 at a projection magnification of ¼), are formed at a central portion and four corners of a pattern area PA of the mask M3 shown in FIG. 31. After the mask M3 is loaded on the mask stage MST, the control unit CONT moves the mask stage MST by the aid of the mask stage-driving unit MSTD so that the center of the measuring mark $BM_1$ existing at the center of the mask M3 is approximately coincident with the optical axis of the projection optical system PL. That is, the mask M3 is positioned with respect to the reference point. It is assumed that all of the measuring marks $BM_1$ to $BM_5$ are positioned in the field of the projection optical system PL in the state in which the positioning has been performed with respect to the reference point. Subsequently, the control unit CONT defines the illumination area by driving and controlling the movable mask blind 207B so that the exposure beam EL is radiated onto only a rectangular area portion which includes the measuring mark $BM_1$ and which is larger than the measuring mark $BM_1$ as a whole. In this state, the control unit CONT radiates the exposure beam EL onto the mask M3. Accordingly, the spatial image of the measuring mark $BM_1$, i.e., the mark image having a square shape of approximately 30 µm square is formed. In this state, the control unit CONT measures the spatial image of the measuring mark $BM_1$ by using the spatial image-measuring unit 270 while scanning the substrate stage PST in the X axis direction by the aid of the substrate stage-driving unit PSTD. The light intensity signal obtained by the measurement is stored in the memory unit MRY. Subsequently, the control unit CONT determines the imaging position of the measuring mark $BM_1$ on the basis of the obtained light intensity signal, for example, in accordance with the known technique of the phase detection or the technique of the edge detection. For example, the following general method can be used for technique of the phase detection. That is, the control unit CONT determines a sum corresponding to, for example, one cycle of a product of a 1st order frequency component (regarded as sine wave) obtained by performing the Fourier transformation for the light intensity signal and a sine wave to serve as the reference for the same frequency as the above, and the control unit CONT determines a sum corresponding to, for example, one cycle of a product of the 1st order frequency component and a cosine wave to serve as the reference for the same cycle as the above. The control unit CONT determines an arctangent of a quotient obtained by dividing the obtained sums to one another. Accordingly, the control unit CONT determines the phase difference of the 1st frequency component with respect to the reference signal. The X position $x_1$ of the measuring mark $BM_1$ is determined on the basis of the phase difference. On the other hand, a technique of the edge detection based on the slice method can be used as the technique of the edge detection in which the positions of the edges of the spatial image corresponding to each of the photoelectric conversion signals are calculated respectively on the basis of the points of intersection between the light intensity signal and a predetermined slice level. Subsequently, the control unit CONT measures the spatial image of the measuring mark $BM_1$ by using the spatial image-measuring unit 270 while scanning the substrate stage PST in the Y axis direction. The light intensity signal obtained by the measurement is stored in the memory unit MRY. The Y position $y_1$ of the measuring mark $BM_1$ is determined, for example, in accordance with the technique of the phase detection in the same manner as described above. The control unit CONT corrects the positional deviation of the mask M3 with respect to the center of the optical axis on the basis of the obtained coordinate position $(x_1, y_1)$ of the measuring mark $BM_1$. When the correction of the positional deviation of the mask M3 is completed, the control unit CONT defines the illumination area by driving and controlling the movable mask blind 207B so that the exposure beam EL is radiated onto only a rectangular area portion which includes the measuring mark $BM_2$ and which is larger than the measuring mark $BM_2$ as a whole. In this state, the measurement of the spatial image of the measuring mark $BM_2$ and the measurement of the XY position are performed in the slit scan manner in the same manner as described above. The obtained result is stored in the memory unit MRY. After that, the control unit CONT repeatedly performs the measurement of the spatial image and the measurement of the XY position for the measuring marks $BM_3$ to $BM_5$ while changing the illumination area. The predetermined calculation is performed on the basis of the coordinate values $(x_2, y_2)$, $(x_3, y_3)$, $(x_4, y_4)$, $(x_5, y_5)$ of the measuring marks $BM_2$ to $BM_5$ obtained as described above. Accordingly, the control unit CONT calculates at least one of the magnification and the distortion of the projection optical system PL.

The explanation has been made above by way of example about the procedure for measuring the best focus position, the field curvature, the spherical aberration, the magnification, and the distortion of the projection optical system PL by using the spatial image-measuring unit 270. The spatial image-measuring unit 270 is also capable of measuring, for example, other imaging characteristics including, for example, the comatic aberration by using a predetermined measuring mark.

As described above, when the imaging characteristic of the projection optical system PL is measured in the slit scan manner, the light beam is radiated onto the light receiver 290 (optical element 276) through the liquid LQ while moving the slit plate 275 (slit section 271) relative to the light beam (exposure beam EL) which has passed through the projection optical system PL.

The control unit CONT determines the correction amounts to obtain the desired imaging characteristic, specifically the driving amounts of the optical elements 264a, 264b of the projection optical system PL and the adjustment amounts of the internal pressures of the first and second tightly closed chambers 265A, 265B on the basis of the information about the imaging characteristic of the projection optical system PL measured as described above. In this procedure, the memory unit MRY stores the relationship (i.e., the imaging characteristic adjustment information) between the change amounts (variation amounts) of various types of the imaging characteristics of the projection optical system PL and the driving amounts of the optical elements 264a, 264b of the projection optical system PL and the adjustment amounts of the internal pressures of the first and second tightly closed chambers 265A, 265B previously determined, for example, by an experiment or simulation. The control unit CONT makes reference to the relationship stored in the memory unit MRY to determine the correction amounts including the driving amounts of the optical elements 264a, 264b of the projection optical system PL and the adjustment amounts of the internal pressures of the first and second tightly closed chambers 265A, 265B in order that the imaging characteristic of the projection optical system PL is corrected to be in the desired state. Details of the spatial image measurement are disclosed, for example, in Japanese Patent Application Laid-open No. 2002-14005 (corresponding to United States Patent Publication No. 2002/0041377). The disclosures thereof are incorporated herein by reference within a range of permission of the domestic laws and ordinances of the state designated or selected in this international application.

An explanation will be made about the procedure for exposing the substrate P with a pattern for producing a device by using the exposure apparatus EX.

As shown in FIG. 20, the imaging characteristic is measured via the projection optical system PL and the liquid LQ by using the spatial image-measuring unit 270, and the correction amounts are derived in order to correct the imaging characteristic. After that, the control unit CONT drives the substrate stage PST by the aid of the substrate stage-driving unit PSTD so that the projection optical system PL is opposed to the substrate P loaded on the substrate stage PST. In this situation, the mask M, on which the pattern for the device production is formed, is loaded on the mask stage MST. The control unit CONT drives the liquid supply section 211 of the liquid supply mechanism 210 to supply, onto the substrate P, the liquid LQ in the predetermined amount per unit time by the aid of the supply tube 212 and the supply nozzles 213. Further, the control unit CONT drives the liquid recovery section (vacuum system) 221 of the liquid recovery mechanism 220 in accordance with the supply of the liquid LQ by the liquid supply mechanism 210 to recover the liquid LQ in the predetermined amount per unit time by the aid of the recovery nozzles 223 and the recovery tube 222. Accordingly, the liquid immersion area AR2 of the liquid LQ is formed between the substrate P and the optical element 260 disposed at the end portion of the projection optical system PL.

The control unit CONT drives the illumination optical system IL to illuminate the mask M with the exposure beam EL, and the image of the pattern of the mask M is projected onto the substrate P via the projection optical system PL and the liquid LQ. In this procedure, when the exposure process is performed for the substrate P, the control unit CONT performs the exposure process while adjusting the imaging characteristic via the projection optical system PL and the liquid LQ by driving the optical elements 264a, 264b of the projection optical system PL and/or adjusting the internal pressures of the first and second tightly closed chambers 265A, 265B on the basis of the correction amounts determined as described above (FIG. 21).

During the scanning exposure, a part of the image of the pattern of the mask M is projected onto the projection area AR1. The mask M is moved at the velocity V in the –X direction (or in the +X direction) with respect to the projection optical system PL, in synchronization with which the substrate P is moved at the velocity β·v (β represents the projection magnification) in the +X direction (or in the –X direction) by the aid of the substrate stage PST. After the exposure is completed for one shot area, the next shot area is moved to the scanning start position in accordance with the stepping movement of the substrate P. The exposure process is successively performed thereafter for the respective shot areas in the step-and-scan manner. This embodiment is established such that the liquid LQ is allowed to flow in parallel to the direction of movement of the substrate P in the same direction as the direction of movement of the substrate P. In other words, when the scanning exposure is performed while moving the substrate P in the scanning direction (–X direction) indicated by the arrow Xa (see FIG. 22), the supply tube 212, the supply nozzles 213A to 213C, the recovery tube 222, and the recovery nozzles 223A, 223B are used to supply and recover the liquid LQ by the liquid supply mechanism 210 and the liquid recovery mechanism 220. That is, when the substrate P is moved in the –X direction, then the liquid LQ is supplied to the space between the projection optical system PL and the substrate P by the supply nozzles 213 (213A to 213C), and the liquid LQ is recovered from the surface of the substrate P by the recovery nozzles 223 (223A, 223B). The liquid LQ is allowed to flow in the –X direction so that the space between the substrate P and the optical element 260 disposed at the end portion of the projection optical system PL is filled therewith. On the other hand, when the substrate P is moved in the scanning direction (+X direction) indicated by the arrow Xb (see FIG. 22) to perform the scanning exposure, the supply tube 215, the supply nozzles 216A to 216C, the recovery tube 225, and the recovery nozzles 226A, 226B are used to supply and recover the liquid LQ by the liquid supply mechanism 210 and the liquid recovery mechanism 220. That is, when the substrate P is moved in the +X direction, then the liquid LQ is supplied to the space between the projection optical system PL and the substrate P by the supply nozzles 216 (216A to 216C), and the liquid LQ is recovered from the surface of the substrate P by the recovery nozzles 226 (226A, 226B). The liquid LQ is allowed to flow in the +X direction so that the space between the substrate P and the optical element 260 disposed at the end portion of the projection optical system PL is filled therewith. In this procedure, for example, the liquid LQ, which is supplied via the supply nozzles 213, flows so that the liquid LQ is attracted and introduced into the space between the optical element 260 and the substrate P in accordance with the movement of the substrate P in the –X direction. Therefore, even when the supply energy of the liquid supply mechanism 210 (liquid supply section 211) is small, the liquid LQ can be easily supplied to the space between the optical element 260 and the substrate P. When the direction of the flow of the liquid LQ is switched depending on the scanning direction, the space between the optical element 260 and the substrate P can be filled with the liquid LQ even when the substrate P is subjected to the scanning in any one of the +X direction and the –X direction. It is possible to obtain the high resolution and the wide depth of focus.

In the embodiment described above, the liquid is supplied by the liquid supply mechanism 210 and the liquid is recovered by the liquid recovery mechanism 220 during the measuring operation performed by the spatial image-measuring unit 270 so that the liquid LQ flows between the slit plate 275 and the optical element 260 of the projection optical system PL. However, when the radiation of the light beam scarcely causes the temperature change of the liquid LQ and the deterioration of the liquid LQ, it is also allowable to adopt the following procedure. That is, the liquid LQ is supplied by the liquid supply mechanism 210 before the measurement. Both of the operations of the liquid supply by the liquid supply mechanism 210 and the liquid recovery by the liquid recovery mechanism 220 are stopped during the measuring operation. The liquid LQ is recovered by the liquid recovery mechanism 220 after the completion of the measuring operation.

Twelfth Embodiment

A twelfth embodiment of the present invention will be explained below. In the following description, the constitutive portions, which are the same as or equivalent to those of the eleventh embodiment described above, are designated by the same reference numerals, any explanation of which will be simplified or omitted.

Figure 32:
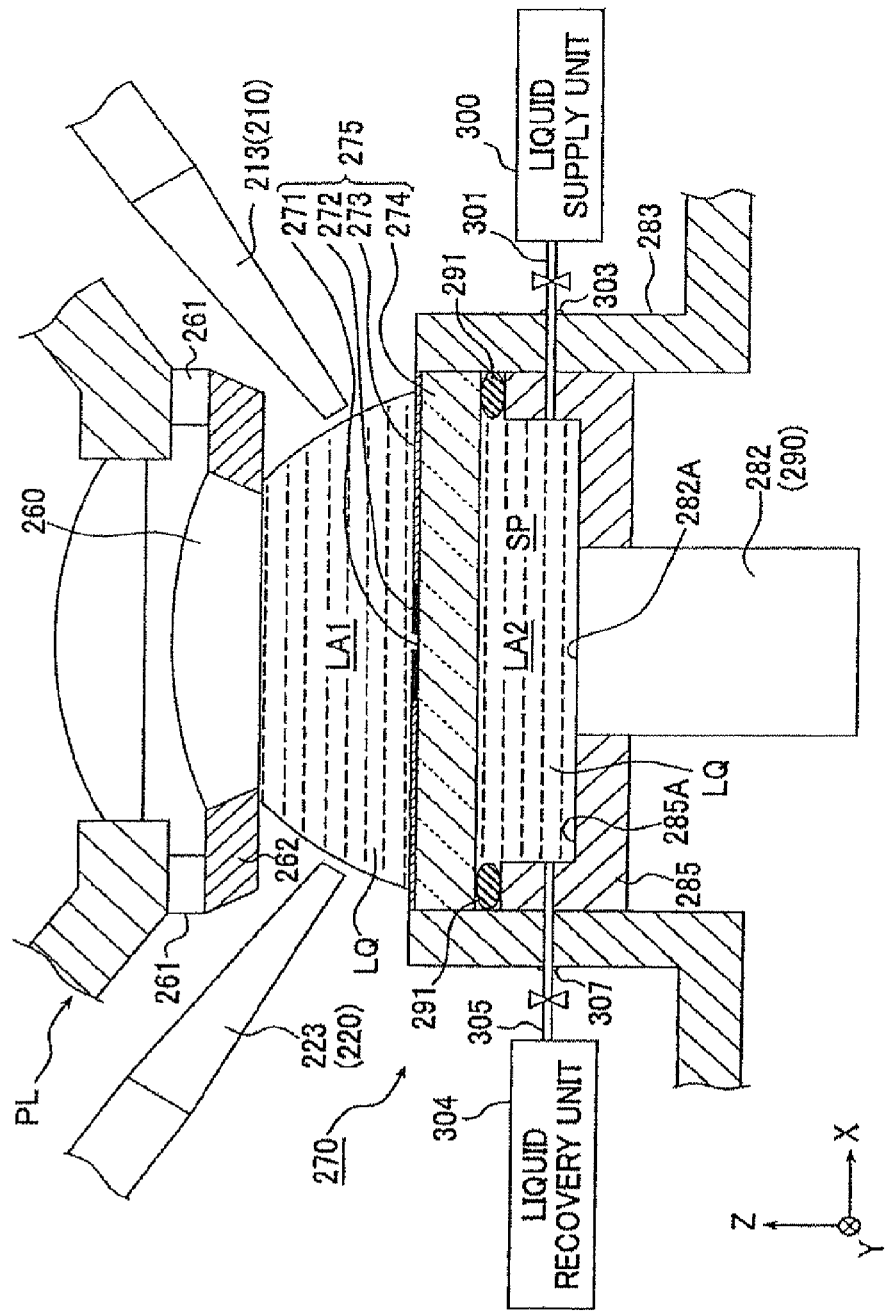
FIG. 32 shows a magnified view illustrating major parts to depict another embodiment of an optical member and a light receiver according to the present invention.

FIG. 32 shows another embodiment of the spatial image-measuring unit 270. With reference to FIG. 32, the optical sensor 282, which is included in the light receiver 290 of the spatial image-measuring unit 270, is arranged at a position nearest to the slit plate 275. The space SP between the optical sensor 282 and the slit plate 275 is filled with the liquid LQ. The optical sensor 282 is retained by the holding member 285. The light-receiving surface 282A of the optical sensor 282 is flush with the inner bottom surface 285A of the holding member 285. Even when the arrangement as described above is adopted, the optical sensor 282 can satisfactorily receive the light beam which has passed through the projection optical system PL, the first liquid immersion area LA1, the slit plate 275, and the second liquid immersion area LA2.

Thirteenth Embodiment

Figure 33:
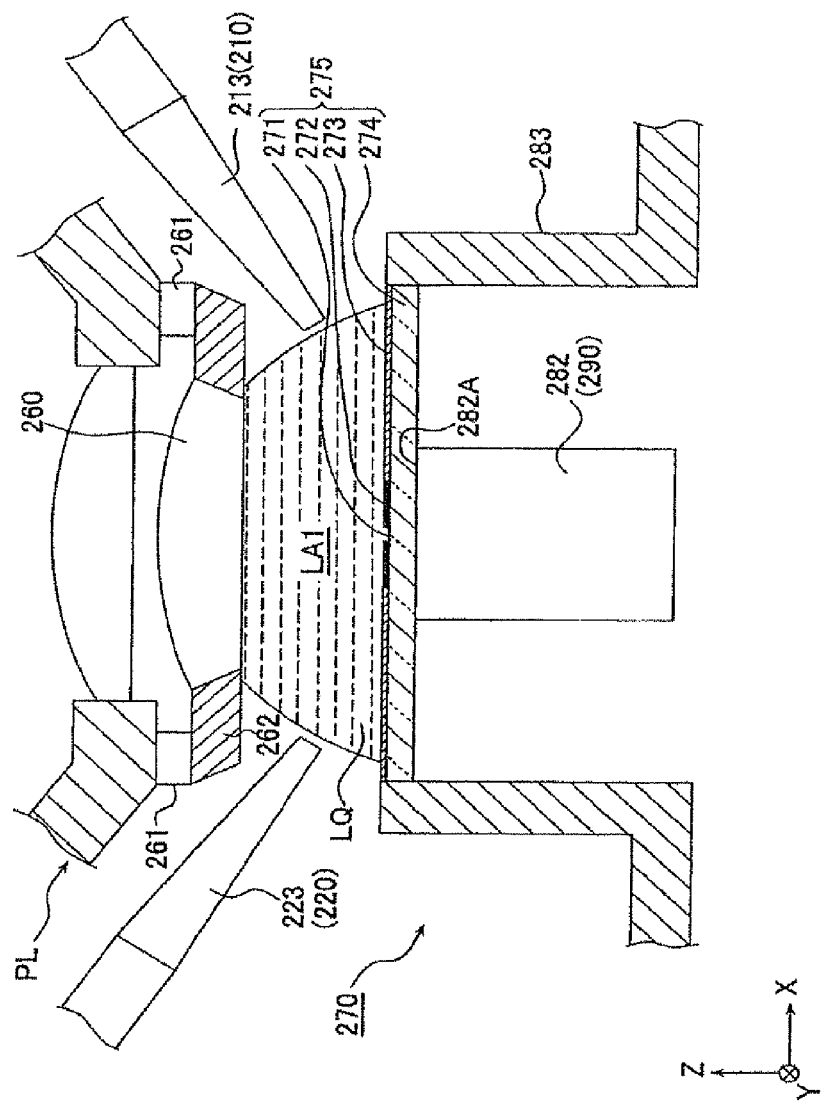
FIG. 33 shows a magnified view illustrating major parts to depict another embodiment of an optical member and a light receiver according to the present invention.

FIG. 33 shows another embodiment of the spatial image-measuring unit 270. As shown in FIG. 33, the light-receiving surface 282A of the optical sensor 282 makes tight contact with the lower surface of the slit plate 275. That is, in the embodiment shown in FIG. 33, the second liquid immersion area LA2 is not formed. Even when the space between the projection optical system PL and the slit plate 275 is filled with the liquid LQ to substantially improve the numerical aperture NA of the projection optical system PL by arranging the optical sensor 282 of the light receiver 290 so that the optical sensor 282 makes contact with the slit plate 275 as described above, the light receiver 290 (light-receiving element 282) can satisfactorily receive the light beam which has passed through the projection optical system PL.

In the case of the arrangement in which the optical sensor 282 is in contact with the slit plate 275, it is preferable that the slit plate 275 (glass plate member 274) is as thin as possible to such an extent that the slit plate 275 (glass plate member 274) is not warped by the weight of the liquid LQ in the first liquid immersion area LA1. Further, it is also possible to adopt such an arrangement that the light-receiving surface 282A of the light-receiving sensor 282 is exposed upwardly from the glass plate member 274. On the other hand, when the slit plate 275 (glass plate member 274) is provided on the light-receiving surface 282A of the optical sensor 282 without exposing the light-receiving surface 282A, the liquid immersion area LA1 can be formed satisfactorily, because the flat area is increased.

An adhesive can be used to join the optical sensor 282 to the lower surface of the slit plate 275. In this arrangement, it is desirable that the adhesive has a high transmittance with respect to the exposure beam, and the adhesive has such a refractive index that the exposure beam, which is which has passed through the slit section (light-transmitting section) 271, successfully comes into the light-receiving surface 282A of the optical sensor 282.

The embodiment shown in FIG. 33 is constructed such that the optical sensor 282 makes tight contact with the lower surface of the slit plate 275. However, a light-receiving element may be formed by the patterning on the lower surface of the slit plate 275 (glass plate member 274).

Fourteenth Embodiment

As described above, when the imaging characteristic of the projection optical system PL is measured in the slit scan manner, the light beam is radiated onto the light receiver 290 (optical element 276) through the liquid LQ while moving the slit plate 275 (slit section 271) relative to the light beam (exposure beam EL) which has passed through the projection optical system PL. In this case, there is a possibility that the following inconvenience arises. That is, the projection optical system PL (optical element 260 disposed at the end portion) may be vibrated through the liquid LQ in the first liquid immersion area LA1 between the projection optical system PL and the slit plate 275 during the light-receiving operation performed by the light receiver 290 due to the movement of the slit plate 275. Further, the slit plate 275 may be warped or fluctuated by the force of the liquid LQ to deteriorate the spatial image measurement accuracy.

Figure 34:
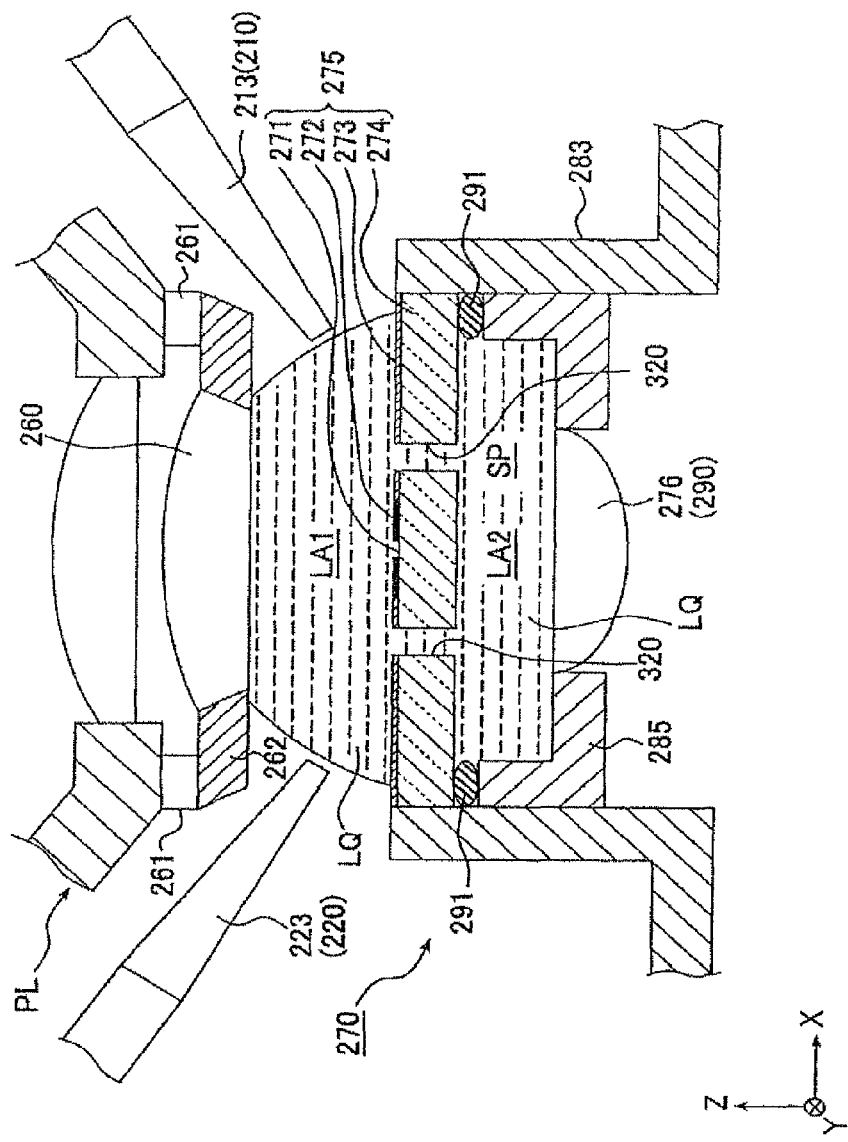
FIG. 34 shows a magnified view illustrating major parts to depict another embodiment of an optical member and a light receiver according to the present invention.

Accordingly, in this embodiment, as shown in FIG. 34, through-holes 320 are provided at predetermined positions of the slit plate 275. In this way, even when the slit plate 275 is moved with respect to the projection optical system PL, the liquid LQ, which is included in the first liquid immersion area LA1 between the projection optical system PL and the slit plate 275, can escape to the space SP via the through-holes 320. Therefore, even when the slit plate 275 is moved, no difference arises between the pressure of the liquid LQ in the first liquid immersion area LA1 between the projection optical system PL and the slit plate 275 and the pressure of the liquid LQ in the second liquid immersion area LA2 between the slit plate 275 and the light receiver 290 (optical element 276). Any inconvenience does not arise, which would be otherwise caused such that the slit plate 275 is warped. When the slit plate 275 is moved, the liquid LQ in the first liquid immersion area LA1 is also moved in the lateral direction (in the surface direction of the slit plate 275). However, when the liquid LQ is allowed to be movable in the vertical direction as well by providing the through-holes 320, it is possible to more appropriately avoid the occurrence of the inconvenience of the warpage of the slit plate 275 or the like. No large pressure fluctuation of the liquid LQ is caused as well in the first liquid immersion area LA1 between the projection optical system PL and the slit plate 275, because the liquid LQ is movable between the first liquid immersion area LA1 and the second liquid immersion area LA2 via the through-holes 320. Therefore, it is possible to avoid the occurrence of the inconvenience which would be otherwise caused such that the projection optical system PL is fluctuated (vibrated) due to the pressure fluctuation of the liquid LQ caused by the movement of the slit plate 275.

Figure 35:
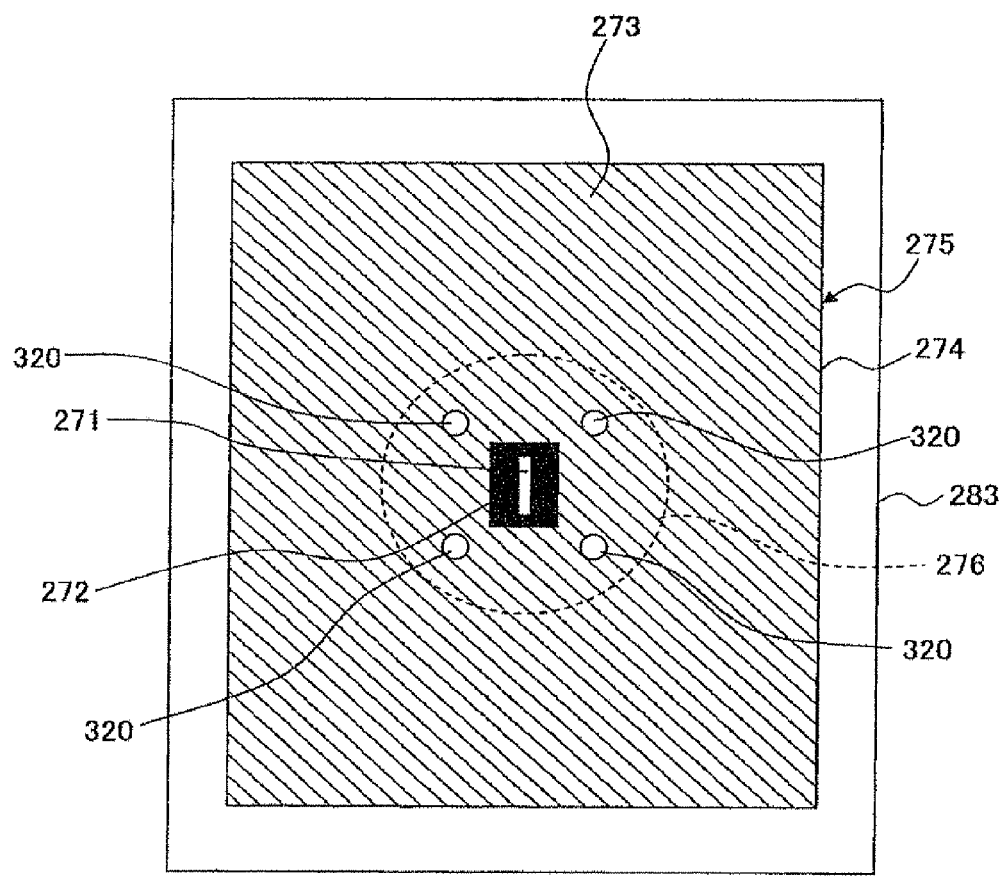
FIG. 35 shows a plan view illustrating the optical member shown in FIG. 34.

FIG. 35 shows a plan view illustrating the slit plate 275 shown in FIG. 34. As shown in FIG. 35, a plurality of the through-holes 320 are provided, i.e., the four through-holes 320 are provided in this embodiment. The plurality of (four) through-holes 320 are provided at the positions at which the through-holes 320 are opposed to one another with the slit section 271 of the slit plate 275 intervening therebetween respectively. The through-holes 320 are provided inside the first liquid immersion area LA1 of the liquid LQ with which the space between the projection optical system PL and the slit plate 275 is filled. Accordingly, even when the slit plate 275 is moved, the liquid LQ in the first liquid immersion area LA1 can escape to the space SP via the through-holes 320. The through-holes 320 are formed so that the through-holes 320 are opposed to one another while interposing the slit section 271 provided at the substantially central portion of the slit plate 275. The through-holes 320 are formed at the positions of point symmetry with respect to the center of the slit plate 275 respectively. Therefore, it is possible to maintain the surface accuracy (flatness) of the slit plate 275.

The number of the through-holes 320 is not limited to four. An arbitrary number of the through-holes 320 may be provided. Alternatively, the number of the through-hole 320 may be one. As shown in FIG. 35, the through-holes 320 are provided at equal intervals to surround the slit section 271 in this embodiment. However, the through-holes 320 may be provided at unequal intervals. Further, the distances between the slit section 271 (or the center thereof) and the plurality of through-holes 320 may be either identical to one another or different from each other.

When the space SP is filled with the liquid LQ in order to form the second liquid immersion area LA2 when the through-holes 320 are provided for the slit plate 275, the following arrangement is also available in addition to the arrangement in which the liquid supply unit 300 and the liquid recovery unit 304 are used as explained with reference to, for example, FIG. 25. That is, the liquid supply mechanism 210 may be used to supply the liquid LQ to the space SP between the slit plate 275 and the light receiver 290 (optical element 276) via the through-holes 320. Further, the liquid recovery mechanism 220 may be used to recover the liquid LQ from the space SP between the slit plate 275 and the light receiver 290 (optical element 276) via the through-holes 320. That is, the second liquid immersion area LA2 may be formed between the slit plate 275 and the light receiver 290 (optical element 276) by using the liquid supply mechanism 210 capable of supplying the liquid LQ to the space between the projection optical system PL and the substrate P during the exposure process and the liquid recovery mechanism 220 capable of recovering the liquid LQ from the space between the projection optical system PL and the substrate P.

Figure 36A:
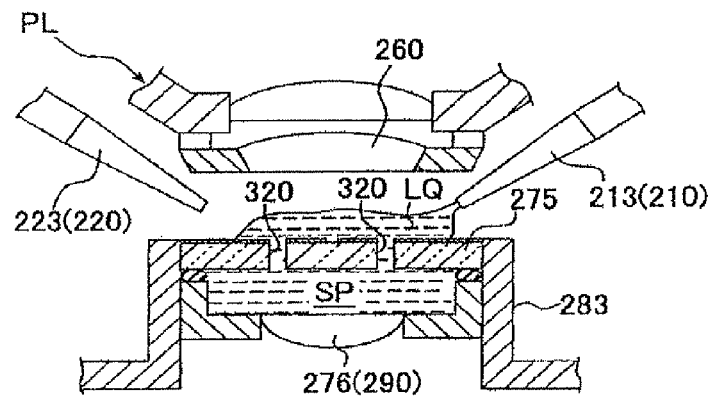
FIGS. 36A to 36C show an exemplary procedure for forming the liquid immersion area.
Figure 36B:
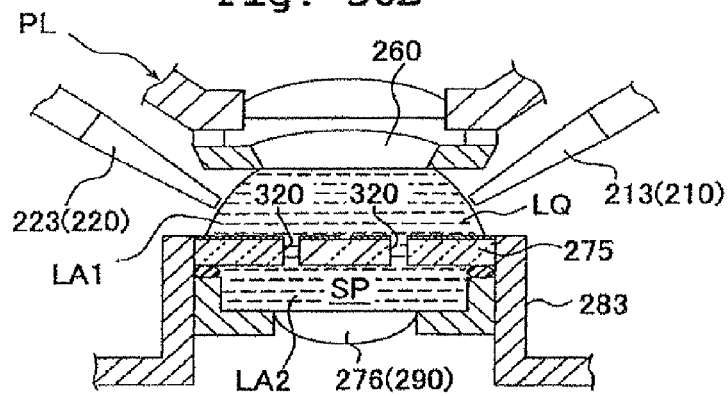

When the second liquid immersion area LA2 is formed by using the liquid supply mechanism 210, the liquid supply mechanism 210 supplies the liquid LQ to the space SP via the through-holes 320 from the supply nozzles 213 as shown in FIG. 36A. The liquid LQ on the slit plate 275 (including the liquid LQ allowed to overflow from the space SP via the through-holes 320) is recovered from the recovery nozzles 223 of the liquid recovery mechanism 220. Accordingly, as shown in FIG. 36B, the first liquid immersion area LA1 and the second liquid immersion area LA2 are formed respectively by using the liquid supply mechanism 210 and the liquid recovery mechanism 220.

Figure 36C:
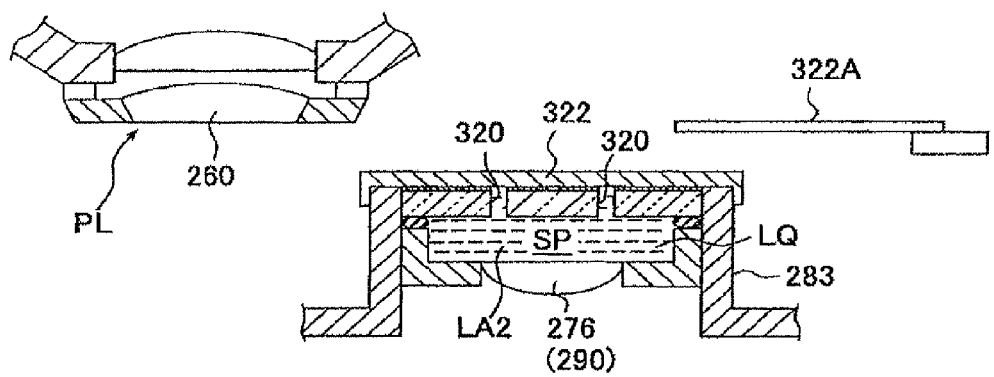

The light beam (exposure beam EL), which has passed through the projection optical system PL, is received by the light receiver 290 through the liquid LQ and the slit plate 275, and then the liquid recovery mechanism 220 recovers the liquid LQ from the first liquid immersion area LA1 on the slit plate 275. After that, the substrate stage PST is moved in order to perform the exposure process, and the projection optical system PL and the substrate P are opposed to one another. However, in this situation, the slit plate 275 is retracted from the position under the projection optical system PL as shown in FIG. 36C. A lid member 322 is placed on the through-holes 320 of the slit plate 275 having been retracted from the position under the projection optical system PL. In this embodiment, the lid member 322 closes the through-holes 320 by covering the entire slit plate 275 therewith. The lid member 322 is placed on the slit plate 275 by an arm 322A which constitutes a lid mechanism. The exposure process is performed for the substrate P in the state in which the through-holes 320 are closed by the lid member 322. The substrate stage PST is moved during the exposure process for the substrate P. However, there is such a possibility that the liquid LQ in the space SP may be leaked (scattered) to the outside via the through-holes 320 in accordance with the movement of the substrate stage PST. Accordingly, the through-holes 320 are closed by the lid member 322 at least during the exposure process for the substrate P, and thus it is possible to avoid the inconvenience which would be otherwise caused such that the liquid LQ in the space SP leaks to the outside via the through-holes 320. Further, it is also possible to avoid the inconvenience which would be otherwise caused such that the liquid LQ in the space SP is vaporized to change the environment in which the exposure apparatus EX is placed. When the light beam is detected through the liquid LQ by using the light receiver 290, then the arm 322A detaches the lid member 322 from the slit plate 322, and then the first and second liquid immersion areas LA1, LA2 are formed by using the liquid supply mechanism 210 and the liquid recovery mechanism 220 as shown in FIGS. 36A and 36B. The lid mechanism is not limited to the form as explained above. For example, the following arrangement is also available. That is, a lid member is attached by the aid of a hinge section to a predetermined position of the slit plate 275 or the projection 283. An actuator is used to open the lid member during the measurement process performed by the light receiver 290 and close the lid member during the exposure process for the substrate P.

Fifteenth Embodiment

Figure 37:
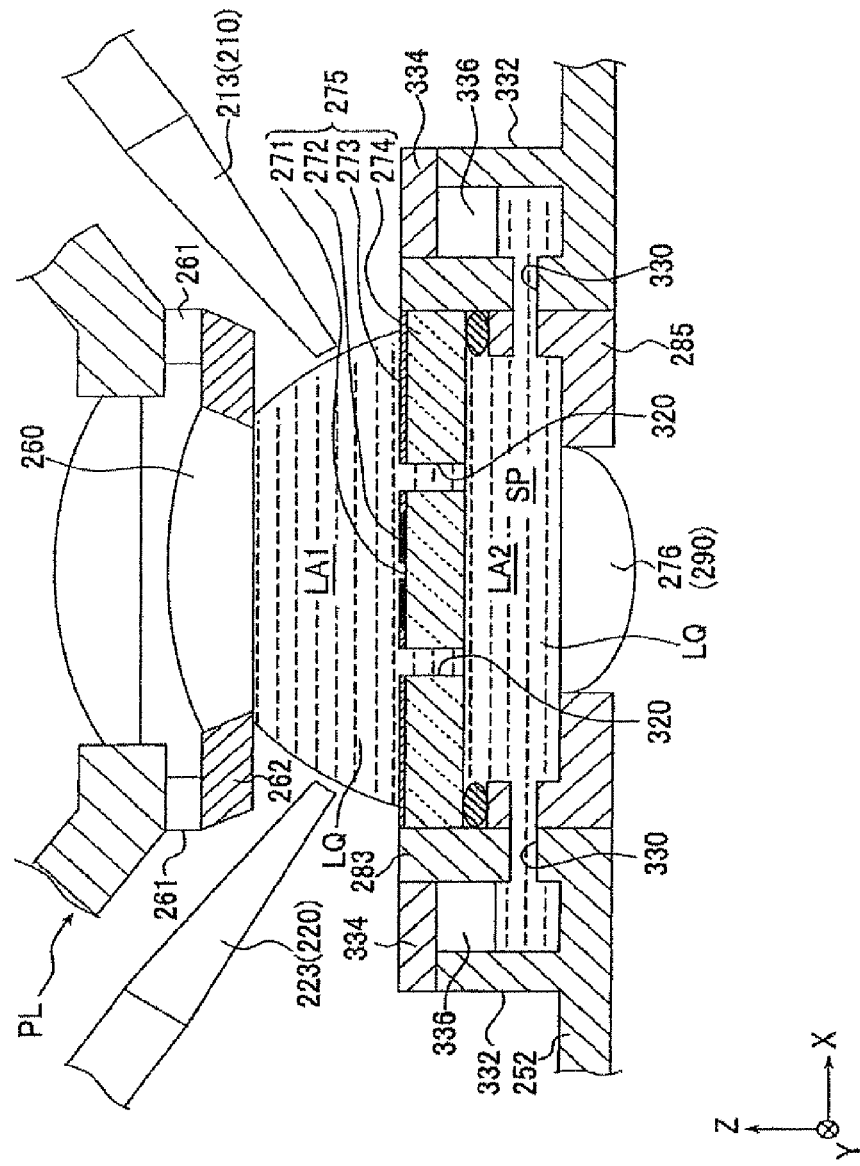
FIG. 37 shows a magnified view illustrating major parts to depict another embodiment of an optical member and a light receiver according to the present invention.
Figure 38:
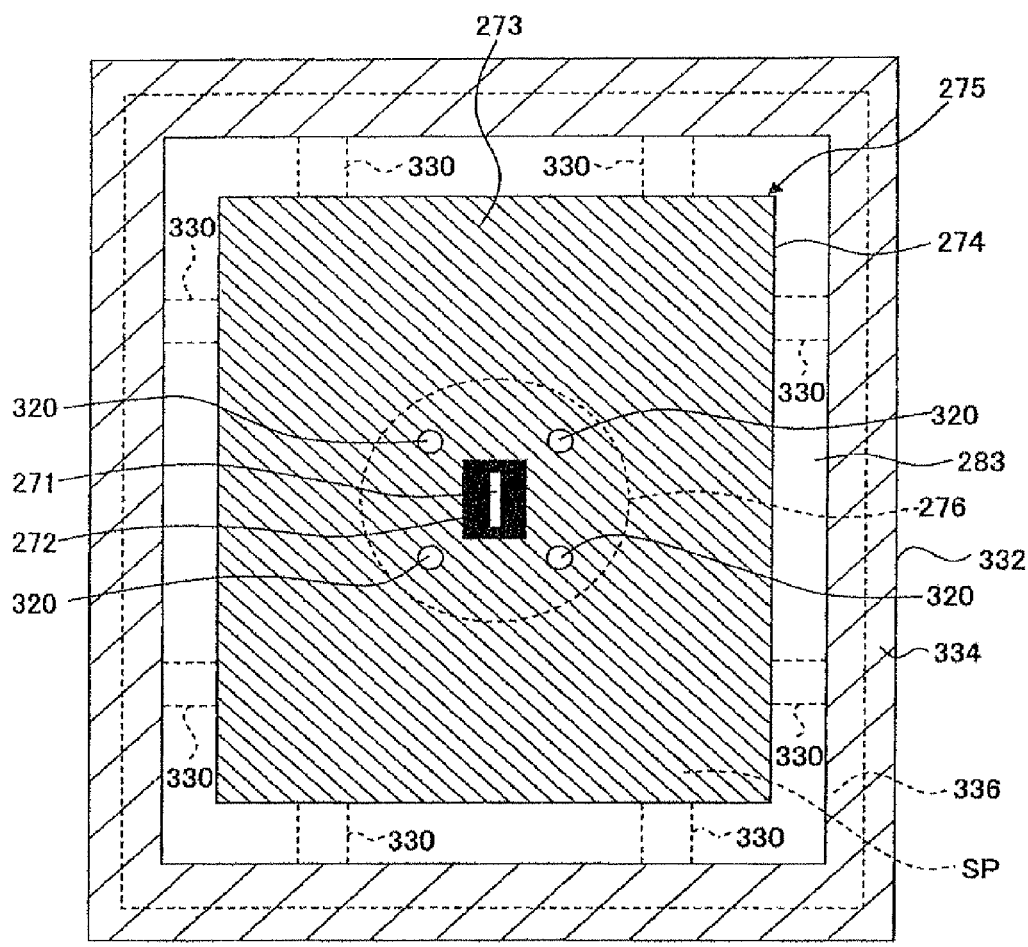
FIG. 38 shows a plan view illustrating the optical member shown in FIG. 37.

As for the holes (communicating passages) for making communication between the outside and the inside of the space SP between the slit plate 275 and the light receiver 290, it is also allowable to form second through-holes provided outside the first liquid immersion area LA1 as shown in FIG. 37, in addition to the through-holes 320 provided for the slit plate 275. FIG. 37 shows a sectional view illustrating an example in which the second through-holes 330 are formed, and FIG. 38 shows a plan view. With reference to FIGS. 37 and 38, a circumferential wall 332 is provided around the projection 283 on the upper surface of the Z tilt stage 252 so that the projection 283 is surrounded thereby. A lid member 334 is provided on the circumferential wall 332. A buffer space 336 is formed by the projection 283, the circumferential wall 332, and the lid member 334. The second through-holes 330, which connect the space SP and the buffer space 336, are formed at predetermined positions of the walls of the projection 283 and the holding member 285. In this embodiment, as shown in FIG. 38, a plurality of (eight in this embodiment) second through-holes 330 are provided at predetermined intervals around the space SP. The number and the arrangement of the second through-hole or through-holes 330 can be arbitrarily established. Owing to the provision of the second through-holes 330, even when the slit plate 275 is moved to change the volume of the first liquid immersion area AR1, the liquid LQ in the second liquid immersion area LA2 connected to the first liquid immersion area LA1 via the through-holes 320 can escape to the buffer space 330 via the second through-holes 330. Therefore, it is possible to further avoid the inconvenience such as the pressure fluctuation in the first liquid immersion area LA1.

Figure 39:
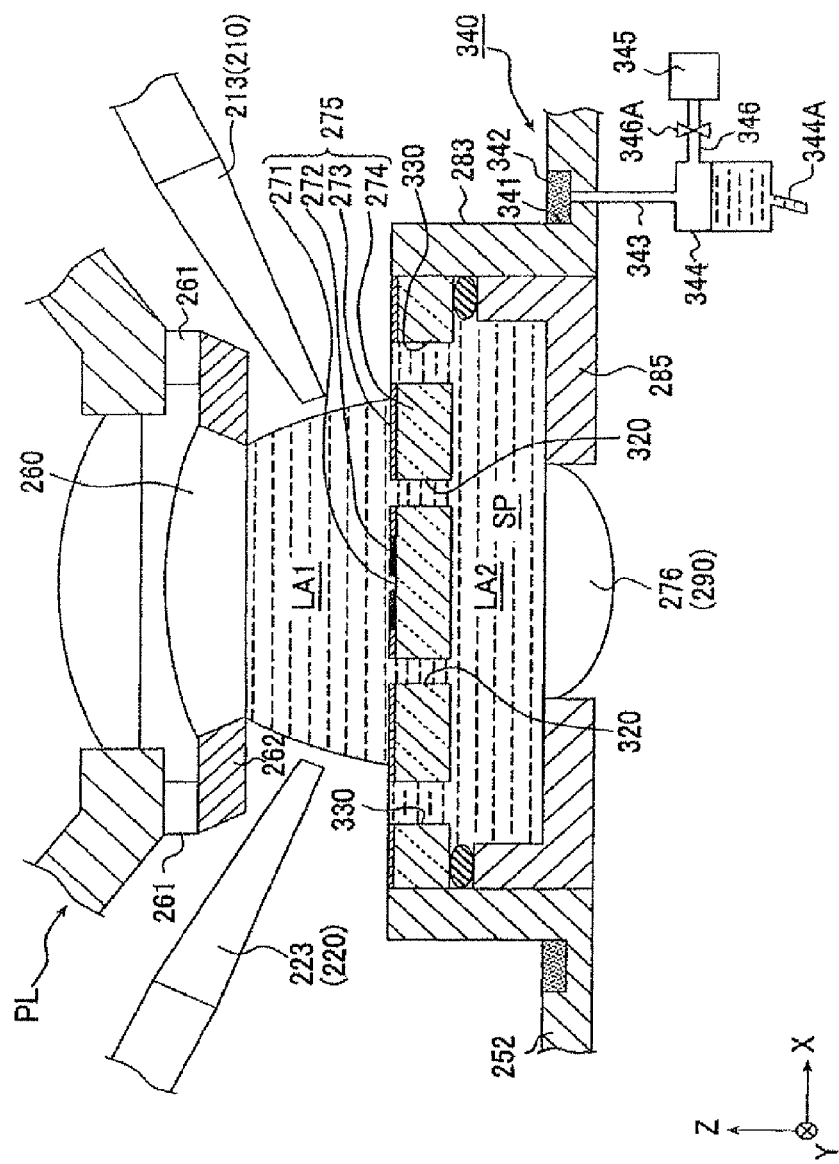
FIG. 39 shows a magnified view illustrating major parts to depict another embodiment of an optical member and a light receiver according to the present invention.
Figure 40:
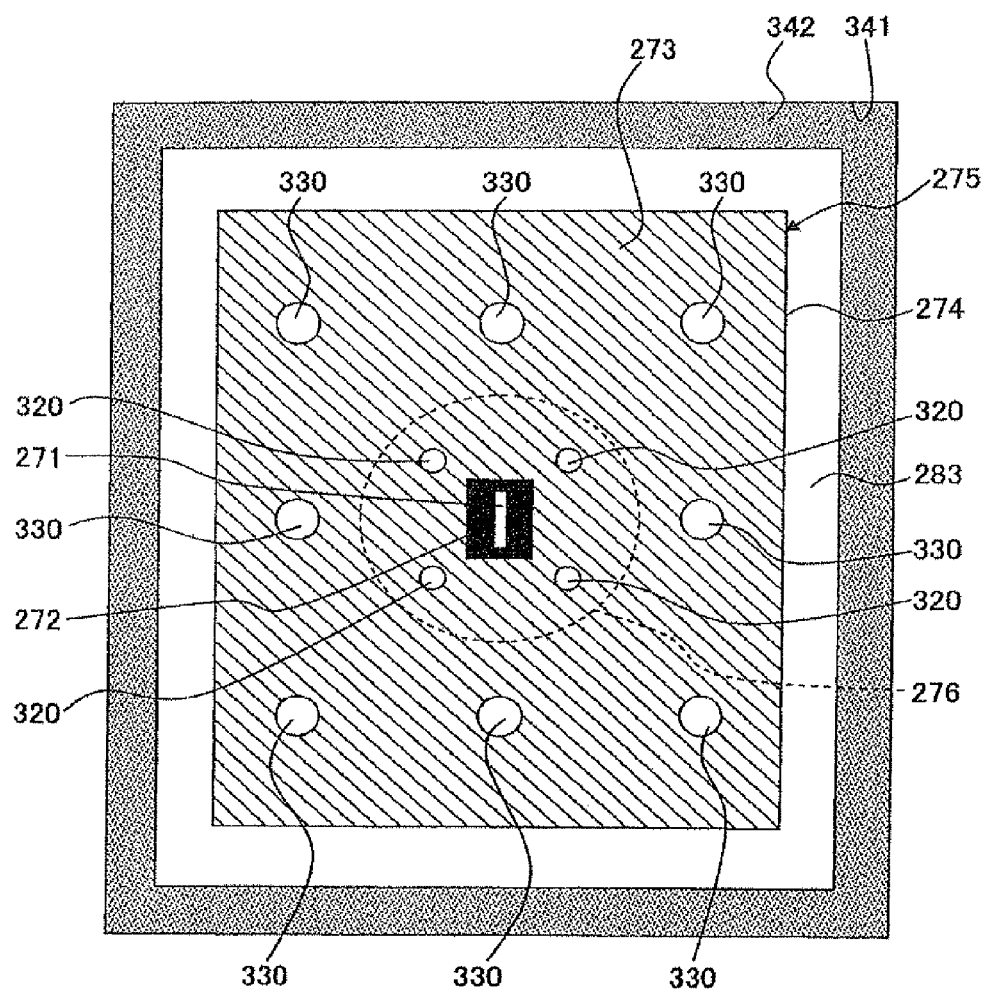
FIG. 40 shows a plan view illustrating the optical member shown in FIG. 39.

As shown in FIG. 39, second through-holes 330 may be provided for the slit plate 275 as a modified embodiment of the embodiment shown in FIGS. 37 and 38. The second through-holes 330 are provided outside the first liquid immersion area LA1. FIG. 40 shows a plan view illustrating the slit plate 275 shown in FIG. 39. As shown in FIG. 40, a plurality of (eight in this embodiment) second through-holes 330 are provided. The plurality of (eight) second through-holes 330 are provided at positions at which the second through-holes 330 are opposed to one another with the slit section 271 of the slit plate 275 intervening therebetween respectively. Accordingly, when the liquid LQ in the first liquid immersion area LA1 escapes to the space SP via the through-holes 320 when the slit plate 275 is moved, the liquid LQ in the space SP can escape to the outside via the second through-holes 330.

When the liquid LQ overflows from the second through-holes 330 formed for the slit section 275, the liquid LQ outflows to the outside of the slit plate 275 (projection 283). However, a recovery mechanism 304, which recovers the liquid LQ allowed to outflow from the second through-holes 330, is provided around the projection 283 provided with the slit plate 275 on the Z tilt stage 252. The recovery mechanism 340 comprises a groove 341 which is provided around the projection 283 on the Z tilt stage 252, a porous member 342 which is arranged in the groove 341 and which is composed of a porous ceramics or a sponge-like member capable of retaining the liquid LQ, a tank 344 which serves as a liquid-accommodating section connected to the groove 341 via a flow passage 343, and a vacuum system 345 which is composed of a vacuum pump or the like connected to the tank 344 via a flow passage 346. The flow passage 346 is provided with a valve 346A which opens/closes the flow passage 346. A discharge flow passage 344A is connected to the tank 344. The liquid LQ, which outflows to the surrounding of the projection 283 from the second through-holes 330, is retained by the porous member 342 arranged in the groove 341. The recovery mechanism 340 recovers the liquid LQ in the groove 341 (porous member 342) so that the liquid LQ is sucked together with the surrounding gas by driving the vacuum system 345 in a state in which the flow passage 346 is open by operating the valve 346A. The recovered liquid LQ is collected in the tank 344. When the liquid LQ is pooled in the tank 344, the liquid LQ is discharged from the discharge flow passage 344A. In this situation, the liquid LQ is collected at the lower portion of the tank 344. Therefore, the liquid LQ does not flow into the vacuum system 345. In other words, the liquid LQ recovered from the groove 341 and the surrounding gas are subjected to the gas/liquid separation in the tank 344. Owing to the provision of the recovery mechanism 340, it is possible to avoid the inconvenience which would be otherwise caused such that the liquid LQ, which is allowed to outflow from the second through-holes 330 and the first liquid immersion area LA1, remains on the Z tilt stage 252.

A variable mechanism, which changes the size of the through-hole 320, may be provided for the through-hole 320 (or the second through-hole 330). For example, when the through-holes 320 (or the second through-holes 330) are increased in size during the measurement of the spatial image, then it is possible to lower the viscous resistance of the liquid LQ when the liquid LQ passes through the through-holes 320, and the liquid LQ can be moved smoothly. When the through-holes 320 are increased in size, the liquid LQ is easily poured into the space SP via the through-holes 320 as explained with reference to FIG. 36. When the operation other than the measurement of the spatial image is performed (specifically during the exposure operation), the variable mechanism is used to decrease the through-holes 320 (or the second through-holes 330) in size or close the through-holes 320 (or the second through-holes 330). Accordingly, it is possible to avoid the occurrence of the inconvenience which would be otherwise caused such that the liquid LQ in the space SP is vaporized to change the environment in which the exposure apparatus EX is placed and/or the liquid LQ outflows to the outside of the space SP in accordance with the movement of the substrate stage PST.

Sixteenth Embodiment

Figure 41:
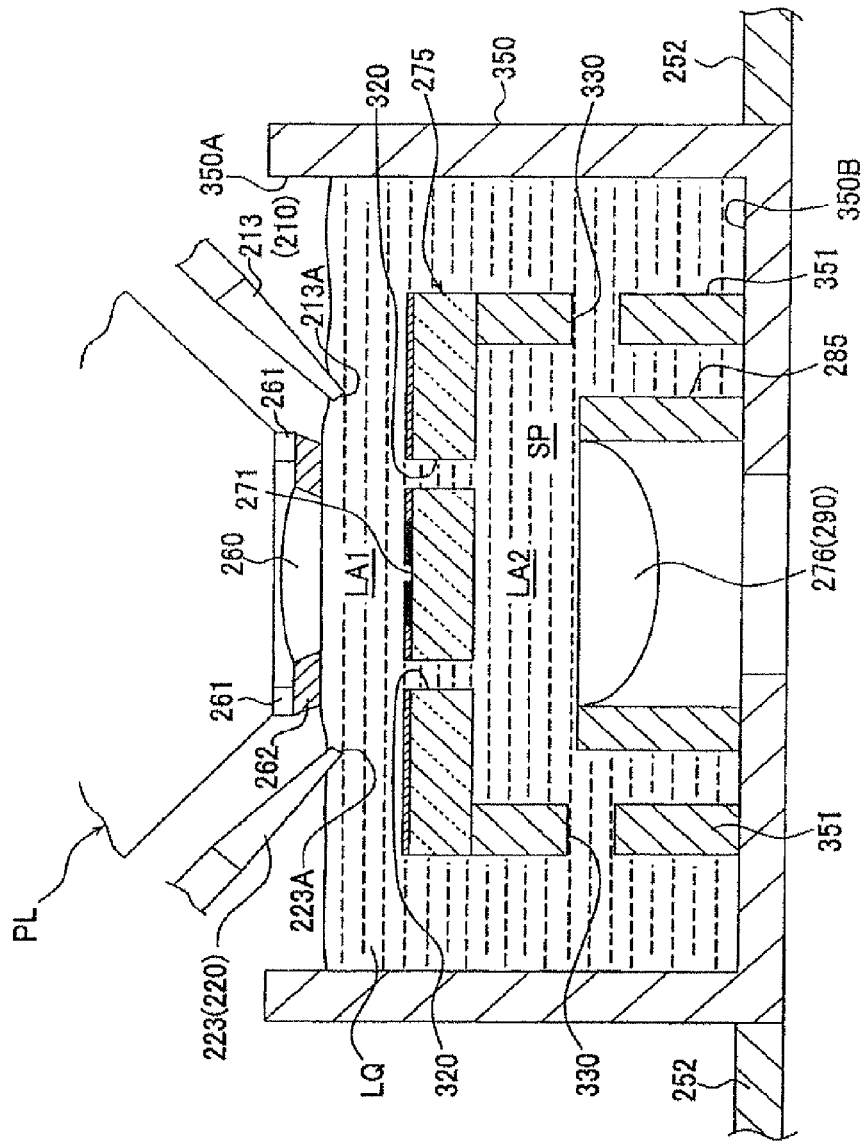
FIG. 41 shows a magnified view illustrating major parts to depict another embodiment of an optical member and a light receiver according to the present invention.

The respective embodiments of the eleventh to fifteenth embodiments described above are constructed such that the first liquid immersion area LA1 is locally formed in a part of the area on the slit plate 275. However, as shown in FIG. 41, the entire slit plate 275 may be immersed in the liquid LQ. With reference to FIG. 41, a gutter member 350 is provided on the Z tilt stage 252. The slit plate 275 is supported by a support member 351 attached onto the bottom section 350B of the gutter member 350. An optical element 276, which is retained by a holding member 285, is arranged under the slit plate 275 (on the downstream side of the optical path). The holding member 285 is also attached to the bottom section 350B of the gutter member 350. Second through-holes 330, which make communication between the outside and the inside of the space SP between the slit plate 275 and the optical element 276, are provided for the support member 351. The upper end of the opening 350A of the gutter member 350 is disposed at the position higher than those of the slit plate 275, the supply ports 213A of the liquid supply nozzles 213, and the recovery ports 223A of the liquid recovery nozzles 223.

When the first liquid immersion area LA1 and the second liquid immersion area LA2 are formed, then the projection optical system PL is opposed to the slit plate 275 disposed in the gutter member 350, and then the liquid supply mechanism 210 is driven to supply the liquid LQ into the gutter member 350 from the supply nozzles 213. The space between the slit plate 275 and the optical element 260 disposed at the end portion of the projection optical system PL is filled with the liquid LQ supplied into the gutter member 350 to form the first liquid immersion area LA1. Further, the liquid LQ passes through the through-holes 320 and the second through-holes 330, and the space SP between the slit plate 275 and the optical element 276 is filled with the liquid LQ to form the second liquid immersion area LA2. Concurrently therewith, the liquid recovery mechanism 220 is driven to recover the liquid LQ contained in the gutter member 350 from the recovery nozzles 223. Accordingly, the interior of the gutter member 350 is filled with a predetermined amount of the liquid LQ.

Figure 42:
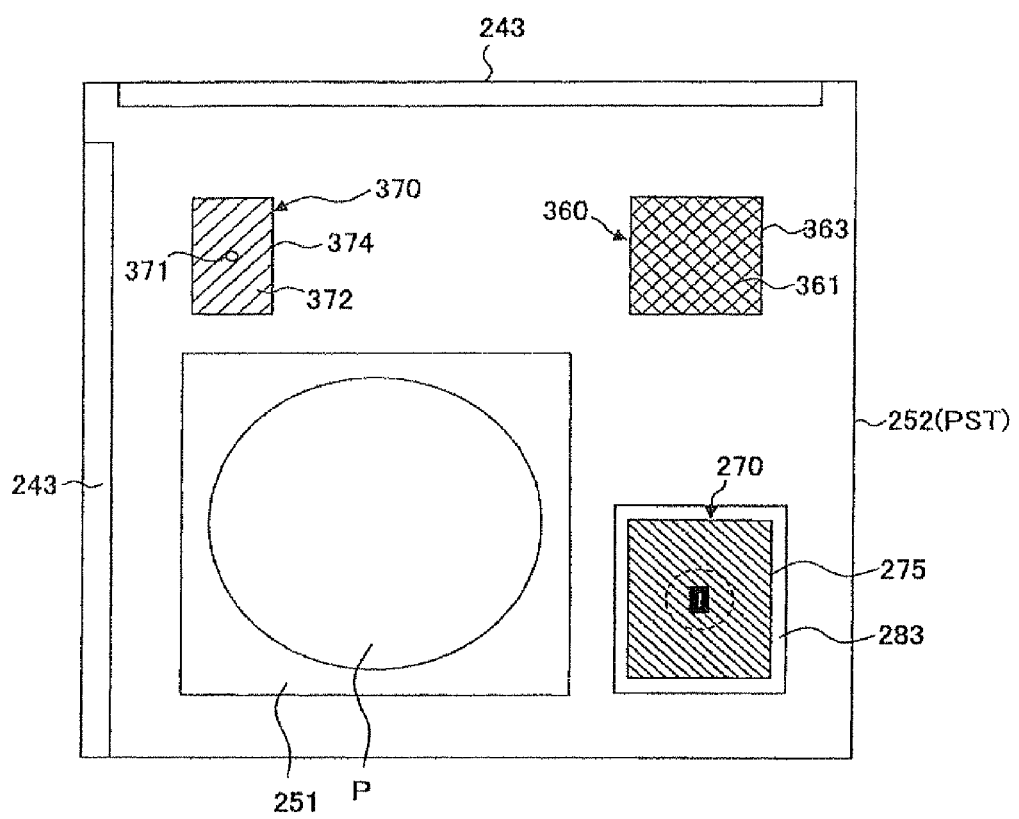
FIG. 42 shows a plan view illustrating a state in which a plurality of light receivers are arranged on a substrate stage.

The eleventh to sixteenth embodiments described above have been explained as exemplified by the case in which the optical member (slit plate) 275 and the light receiver 290 are applied to the spatial image-measuring unit 270 for measuring the imaging characteristic of the projection optical system PL. However, as shown in FIG. 42, those provided on the substrate stage PST other than the spatial image-measuring unit 270 also include, for example, a dose sensor (illuminance sensor) 360 which measures the information about the radiation amount of the light beam which has passed through the projection optical system PL and which is disclosed, for example, in Japanese Patent Application Laid-open No. 11-16816 (corresponding to United States Patent Publication No. 2002/0061469), and an irradiation irregularity sensor 370 which is disclosed, for example, in Japanese Patent Application Laid-open No. 57-117238 (corresponding to U.S. Pat. No. 4,465,368) and U.S. Pat. No. 6,002,467. The present invention is also applicable to the dose sensor 360 and the irradiation irregularity sensor 370 as described above. The disclosures of the patent documents are incorporated herein by reference within a range of permission of the domestic laws and ordinances of the state designated or selected in this international application.

Figure 43:
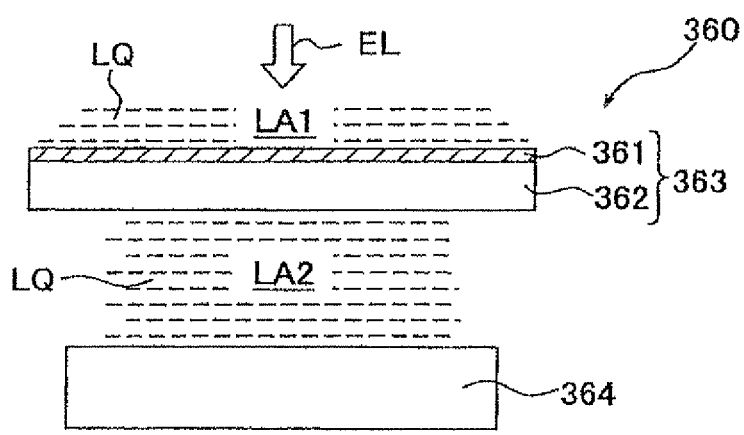
FIG. 43 shows a magnified view illustrating major parts to depict another embodiment of an optical member and a light receiver according to the present invention.

FIG. 43 schematically shows the dose sensor 360. The dose sensor 360 measures the radiation amount (illuminance) of the exposure beam radiated onto the image plane side of the projection optical system PL. The dose sensor 360 comprises an upper plate 363 which is provided on the Z tilt stage 252, and an optical sensor 364 which receives the light beam which has passed through the upper plate 363. The upper plate 363 includes a glass plate member 362, and a light transmission amount-adjusting film 361 which is provided on the upper surface of the glass plate member 362. The light transmission amount-adjusting film 361 is composed of, for example, a chromium film. The light transmission amount-adjusting film 361 has a predetermined light transmittance, which is provided on the entire upper surface region of the glass plate member 362. The light amount, which has come into the optical sensor 364, is reduced by providing the light transmission amount-adjusting film 361. Accordingly, the inconvenience such as the saturation and the damage on the optical sensor 364 is avoided, which would be otherwise caused by the radiation of the light beam in an excessive light amount. The dose sensor 360 is used to perform the measuring operation at a predetermined timing, for example, when the mask M is exchanged.

When the radiation amount of the exposure beam EL which has passed through the projection optical system PL is measured by using the dose sensor 360, then the liquid LQ is supplied to the space between the projection optical system PL and the upper plate 363 to form the first liquid immersion area LA1 in a state in which the projection optical system PL and the upper plate 363 are opposed to one another in the same manner as in the embodiment described above, and the liquid LQ is supplied to the space between the upper plate 363 and the optical sensor 364 to form the second liquid immersion area LA2. The exposure beam EL is radiated onto the upper plate 363 via the projection optical system PL and the liquid LQ in the first liquid immersion area LA1. An optical system (optical element) may be arranged between the upper plate 363 and the optical sensor 364. In this arrangement, the second liquid immersion area LA2 is formed between the upper plate 363 and the optical element arranged at the position nearest to the upper plate 363. The optical sensor 364 may be in tight contact with the upper plate 363.

The arrangement, in which the second liquid immersion area LA2 is provided for the dose sensor as explained in this embodiment, may be applied to the dose sensors described in the sixth to eighth embodiments.

Figure 44:
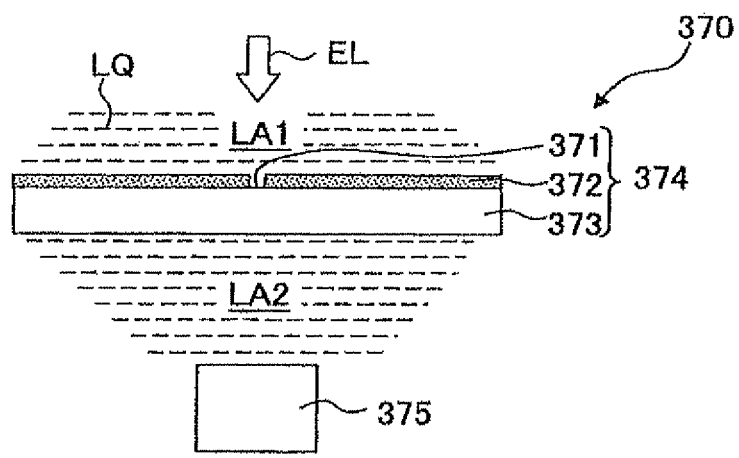
FIG. 44 shows a magnified view illustrating major parts to depict another embodiment of an optical member and a light receiver according to the present invention.

FIG. 44 schematically shows the irradiation irregularity sensor 370. The irradiation irregularity sensor 370 measures, at a plurality of positions, the illuminance (intensity) of the exposure beam radiated onto the image plane side via the projection optical system PL to measure the uneven illuminance (illuminance distribution) of the exposure beam radiated onto the image plane side of the projection optical system PL. The irradiation irregularity sensor 370 comprises an upper plate 374 which is provided on the Z tilt stage 252, and an optical sensor 375 which receives the light beam which has passed through a pinhole section 371 provided for the upper plate 374. The upper plate 374 has a thin film 372 which is provided on the surface of a glass plate member 373 and which contains a light-shielding material such as chromium. The thin film 372 is subjected to the patterning to provide the pinhole section 371 at a central portion thereof.

When the illuminance distribution is measured by using the irradiation irregularity sensor 370, then the space between the projection optical system PL and the upper plate 374 is filled with the liquid LQ in a state in which the projection optical system PL and the upper plate 374 of the irradiation irregularity sensor 370 are opposed to one another, and the space between the upper plate 374 and the optical sensor 375 is also filled with the liquid LQ. The pinhole section 371 is successively moved at a plurality of positions in the radiation area (projection area) onto which the exposure beam EL is radiated. An optical system (optical element) may be arranged between the upper plate 374 and the optical sensor 375. In this arrangement, the second liquid immersion area LA2 is formed between the upper plate 374 and the optical element arranged at the position nearest to the upper plate 374. The upper plate 374 and the optical sensor 375 may be in tight contact with each other.

The arrangement, in which the second liquid immersion area LA2 is provided for the irradiation irregularity sensor as explained in this embodiment, may be applied to the irradiation irregularity sensors described in the second to fifth embodiments and the ninth and tenth embodiments. The structure, which is adopted for the sensor of each of the first to tenth embodiments, may be adopted for the spatial image-measuring unit explained in each of the eleventh to sixteenth embodiments, in place of or in addition to the internal structure of the spatial image-measuring unit explained in each of the eleventh to sixteenth embodiments. Further, the structure, which is explained in the embodiment described above, may be adopted for any one of the spatial image-measuring unit 270, the dose sensor 360, and the irradiation irregularity sensor 370 shown in FIG. 42. Further, the structure explained in the embodiment described above may be adopted for any two or all of them.

The present invention is also applicable to a sensor which is detachable with respect to the substrate stage PST (z stage 51) as disclosed, for example, in Japanese Patent Application Laid-open Nos. 11-238680 and 2000-97616 and United States Patent Publication No. 2004/0090606. The present invention is also applicable to a sensor for measuring the wavefront aberration as disclosed in U.S. Pat. No. 6,650,399. The disclosures of the patent documents are incorporated herein by reference within a range of permission of the domestic laws and ordinances of the state designated or selected in this international application.

In each of the eleventh to sixteenth embodiments described above, the shape of the nozzle is not specifically limited. For example, two pairs of nozzles may be used to supply or recover the liquid LQ for the long side of the projection area AR1. In this arrangement, the supply nozzles and the recovery nozzles may be arranged and aligned vertically in order to successfully supply and recover the liquid LQ in any one of the directions of the +X direction and the −X direction. That is, it is possible to adopt various forms which make it possible to continuously fill the space between the substrate P and the optical element 260 of the projection optical system PL with a sufficient amount of the liquid LQ. It is not necessarily indispensable that the supply position and/or the recovery position of the liquid LQ is changed depending on the direction of movement of the substrate P. The supply and the recovery of the liquid LQ may be continued from any predetermined position.

In each of the embodiments of the present invention, pure water is used as the liquid LQ, because the ArF excimer laser light source is used as the light source 1. Pure water is advantageous in that pure water is available in a large amount with ease, for example, in the semiconductor production factory, and pure water exerts no harmful influence, for example, on the optical element (lens) and the photoresist on the wafer W (substrate P). Further, pure water exerts no harmful influence on the environment, and the content of impurity is extremely low. Therefore, it is also expected to obtain the function to wash the surface of the wafer W (substrate P) and the surface of the optical element provided at the end surface of the projection optical system PL. It is also considered that pure water of the factory may have a low level (purity or degree of pure water). Therefore, in such a situation, the exposure apparatus itself may posses an ultrapure water-producing mechanism.

It is approved that the refractive index n of pure water (water) with respect to the exposure beam having a wavelength of about 193 nm is approximately in an extent of 1.44. When the ArF excimer laser beam (wavelength: 193 nm) is used as the light source of the exposure beam, then the wavelength is shortened on the wafer W (substrate P) by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

It is also possible to use the KrF excimer laser light source and the $F_2$ laser light source as the light source 1 to be used for the liquid immersion exposure. When the $F_2$ laser light source is used, it is preferable to use a fluorine-based liquid including, for example, fluorine-based oil and perfluoropolyether (PFPE) through which the $F_2$ laser beam is transmissive, as the liquid for the liquid immersion exposure (including the liquid to be used for the second liquid immersion area). Alternatively, other than the above, it is also possible to use those (for example, cedar oil) which have the transmittance with respect to the exposure beam, which have the refractive index as high as possible, and which are stable against the photoresist subjected to the coating for the surface of the wafer W (substrate P) and the projection optical system PL. As described above, the liquid to be used for the first liquid immersion area and the liquid to be used for the second liquid immersion area may be separately used depending on the purpose.

The exposure apparatus, to which the liquid immersion method is applied as described above, is constructed such that the optical path space, which is disposed on the outgoing side of the terminal end optical member of the projection optical system PL, is filled with the liquid (pure water) to expose the wafer W (substrate P). However, as disclosed in International Publication No. 2004/019128, the optical path space, which is disposed on the incoming side of the terminal end optical member of the projection optical system, may be also filled with the liquid (pure water). In this arrangement, even when the projection optical system PL has a large numerical aperture of not less than 1.0, a parallel flat plate having no refractive force or a lens having an extremely small refractive force can be adopted as the terminal end optical member.

When the liquid immersion method is used, the numerical aperture NA of the projection optical system is 0.9 to 1.7 in some cases. When the numerical aperture NA of the projection optical system is large as described above, it is desirable to use the polarized illumination, because the imaging characteristic is deteriorated due to the polarization effect in some cases with the random polarized light which has been hitherto used as the exposure beam. In this case, it is appropriate that the linear polarized illumination, which is adjusted to the longitudinal direction of the line pattern of the line-and-space pattern of the mask (reticle), is effected so that the diffracted light of the S-polarized light component (component in the polarization direction along with the longitudinal direction of the line pattern) is dominantly allowed to outgo from the pattern of the mask (reticle).

When the space between the projection optical system and the resist coating the substrate surface is filled with the liquid, the diffracted light of the S-polarized light component, which contributes to the improvement in the contrast, has the high transmittance on the resist surface, as compared with the case in which the space between the projection optical system and the resist coating the substrate surface is filled with the air (gas). Therefore, it is possible to obtain the high imaging performance even when the numerical aperture NA of the projection optical system exceeds 1.0. Further, it is more effective to appropriately combine, for example, the phase shift mask and the oblique incidence illumination method (especially the dipole illumination method) adjusted to the longitudinal direction of the line pattern as disclosed in Japanese Patent Application Laid-open No. 6-188169.

It is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner, then it is possible to obtain the high imaging performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well.

In the embodiments described above, the exposure apparatus is adopted, in which the space between the projection optical system PL and the wafer W (substrate P) is locally filled with the liquid. However, the present invention is also applicable to a liquid immersion exposure apparatus in which a stage retaining a substrate as an exposure objective is moved in a liquid tank, and a liquid immersion exposure apparatus in which a liquid tank having a predetermined depth is formed on a stage and a substrate is retained therein. The structure and the exposure operation of the liquid immersion exposure apparatus in which the stage retaining the substrate as the exposure objective is moved in the liquid tank are described in detail, for example, in Japanese Patent Application Laid-open No. 6-124873. The structure and the exposure operation of the liquid immersion exposure apparatus in which the liquid tank having the predetermined depth is formed on the stage and the substrate is retained therein are described in detail, for example, in Japanese Patent Application Laid-open No. 10-303114 and U.S. Pat. No. 5,825,043. The contents of the descriptions in these literatures are incorporated herein by reference respectively within a range of permission of the domestic laws and ordinances of the state designated or selected in this international application.

The present invention is also applicable to a twin-stage type exposure apparatus which is provided with two stages capable of moving independently in the XY direction while separately placing processing objective substrates such as wafers. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Japanese Patent Application Laid-open No. 2000-505958 (PCT) (corresponding to U.S. Pat. No. 5,969,441), and U.S. Pat. No. 6,208,407. The disclosures thereof are incorporated herein by reference within a range of permission of the domestic laws and ordinances of the state designated or selected in this international application.

As disclosed in Japanese Patent Application Laid-open No. 11-135400, the present invention is also applicable to the exposure apparatus which is provided with an exposure stage that is movable while retaining a processing objective substrate such as a wafer, and a measuring stage that is provided with, for example, various measuring members and sensors. In this case, at least a part of the plurality of sensors (measuring units) explained in each of the first to sixteenth embodiments can be provided on the measuring stage.

The embodiments described above have been explained as exemplified by the case in which the ArF excimer laser light source is used as the exposure light source 1. However, other than the above, those usable as the exposure light source 1 include, for example, the ultra-high voltage mercury lamp for irradiating the g-ray (wavelength: 436 nm) or the i-ray (wavelength: 365 nm), the KrF excimer laser (wavelength: 248 nm), the $F_2$ laser (wavelength: 157 nm), the $Kr_2$ laser (wavelength: 146 nm), the high frequency-generating unit for the YAG laser, and the high frequency-generating unit for the semiconductor laser.

Further, it is also allowable to use, as the light source, the high harmonic wave obtained by amplifying the single wavelength laser beam in the infrared region or the visible region emitted from the DFB semiconductor laser or the fiber laser with the fiber amplifier doped, for example, with erbium (or both of erbium and ytterbium) and effecting the wavelength conversion into the ultraviolet light beam by using the nonlinear optical crystal. For example, assuming that the emission wavelength of the single wavelength laser is within a range of 1.51 to 1.59 μm, those outputted include the 8-fold high harmonic wave having the generated wavelength within a range of 189 to 199 nm and the 10-fold high harmonic wave having the generated wavelength within a range of 151 to 159 nm.

Further, assuming that the emission wavelength is within a range of 1.03 to 1.12 μm, the 7-fold high harmonic wave having the generated wavelength within a range of 147 to 160 nm is outputted. In particular, assuming that the emission wavelength is within a range of 1.099 to 1.106 μm, the 7-fold high harmonic wave having the generated wavelength within a range of 157 to 158 nm, i.e., the ultraviolet light beam having approximately the same wavelength as that of the $F_2$ laser beam is obtained. In this case, for example, the ytterbium-doped fiber laser can be used as the single wavelength emission laser.

The embodiments described above have been explained as exemplified by the case in which fluorite (calcium fluoride: $CaF_2$) is used, for example, as the material for the optical element provided in the illumination optical system IS, the material for the refractive member for constructing the projection optical system PL, and the material for the plano-convex lens 41, 45, 52, 57, 62, 71. However, these materials are selected from fluoride crystals such as magnesium fluoride ($MgF_2$) or mixed crystals thereof, and optical materials such as quartz glass doped with a substance such as fluorine or hydrogen through which the vacuum ultraviolet light is transmissive, depending on the wavelength of the exposure beam. As for the quartz glass doped with the predetermined substance, the transmittance is lowered when the wavelength of the exposure beam is shorter than about 150 nm. Therefore, when the vacuum ultraviolet light beam having the wavelength of not more than about 150 nm is used as the exposure beam, the fluoride crystal such as fluorite (calcium fluoride) or magnesium fluoride or the mixed crystal thereof is used as the optical material for the optical element.

The first to tenth embodiments have been explained as exemplified by the exposure apparatus based on the step-and-repeat system. Further, the eleventh to sixteenth embodiments have been explained as exemplified by the exposure apparatus based on the step-and-scan system. However, the present invention is also applicable to the exposure apparatus based on any one of the systems. Further, the present invention is also applicable to the exposure apparatus based on the step-and-stitch system in which at least two patterns are partially overlaid and transferred on the substrate (wafer). Further, the present invention is not limited to the exposure apparatus to be used for producing the semiconductor element. The present invention is also applicable, for example, to the exposure apparatus which is used for producing the display including, for example, the liquid crystal display device (LCD) and which transfers the device pattern onto the glass plate, the exposure apparatus which is used for producing the thin film magnetic head and which transfers the device pattern onto the ceramic wafer, and the exposure apparatus which is used for producing the image pickup device such as CCD. Further, the present invention is also applicable to the exposure apparatus which transfers the circuit pattern, for example, to the glass substrate or the silicon wafer in order to produce the reticle or the mask to be used, for example, for the optical exposure apparatus, the EUV exposure apparatus, the X-ray exposure apparatus, and the electron beam exposure apparatus. In general, the transmissive type reticle is used for the exposure apparatus which employs, for example, the DUV (far ultraviolet) light beam or the VUV (vacuum ultraviolet) light beam. For example, quartz glass, quartz glass doped with fluorine, fluorite, magnesium fluoride, or quartz crystal is used as the reticle substrate. The transmissive type mask (stencil mask, membrane mask) is used, for example, for the electron beam exposure apparatus or the X-ray exposure apparatus based on the proximity system. For example, the silicon wafer is used as the mask substrate. The exposure apparatuses as described above are disclosed, for example, in WO 99/34255, WO 99/50712, WO 99/66370, and Japanese Patent Application Laid-open Nos. 11-194479, 2000-12453, and 2000-29202.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

When the linear motor is used for the substrate stage PST (wafer stage 15) and/or the mask stage MST (reticle stage 13), it is allowable to use any one of those of the air floating type based on the use of the air bearing and those of the magnetic floating type based on the use of the Lorentz's force or the reactance force. Each of the stages PST (15), MST (13) may be either of the type in which the movement is effected along the guide or of the guideless type in which no guide is provided. An example of the use of the linear motor for the stage is disclosed in U.S. Pat. Nos. 5,623,853 and 5,528,118. The contents of the descriptions in the literatures are incorporated herein by reference respectively within a range of permission of the domestic laws and ordinances of the state designated or selected in this international application.

As for the driving mechanism for each of the stages PST (15), MST (13), it is also allowable to use a plane motor in which a magnet unit provided with two-dimensionally arranged magnets and an armature unit provided with two-dimensionally arranged coils are opposed to one another, and each of the stages PST (15), MST (13) is driven by the electromagnetic force. In this arrangement, any one of the magnet unit and the armature unit is connected to the stage PST (15), MST (13), and the other of the magnet unit and the armature unit is provided on the side of the movable surface of the stage PST (15), MST (13).

The reaction force, which is generated in accordance with the movement of the substrate stage PST (wafer stage 15), may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475). The contents of the descriptions in the literatures are incorporated herein by reference within a range of permission of the domestic laws and ordinances of the state designated or selected in this international application.

The reaction force, which is generated in accordance with the movement of the mask stage MST (reticle stage 13), may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224). The disclosures in the literatures are incorporated herein by reference within a range of permission of the domestic laws and ordinances of the state designated or selected in this international application.

The exposure apparatus EX according to each of the embodiments described above is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 18:
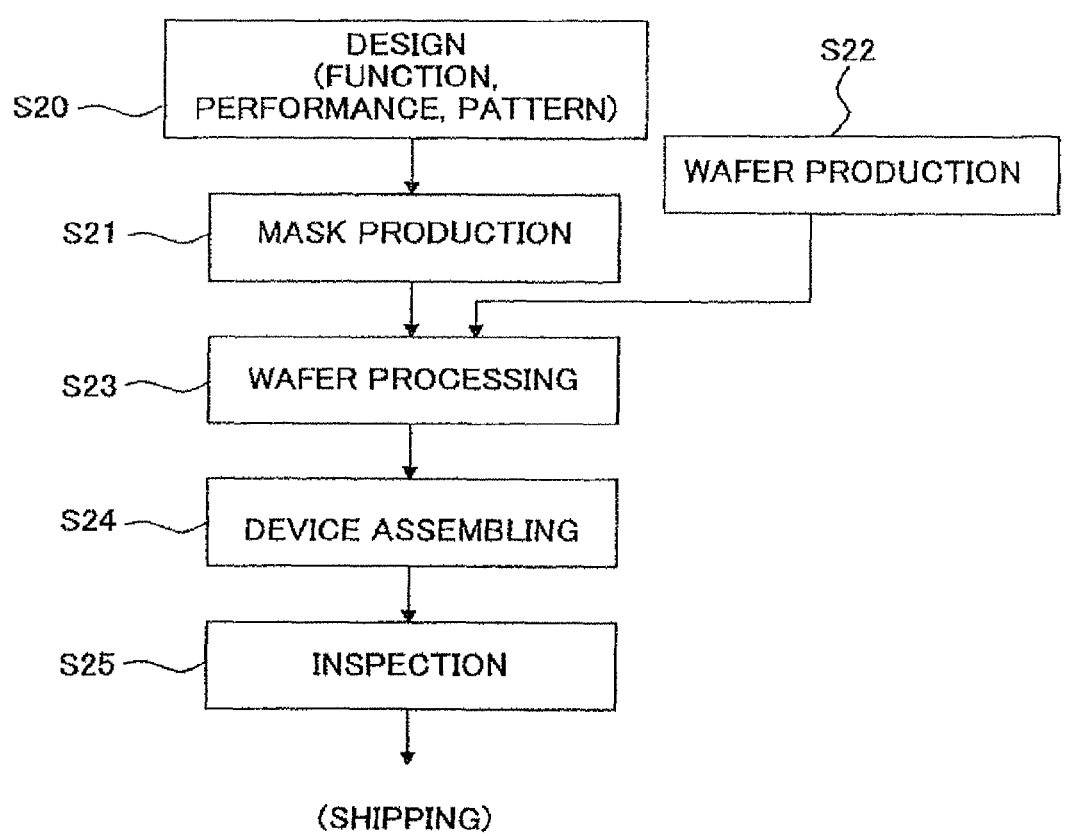
FIG. 18 shows a flow chart illustrating exemplary steps of producing a microdevice.

Next, an explanation will be made about an embodiment of the method for producing the microdevice in which the exposure apparatus and the exposure method according to the embodiment of the present invention are used in the lithography step. FIG. 18 shows a flow chart illustrating exemplary steps of producing the microdevice (for example, semiconductor chip such as IC and LSI, liquid crystal panel, CCD, thin film magnetic head, and micromachine). At first, as shown in FIG. 18, the function and the performance of the microdevice are designed (for example, the circuit of the semiconductor device is designed) to perform the pattern design in order to realize the function in the step S20 (designing step). Subsequently, the mask (reticle), on which the designed circuit pattern is formed, is manufactured in the step S21 (mask production step). On the other hand, the wafer is produced by using a material such as silicon in the step S22 (wafer production step).

Subsequently, the mask and the wafer, which are prepared in the steps S20 to S22, are used in the step S23 (wafer processing step) to form, for example, the actual circuit on the wafer, for example, by the lithography technique as described later on. Subsequently, the wafer, which is processed in the step S23, is used to assemble the device in the step S24 (device assembling step). The step S24 includes, for example, the dicing step, the bonding step, and the packaging step (chip sealing), if necessary. Finally, the inspection, which includes, for example, the test for confirming the operation and the durability test for the microdevice manufactured in the step S24, is performed in the step S25 (inspection step). After performing the steps as described above, the microdevice is completed, which is shipped.

Figure 19:
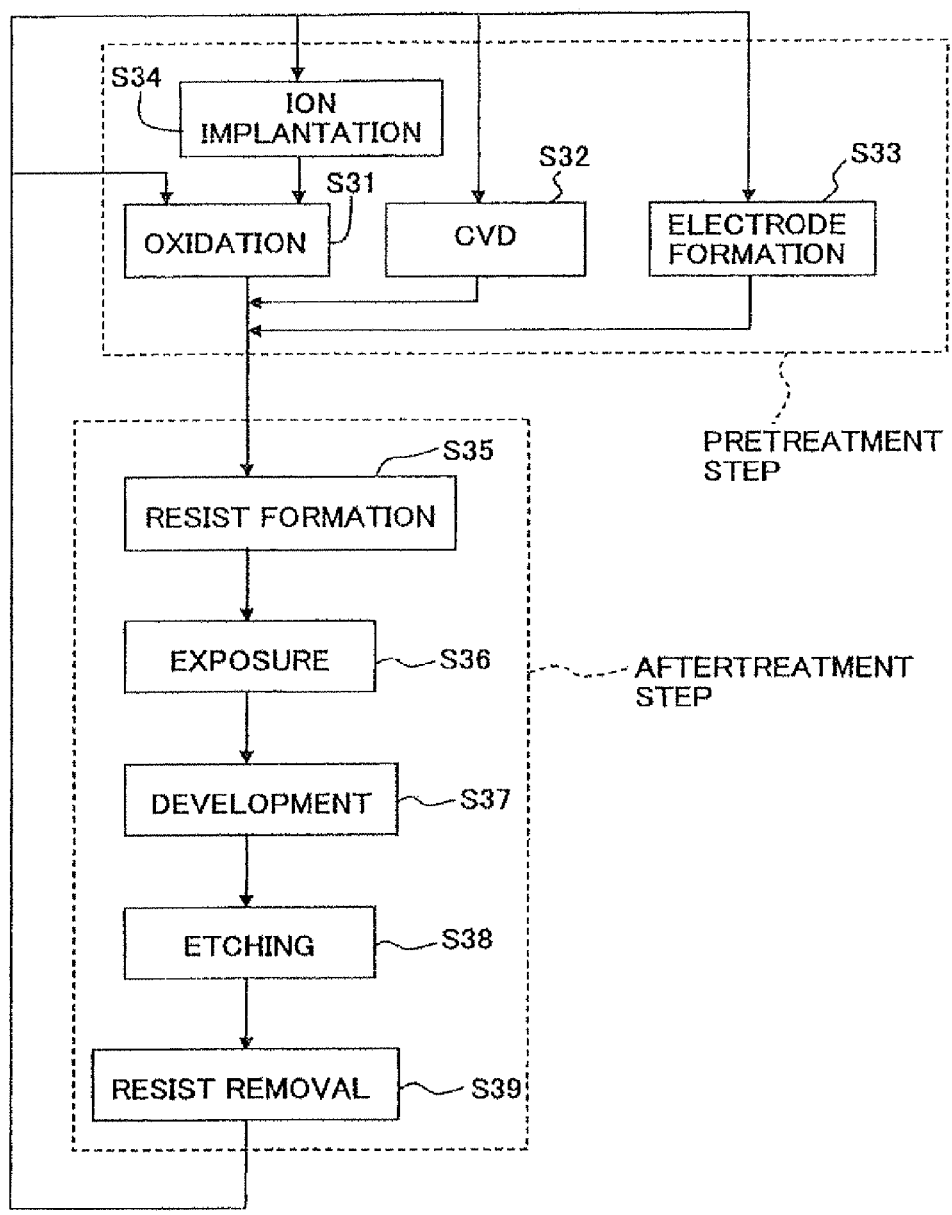
FIG. 19 shows a detailed exemplary flow of Step S23 shown in FIG. 11 adopted in the case of a semiconductor device.

FIG. 19 shows an example of the detailed flow of the step S23 shown in FIG. 18 in the case of the semiconductor device. With reference to FIG. 19, the surface of the wafer is oxidized in the step S31 (oxidation step). In the step S32 (CVD step), an insulating film is formed on the wafer surface. In the step S33 (electrode formation step), an electrode is formed on the wafer by the vapor deposition. In the step S34 (ion implantation step), an ion is implanted into the wafer. Each of the steps S31 to S34 described above constitutes the pretreatment step at each stage of the wafer processing, which is selected and executed depending on the process required for each stage.

When the pretreatment step is completed at each stage of the wafer process, the aftertreatment step is executed as follows. At first, in the aftertreatment step, the wafer is coated with a photosensitive agent in the step S35 (resist formation step). Subsequently, the circuit pattern of the mask is transferred to the wafer in accordance with the lithography system (exposure apparatus) and the exposure method explained above in the step S36 (exposure step). Subsequently, the exposed wafer is developed in the step S37 (development step). The exposed member of the portion other than the portion at which the resist remains is removed by the etching in the step S38 (etching step). The resist, which is unnecessary after the completion of the etching, is removed in the step S39 (resist removal step). The circuit patterns are formed in a multiple form on the wafer by repeatedly performing the pretreatment step and the aftertreatment step as described above.

According to the present invention, the exposure beam, which has passed through the projection optical system for the liquid immersion having the expected performance owing to the supply of the liquid to the image plane side, is received in the state in which the liquid is not supplied to the image plane side of the projection optical system. Therefore, the measurement can be performed accurately without being affected by the state of water.

The exposure beam, which has passed through the projection optical system, can be received even in the state in which the liquid is absent, for example, by adjusting (decreasing) the angle of the exposure light flux come into the end surface of the projection optical system (angle formed by the outermost ray and the optical axis).

According to the present invention, the light beam, which is included in the exposure beam come from the projection optical system and which is transmitted through the light-transmitting section, is allowed to come into the light-collecting member and collected without passing through the gas. Therefore, even when the exposure beam, which has the large incident angle due to the increase in the numerical aperture of the projection optical system, comes into the light-transmitting section, it is possible to reliably receive the exposure beam which has passed through the light-transmitting section.

According to the present invention, the exposure beam from the projection optical system has come into the plate-shaped member through the liquid, and the light beam, which is included in the light beam come into the plate-shaped member and which is transmitted through the light-transmitting section, is received. The light-transmitting section is formed on the other surface which is not opposed to the projection optical system. Therefore, one surface, which is opposed to the projection optical system, can be made flat. It is possible to avoid, for example, the adhesion of the bubble to one surface of the plate-shaped member and the disturbance of the liquid between the projection optical system and the plate-shaped member. Further, no aperture (hole) is provided as the light-transmitting section for the plate-shaped member. Therefore, it is possible to avoid the invasion of the liquid as well.

According to the present invention, the pattern of the mask is transferred onto the substrate by the exposure under the condition optimized depending on the measurement result. Thus, it is possible to accurately transfer, onto the substrate, the minute pattern formed on the mask. As a result, it is possible to produce the highly integrated device at a high yield.

According to the present invention, the light beam, which is included in the exposure beam which has passed through the projection optical system and the liquid and which is transmitted through the light-transmitting section, comes into the light receiver while being guided by the optical system provided for the measuring means so that the light beam does not pass through the gas. Therefore, even when the exposure beam, which has the large incident angle due to the increase in the numerical aperture of the projection optical system, comes into the light-transmitting section, it is possible to reliably receive the exposure beam transmitted through the light-transmitting section.

According to the present invention, the light beam, which has passed through the projection optical system, can be satisfactorily received by the light receiver. Therefore, the exposure process can be performed accurately in the state in which the optimum exposure condition is established on the basis of the light-receiving result.

What is claimed is:

1. An exposure apparatus that exposes a substrate with exposure light from a projection optical system via an immersion region formed with liquid below the projection optical system, the exposure apparatus comprising:

a stage on which a substrate holder to hold the substrate is provided, and which is capable of moving relative to the projection optical system;

a sensor that includes a light transmissive member provided on the stage and that detects the exposure light via the light transmissive member comprising a first surface and a second surface, the light transmissive member being arranged to allow the exposure light from the projection optical system to enter into the first surface via the immersion region and to exit from the second surface;

a liquid-proof member that is provided on the stage, wherein the first surface is substantially flush with an upper surface of the stage and is arranged to come into contact with the immersion region in a state of being disposed under the projection optical system by the stage, and the liquid-proof member is arranged in a space between the light transmissive member and the stage to prevent the liquid from inflowing into the space.

2. The exposure apparatus according to claim 1, further comprising:

a holding member arranged to hold the light transmissive member and that is attached to the stage.

3. The exposure apparatus according to claim 2, wherein the holding member is arranged to hold the light transmissive member so that the first surface is substantially flush with an upper surface of the holding member.

4. The exposure apparatus according to claim 3, wherein the holding member is attached to the stage so that an upper surface of the holding member is substantially flush with an upper surface of the stage.

5. The exposure apparatus according to claim 3, wherein at least part of the light transmissive member is provided inside an opening that is formed on an upper surface of the holding member.

6. The exposure apparatus according to claim 2, wherein the sensor comprises a light-receiving element provided inside the holding member.

7. The exposure apparatus according to claim 2, wherein the liquid-proof member is arranged between the light transmissive member and the holding member.

8. The exposure apparatus according to claim 1, wherein at least part of the light transmissive member is provided inside an opening that is formed on an upper surface of the stage.

9. The exposure apparatus according to claim 1, wherein the stage is arranged to move in a state of holding the substrate.

10. The exposure apparatus according to claim 1, wherein the substrate holder is arranged to hold the substrate so that an upper surface of the stage is substantially flush with an upper surface of the substrate.

11. The exposure apparatus according to claim 1, wherein an upper surface of the light transmissive member including the first surface is a substantially flat surface.

12. The exposure apparatus according to claim 1, wherein the light transmissive member comprises a first transmissive member having the first surface and a second transmissive member having the second surface.

13. The exposure apparatus according to claim 12, wherein the first transmissive member and the second transmissive member are provided so that no gas is disposed in an optical path of the exposure light between the first surface and the second surface.

14. The exposure apparatus according to claim 12, wherein the first transmissive member and the second transmissive member are joined with no gas therebetween.

15. The exposure apparatus according to claim 1, wherein the light transmissive member comprises a reflective surface arranged to reflect the exposure light, which has entered from the first surface, toward the second surface.

16. The exposure apparatus according to claim 1, wherein the light transmissive member comprises a columnar member having a circumferential surface arranged to reflect the exposure light, which has entered from the first surface, toward the second surface.

17. The exposure apparatus according to claim 16, wherein a metal film is provided on the circumferential surface of the columnar member.

18. The exposure apparatus according to claim 1, wherein the light transmissive member comprises a condensing member that comprises the second surface and arranged to condense the exposure light, which has entered from the first surface.

19. The exposure apparatus according to claim 18, wherein the condensing member comprises at least one of a plano-convex lens, a diffraction optical element, a lens array, a Fresnel lens, and a reflecting mirror.

20. The exposure apparatus according to claim 1, wherein the light transmissive member comprises a diffraction optical element that comprises the second surface and that is arranged to diffract the exposure light, which has entered from the first surface.

21. The exposure apparatus according to claim 20, wherein, in the diffraction optical element, a diffraction angle with respect to a light beam, which enters onto the first surface with a first incident angle, of the exposure light is smaller than a diffraction angle with respect to a light beam, which enters onto the first surface with a second incident angle greater than the first incident angle, of the exposure light.

22. The exposure apparatus according to claim 1, wherein the light transmissive member comprises a diffusing element that comprises the second surface and that is arranged to diffuse the exposure light, which has entered from the first surface.

23. The exposure apparatus according to claim 1, further comprising:

at least one optical element that is arranged to guide the exposure light, which has exited from the second surface.

24. The exposure apparatus according to claim 1, wherein a light shielding part to shield the exposure light is provided around the first surface of the light transmissive member.

25. The exposure apparatus according to claim 24, wherein the light shielding member provides a pinhole in which the first surface is disposed.

26. The exposure apparatus according to claim 24, wherein the light shielding part comprises a metal film.

27. The exposure apparatus according to claim 1, further comprising:

a light shielding part to shield part of the exposure light, which has entered from the first surface.

28. The exposure apparatus according to claim 1, further comprising:

a light-receiving surface to receive the exposure light from the second surface of the light transmissive member, wherein the second surface and the light-receiving surface are arranged apart from each other.

29. The exposure apparatus according to claim 1, further comprising:
a light-receiving surface to receive the exposure light from the second surface of the light transmissive member,
wherein the second surface and the light-receiving surface are arranged in contact with each other so that the light-receiving surface receives the exposure light from the second surface via no gas between the second surface and the light-receiving surface.

30. A device fabricating method of fabricating a microdevice, comprising:
transferring a pattern onto a substrate using the exposure apparatus according to claim 1; and
processing, based on the pattern, the substrate onto which the pattern is transferred.

* * * * *